US012717690B2

(12) United States Patent
Roh et al.

(10) Patent No.: US 12,717,690 B2
(45) Date of Patent: Aug. 25, 2026

(54) MEMORY SYSTEM

(71) Applicant: SK hynix Inc., Icheon (KR)

(72) Inventors: Wan-Jun Roh, Goyang (KR); Hyung-Sup Kim, Yongin (KR); Hyung-Sik Won, Cheongju (KR)

(73) Assignee: SK hynix Inc., Icheon (KR)

( * ) Notice: Subject to any disclaimer, the term of this patent is extended or adjusted under 35 U.S.C. 154(b) by 21 days.

(21) Appl. No.: 18/060,524

(22) Filed: Nov. 30, 2022

(65) Prior Publication Data

US 2023/0094144 A1 Mar. 30, 2023

Related U.S. Application Data

(60) Division of application No. 16/858,455, filed on Apr. 24, 2020, now Pat. No. 11,544,168, which is a (Continued)

(30) Foreign Application Priority Data

Oct. 30, 2017 (KR) ........................ 10-2017-0142584
Nov. 17, 2017 (KR) ........................ 10-2017-0153774
Feb. 19, 2018 (KR) ........................ 10-2018-0019212

(51) Int. Cl.
*G06F 12/0877* (2016.01)
*G06F 11/30* (2006.01)
(Continued)

(52) U.S. Cl.
CPC ...... *G06F 11/3037* (2013.01); *G06F 11/3058* (2013.01); *G06F 12/0877* (2013.01); *G11C 5/141* (2013.01); *G11C 11/40607* (2013.01); *G11C 11/40626* (2013.01); *G11C 11/4074* (2013.01)

(58) Field of Classification Search
CPC ............. G06F 11/3058; G06F 11/1441; G06F 11/2015; G06F 11/3037; G06F 11/3062; G06F 12/0877; G06F 2201/81; G11C 11/40626; G11C 11/40607; G11C 5/141; G11C 11/4074; G11C 7/1093;
(Continued)

(56) References Cited

U.S. PATENT DOCUMENTS 5,323,293 A * 6/1994 Angiuli .............. H05K 7/20372 361/699
8,918,576 B2 12/2014 Bert et al.
(Continued)

FOREIGN PATENT DOCUMENTS

CN 101089820 A 12/2007
CN 101206618 A 6/2008
(Continued)

*Primary Examiner* — Hashem Farrokh

(57) ABSTRACT

A memory system may improve the endurance and performance of a plurality of memories included in the memory system mounted on a server system or a data processing system. For example, the memory system may throttle energy of a first memory using a second memory having a different characteristic from the first memory, control accesses to a memory region according to a refresh cycle, and control accesses to memories having different temperatures according to a priority of a request for each of the memories.

7 Claims, 34 Drawing Sheets

Related U.S. Application Data continuation-in-part of application No. 16/159,479, filed on Oct. 12, 2018, now Pat. No. 10,795,613, and a continuation-in-part of application No. 16/136,069, filed on Sep. 19, 2018, now Pat. No. 10,691,625, and a continuation-in-part of application No. 16/164,411, filed on Oct. 18, 2018, now Pat. No. 11,016,887.

(51) Int. Cl.

| | |
|---|---|
| ***G11C 5/14*** | (2006.01) |
| ***G11C 11/406*** | (2006.01) |
| ***G11C 11/4074*** | (2006.01) |

(58) Field of Classification Search

CPC ..... G11C 7/1066; G11C 5/14; G11C 11/4076; G11C 7/04

USPC .......................................................... 711/154

See application file for complete search history.

(56) References Cited

U.S. PATENT DOCUMENTS

| | | | | |
|---|---|---|---|---|
| 8,918,618 | B2 | 12/2014 | Fisher et al. | |
| 9,183,917 | B1 | 11/2015 | Cho | |
| 9,460,021 | B2 | 10/2016 | Hampel et al. | |
| 9,524,771 | B2 | 12/2016 | Sriramagiri et al. | |
| 9,703,505 | B2 | 7/2017 | Boyle et al. | |
| 9,760,136 | B2 * | 9/2017 | Rangarajan | G06F 11/3037 |
| 10,175,887 | B2 * | 1/2019 | Kanno | G06F 12/0246 |
| 10,191,667 | B2 * | 1/2019 | Breakstone | G06F 13/4022 |
| 2008/0052424 | A1 | 2/2008 | Sameshima et al. | |
| 2009/0138220 | A1 * | 5/2009 | Bell, Jr. | G06F 12/0817 702/60 |
| 2010/0106901 | A1 | 4/2010 | Higeta et al. | |
| 2013/0227268 | A1 | 8/2013 | Ichida et al. | |
| 2014/0022002 | A1 | 1/2014 | Chua-Eoan et al. | |
| 2014/0156923 | A1 | 6/2014 | Bains et al. | |
| 2014/0281311 | A1 | 9/2014 | Walker et al. | |
| 2014/0369110 | A1 * | 12/2014 | Cho | G11C 7/04 365/222 |
| 2015/0074489 | A1 * | 3/2015 | Kashiwagi | G11C 7/10 714/763 |
| 2015/0109871 | A1 | 4/2015 | Bains et al. | |
| 2015/0134897 | A1 * | 5/2015 | Sriramagiri | G11C 11/40626 711/106 |
| 2016/0048347 | A1 * | 2/2016 | Rangarajan | G06F 11/2092 711/156 |
| 2016/0162219 | A1 | 6/2016 | Erez | |
| 2017/0140810 | A1 | 5/2017 | Choi et al. | |
| 2017/0147489 | A1 | 5/2017 | Jang | |
| 2018/0182445 | A1 | 6/2018 | Lee et al. | |

FOREIGN PATENT DOCUMENTS

| | | | |
|---|---|---|---|
| CN | 101689145 | A | 3/2010 |
| CN | 103201725 | A | 7/2013 |
| CN | 103456352 | A | 12/2013 |
| CN | 105122226 | A | 12/2015 |
| CN | 105320608 | A | 2/2016 |
| JP | 2008192266 | A | 8/2008 |
| JP | 2013050818 | A | 3/2013 |
| KR | 1020160144516 | A | 12/2016 |
| KR | 10-1731508 | B1 | 5/2017 |
| KR | 10-2017-0127046 | A | 11/2017 |

* cited by examiner

FIG. 2

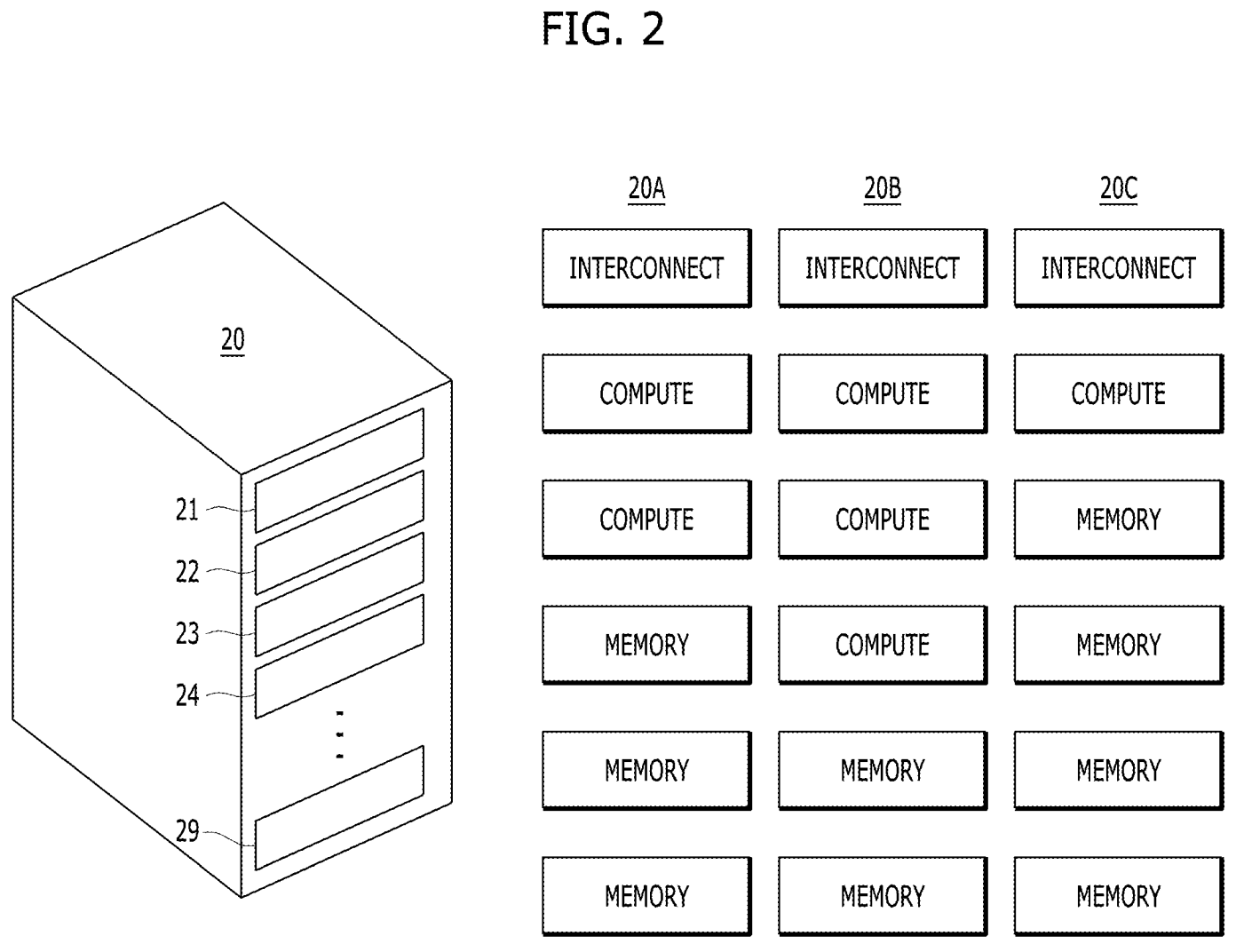

20A
INTERCONNECT
COMPUTE
COMPUTE
MEMORY
MEMORY
MEMORY

20B
INTERCONNECT
COMPUTE
COMPUTE
COMPUTE
MEMORY
MEMORY

20C
INTERCONNECT
COMPUTE
MEMORY
MEMORY
MEMORY
MEMORY 20
21
22
23
24
...
29

FIG. 7B
Main Memory (2910)
DRAM 1 | DRAM 2 | DRAM 3 | DRAM 4 | | DRAM k: PCRAM Cache — 2940
Persistent Memory (2920)
PCRAM 1 | PCRAM 2 | PCRAM 3 | PCRAM 4 | | PCRAM m: PCRAM Cache — 2950
Storage (2930)
FLASH 1 | FLASH 2 | FLASH 3 | FLASH 4 | | FLASH n
FIG. 7C
Main Memory (2910)
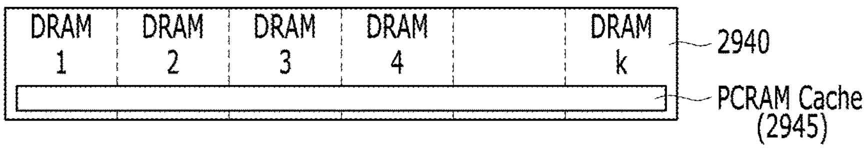
Persistent Memory (2920)
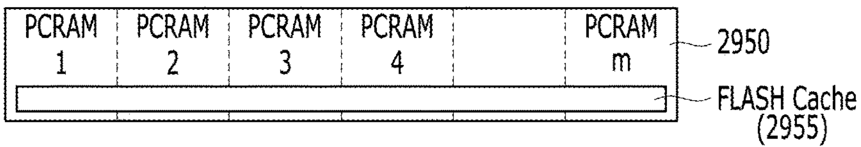
Storage (2930)
FLASH 1 | FLASH 2 | FLASH 3 | FLASH 4 | | FLASH n

| HA | PA | FREQ | VALID |
|---|---|---|---|
| 3 | 0 | 100 | 1 |
| 5 | 1 | 50 | 0 |
| 7 | 2 | 200 | 1 |

| PA[0] | PA[1] | PA[2] | PA[3] |
|---|---|---|---|
| PA[4] | PA[5] | PA[6] | PA[7] |
| PA[8] | PA[9] | PA[10] | PA[11] |

| HA | PA | FREQ | VALID |
|---|---|---|---|
| 6 | 10 | 0 | 1 |
| 7 | 11 | 0 | 1 |
| 8 | 12 | 0 | 1 |

Table for Cache
→ Table for Write Buffer

4500

| CMD | ADDR | VALID | DELAYED | Time |
|---|---|---|---|---|
| R | 111 | 1 | | |
| W | 222 | 1 | | |
| W | 333 | 1 | 1 | 5 |
| W | 444 | 0 | | |
| ... | ... | ... | ... | ... |
| ... | ... | ... | ... | ... |

MEMORY SYSTEM

CROSS-REFERENCES TO RELATED APPLICATIONS

The present application is a division of U.S. patent application Ser. No. 16/858,455 filed on Apr. 24, 2020, which is a continuation-in-part application of U.S. patent application Ser. No. 16/164,411 filed on Oct. 18, 2018, which claims priority to Korean patent application No. 10-2017-0142584 filed on Oct. 30, 2017; U.S. patent application Ser. No. 16/159,479 filed on Oct. 12, 2018, which claims priority to Korean patent application No. 10-2018-0019212 filed on Feb. 19, 2018; and U.S. patent application Ser. No. 16/136,069 filed on Sep. 19, 2018, which claims priority to Korean patent application No. 10-2017-0153774 filed on Nov. 17, 2017. The disclosure of each of the foregoing applications is herein incorporated herein by reference in its entirety.

BACKGROUND

1. Field

Exemplary embodiments of the present disclosure relate to a converged memory device and a method of operating the converged memory device.

2. Description of the Related Art

Data are becoming most important assets in the fourth industrial revolution, and the demands for new technology in support of transferring and analyzing large-scale data at a high data rate are increasing. For example, as artificial intelligence, autonomous driving, robotic, health care, virtual reality (VR), augmented reality (AR), and smart home technologies are spreading, demands for servers or data centers are increasing.

A legacy data center includes resources for computing, networking, and storing data, in the same equipment. However, a future large-scale data center may construct resources individually and then logically restructure the resources. For example, in the large-scale data center, the resources may be modularized at the level of racks, and the modularized resources may be restructured and supplied according to their usage. Therefore, a converged storage or memory device, which can be used for the future large-scale data center, is demanded.

SUMMARY

A memory system may improve the endurance and performance of a plurality of memories included in the memory system mounted on a server system or a data processing system. More specifically, the memory system may throttle energy of a memory using another memory having different characteristic, control accesses to a memory region according to a refresh cycle, and control accesses to memories having different temperatures according to a priority of request.

In an embodiment, a memory system may include: a first memory group including cache region; a second memory group having different characteristic from the first memory group; and a controller configured to store hot data of the second memory group into the cache region, and when a temperature or an energy consumption of a memory included in the second memory group is equal to or higher than a threshold, throttle the memory by buffering data in the cache region in response to a write request for the memory.

In an embodiment, a memory system may include: a first memory group including cache region; a second memory group having different characteristic from the first memory group; and a controller configured to store hot data of the second memory group into the cache region, and when a temperature or an energy consumption of a memory included in the second memory group is equal to or higher than a threshold, throttle the memory by migrating data of the memory into the cache region.

In an embodiment, a memory system may include: a memory performing a refresh operation at the end of each refresh cycle; and a controller configured to control the memory, wherein the controller receives an access request for a target memory region of the memory and performs the request after a next refresh operation is performed depending on a number of access requests for the target memory region during the current refresh cycle.

In an embodiment, a memory system may include: a first memory having a first temperature; a second memory having a second temperature that is lower than the first temperature; and a controller configured to cache at least part of data for the first memory into the second memory.

In an embodiment, a memory system may include: a first memory having a first temperature; a second memory having a second temperature that is lower than the first temperature; and a controller configured to access, in response to a request, the second memory when the request has first priority and access the first memory when the request has a second priority that is lower than the first priority.

In an embodiment, a memory system may include: a first memory having a first temperature; a second memory having a second temperature that is lower than the first temperature; and a controller configured to access the second memory in response to a request to be processed within a first latency.

BRIEF DESCRIPTION OF THE DRAWINGS

FIGS. 2 and 3 illustrate a computing device in accordance with an embodiment of the present disclosure.

FIGS. 7A to 7C illustrate examples of memories of a memory blade in accordance with embodiments of the present disclosure.

FIG. 10A illustrates an example of a hot page table in accordance with an embodiment of the present disclosure.

FIG. 10B illustrates an example of storing cache data in accordance with an embodiment of the present disclosure.

FIGS. 14A to 14E illustrate an example of a throttling operation of a memory blade for throttling a temperature in accordance with an embodiment of the present disclosure.

DETAILED DESCRIPTION

Figure 1:
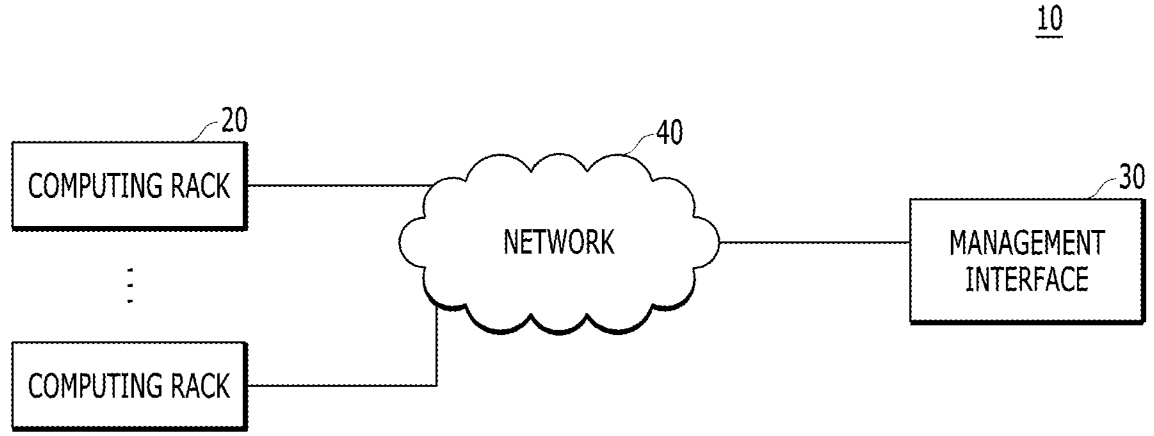
FIG. 1 is a block diagram illustrating a data processing system.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments.

FIG. 1 is a block diagram illustrating a data processing system 10. Referring to FIG. 1, the data processing system 10 may include a plurality of computing racks 20, a management interface 30, and a network 40 for communication between the computing racks 20 and the management interface 30. The data processing system 10 having this rack-scale architecture may be used by a data center for processing large-scale data.

Each of the computing racks 20 may individually implement one computing device. Alternatively, each of the computing racks 20 may be combined with other computing racks to implement one computing device. The specific structures and operations of the computing racks 20 will be described later on.

The management interface 30 may provide an interactive interface for a user to control, administrate, or manage the data processing system 10. The management interface 30 may be realized using an arbitrary type of a computing device that includes any of a computer, a multi-processor system, a server, a rack-mount server, a blade server, a lap-top computer, a notebook computer, a tablet computer, a wearable computing device, a network device, a web device, a distributed computing system, a processor-based system, a consumer electronic device, and so on.

According to some embodiments of the present disclosure, the management interface 30 may be realized by a distributed system having operation functions which may be performed by the computing racks 20 or having user interface functions which may be performed by the management interface 30. According to other embodiments of the present disclosure, the management interface 30 may be realized by a virtual cloud server that includes multi-computing devices distributed through the network 40. The management interface 30 may include a processor, an input/output subsystem, a memory, a data storage device, and a communication circuit.

The network 40 may transfer/receive data between the computing racks 20 and the management interface 30 and/or between the computing racks 20. The network 40 may be realized by an appropriate number of various wired and/or wireless networks. For example, the network 40 may include a publicly accessible global network, such as a wired or wireless Local Area Network (LAN), a Wide Area Network (WAN), a cellular network, and/or the Internet. In addition, the network 40 may include an appropriate number of auxiliary network devices, such as auxiliary computers, routers, and switches.

FIG. 2 illustrates a computing device having a rack structure in accordance with an embodiment of the present disclosure.

Referring to FIG. 2, a computing rack 20 may include constituent elements in various forms, and structures, shapes, and names of the constituent elements are not limited. For example, the computing rack 20 may include a plurality of drawers 21 to 29. Each of the drawers 21 to 29 may include a plurality of modules, each of which may include a plurality of blades.

In various embodiments of the present disclosure, the computing rack 20 may be realized by a combination of appropriate numbers of compute blades, memory blades, and/or interconnect blades. Herein, it is defined that the computing rack 20 is realized by a combination of a plurality of blades, but the computing rack 20 may also be realized by diversely named elements such as drawers, modules, trays, boards, sashes, or units. The computing rack 20 may have a structure where the constituent elements of the computing rack 20 are disaggregated and classified according to their functions for the sake of convenience in realization. Although not limited, the computing rack 20 may have a structure of an interconnect blade, a compute blade, and a memory blade in a classification order from the top. The computing rack 20 and a computing device including the computing rack 20 may be referred to as 'a rack-scale system' or 'a disaggregated system.'

In an embodiment of the present disclosure, a computing device may be realized by one computing rack 20. In other embodiments, the computing device may be realized by all constituent elements of two or more computing racks 20, realized by some of constituent elements of two or more computing racks 20, or some of constituent elements of one computing rack 20.

In various embodiments of the present disclosure, a computing device may be realized by a combination of appropriate numbers of compute blades, memory blades, and interconnect blades that are included in the computing rack 20. As illustrated in FIG. 2, a computing rack 20A may include two compute blades, three memory blades, and one interconnect blade. A computing rack 20B may include three compute blades, two memory blades, and one interconnect blade. A computing rack 20C may include one compute blade, four memory blades, and one interconnect blade.

Although FIG. 2 illustrates a case where the computing rack 20 is realized by appropriate numbers of compute blades, memory blades, and interconnect blades, the computing rack 20 may include additional constituent elements that may be included in typical servers, such as a power system, a cooling system, an input/output device, and so on.

Figure 3:
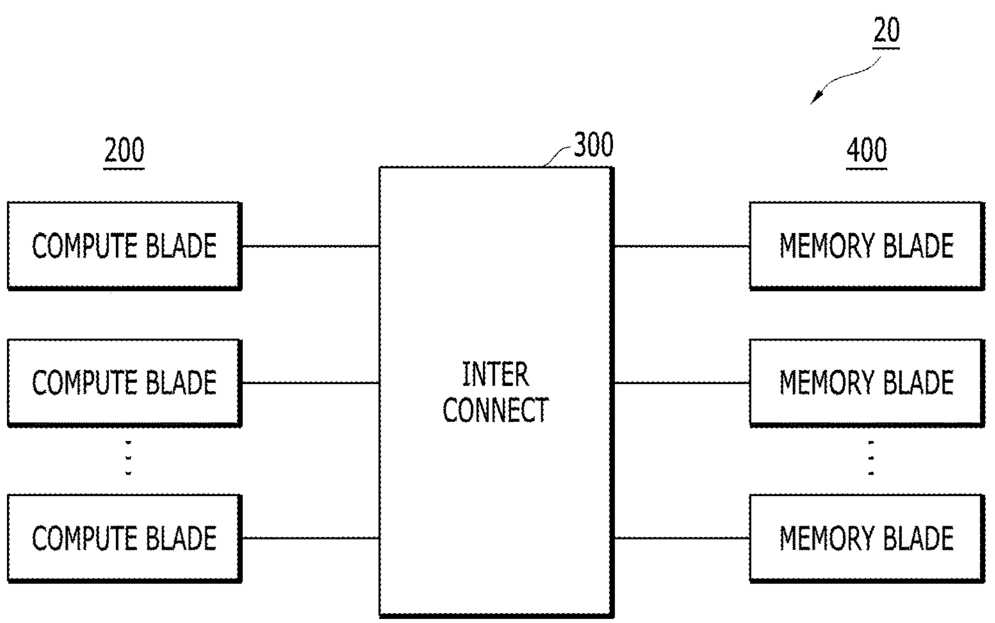

FIG. 3 illustrates a computing device 100 in accordance with an embodiment of the present disclosure.

Referring to FIG. 3, the computing device 100 may include a plurality of compute blades 200, a plurality of memory blades 400, and an interconnect blade 300. The compute blades 200 may be called pooled compute blades or pooled compute systems. Similarly, the memory blades may be called pooled memory blades or pooled memory systems. Herein, it is defined that the computing device 100 is realized by a combination of a plurality of blades, but the computing device 100 may also be realized by diversely named elements such as drawers, modules, trays, boards, sashes, or units.

Each of the compute blades 200 may include one or more of processing elements such as a processor, a processing/control circuit, a Central Processing Unit (CPU), and so on.

Each of the memory blades 400 may include one or more memories, such as volatile memories, non-volatile memories, or a combination thereof. For example, each of the memory blades 400 may include Dynamic Random Access Memories (DRAMs), flash memories, memory cards, hard disk drives (HDDs), solid state drives (SSDs), or a combination thereof.

Each of the memory blades 400 may be divided, allocated, or designated by and used by one or more processing elements that are included in each of the compute blades 200. Also, each of the memory blades 400 may store one or more operating systems (OS) that may be initialized and/or executed by the compute blades 200.

The interconnect blade 300 may include a communication circuit, a communication device, or a combination thereof, which may be divided, allocated, or designated by and used by one or more processing elements included in each of the compute blades 200. For example, the interconnect blade 300 may be realized by an arbitrary number of network interface ports, interface cards, or interface switches. The interconnect blade 300 may use protocols related to one or more wired communication technologies for communication. For example, the interconnect blade 300 may support communication between the compute blades 200 and the memory blades 400 based on one or more of protocols such as PCIe (Peripheral Component Interconnect Express), QPI (QuickPath Interconnect), Ethernet, and the like.

Figure 4:
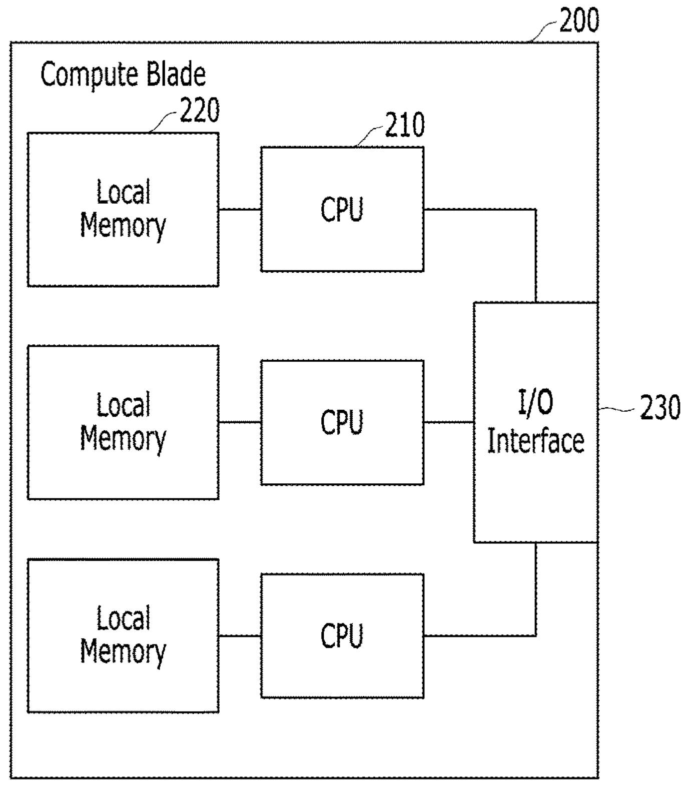
FIG. 4 is a block diagram illustrating a compute blade in accordance with an embodiment of the present disclosure.

FIG. 4 is a block diagram illustrating a compute blade 200 in accordance with an embodiment of the present disclosure.

Referring to FIG. 4, the compute blade 200 may include one or more Central Processing Units (CPUs) 210, one or more local memories 220, and an input/output (I/O) interface 230.

The CPUs 210 may divide, allocate, or designate one or more memory blades to be used, among the memory blades 400 illustrated in FIG. 3. Also, the CPUs 210 may initialize the one or more memory blades, and perform a data read operation and/or a data write (i.e., program) operation on the one or more memory blades.

The local memories 220 may store data to perform an operation of the CPUs 210. In various embodiments of the present disclosure, the local memories 220 may be in a one-to-one correspondence with the CPUs 210.

The input/output interface 230 may support interfacing between the CPUs 210 and the memory blades 400 through the interconnect blade 300 of FIG. 3. The input/output interface 230 may use protocols related to one or more wired communication technologies, output and transfer data from the CPUs 210 to the interconnect blade 300, and receive data inputted from the interconnect blade 300 to the CPUs 210. For example, the input/output interface 230 may support communication between the CPUs 210 and the interconnect blade 300 using one or more of protocols such as PCIe (Peripheral Component Interconnect Express), QPI (QuickPath Interconnect), Ethernet, and the like.

Figure 5A:
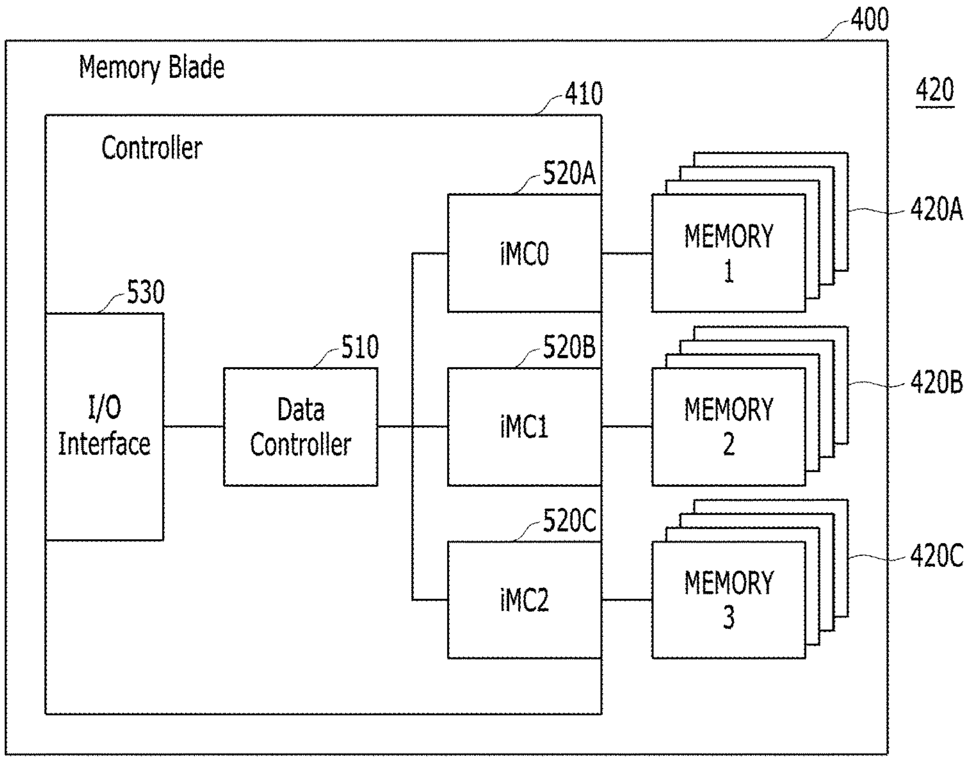
FIGS. 5A and 5B are block diagrams illustrating memory blades in accordance with embodiments of the present disclosure.
Figure 5B:
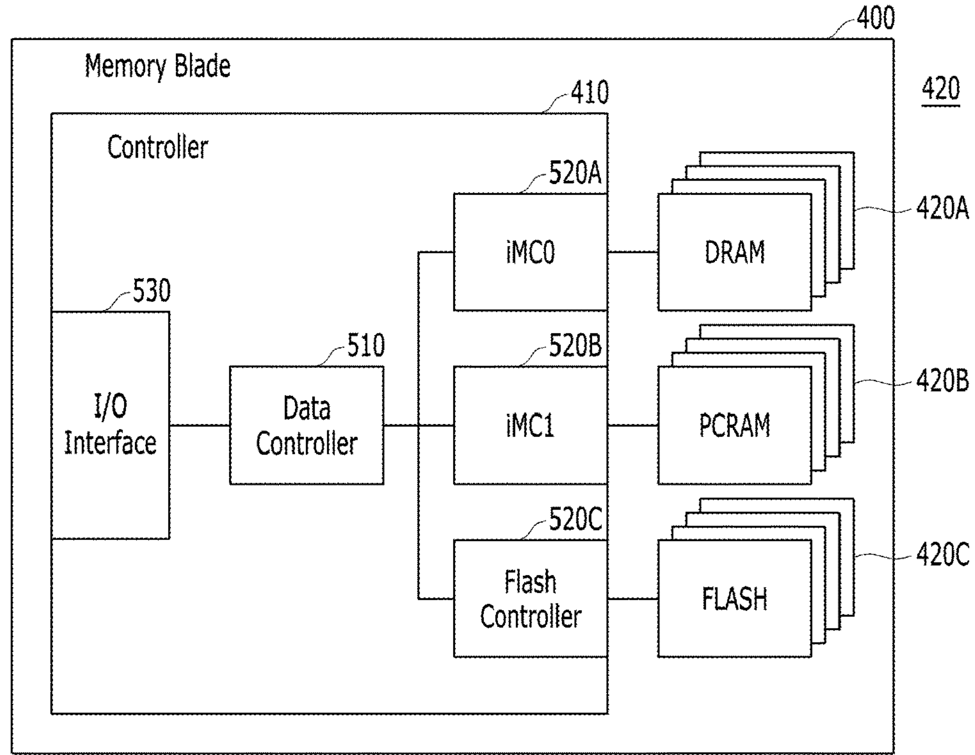

FIGS. 5A and 5B are block diagrams illustrating a memory blade 400 in accordance with an embodiment of the present disclosure.

Referring to FIG. 5A, the memory blade 400 may include a controller 410 and a plurality of memories 420. The memories 420 may store (or write) data therein or output (or read out) stored data under the control of the controller 410. The memories 420 may include a first memory group 420A, a second memory group 420B, and a third memory group 420C. Each of the first, second, and third memory groups 420A, 420B, and 420C may include a multiplicity of memories. The first memory group 420A, the second memory group 420B, and the third memory group 420C may have the same characteristics or different characteristics. In various embodiments of the present disclosure, the first memory group 420A, the second memory group 420B, and the third memory group 420C may include memories having different characteristics in terms of capacity or latency.

Referring to FIG. 5B, the first memory group 420A may include Dynamic Random Access Memories (DRAMs). The second memory group 420B may include Phase-Change Random Access Memories (PCRAMs). The third memory group 420C may include flash memories.

The capacity characteristics may be in relationship of the first memory group 420A<second memory group 420B<third memory group 420C. The latency characteristics may be in relationship of the first memory group 420A<second memory group 420B<third memory group 420C. In other words, the capacity of the third memory group 420C may be the greatest and the capacity of the first memory group 420A may be the smallest, while the latency of the first memory group 420A is the shortest and the latency of the third memory group 420C may be the longest.

FIG. 5B illustrates a case where the first memory group 420A includes DRAMs, the second memory group 420B includes PCRAMs, and the third memory group 420C includes flash memories, but embodiments are not limited thereto. In other embodiments, it is possible that various forms of memories having different characteristics are used for the first memory group 420A, the second memory group 420B, and the third memory group 420C.

In some embodiments, when the third memory group 420C includes flash memories, the first memory group 420A may include Static Random Access Memories (SRAMs), and the second memory group 420B may include Magnetic Random Access Memories (MRAMs) or Spin Torque Transfer Random Access Memories (STT-RAMs).

Referring back to FIG. 5A, the controller 410 may include a data controller 510, memory controllers MC 520A to 520C, and an input/output (I/O) interface 530.

The data controller 510 may control data that are transferred/received between the memories 420 and the compute blades 200 shown in FIG. 3. For example, in response to a write request or command, the data controller 510 may receive write data from the compute blades 200 and control a write operation for programming the write data in a corresponding memory among the memories 420. In a read operation, in response to a read request or command, the data controller 510 may read out data stored in a particular memory among the memories 420 and control the read operation for outputting the read data to a corresponding compute blade among the compute blades 200.

The memory controllers 520A to 520C may be positioned between the data controller 510 and the memories 420 and support interfacing between the data controller 510 and the memories 420. The memory controllers 520A to 520C may include a first memory controller iMC0 520A, a second memory controller iMC1 520B, and a third memory controller iMC2 520C that respectively correspond to the first memory group 420A, the second memory group 420B, and the third memory group 420C included in the memories 420. The first memory controller iMC0 520A may be disposed between the data controller 510 and the first memory group 420A and support a data transfer/reception between the data controller 510 and the first memory group 420A. The second memory controller iMC1 520B may be disposed between the data controller 510 and the second memory group 420B and support a data transfer/reception between the data controller 510 and the second memory group 420B. The third memory controller iMC2 520C may be disposed between the data controller 510 and the third memory group 420C and support a data transfer/reception between the data controller 510 and the third memory group 420C. In the embodiment illustrated in FIG. 5B, when the third memory group 420C includes flash memories, the third memory controller iMC2 520C may be a flash controller.

The input/output interface 530 may support interfacing between the data controller 510 and the compute blades 200 through the interconnect blade 300 of FIG. 3. The input/output interface 530 may use one or more protocols related to wired communication technologies, transfer read data from the data controller 510 to the interconnect blade 300, and transfer write data from the interconnect blade 300 to the data controller 510. For example, the input/output interface 530 may support communication between the data controller 510 and the interconnect blade 300 based on one or more of protocols such as Peripheral Component Interconnect Express (PCIe), QuickPath Interconnect (QPI), Ethernet, and the like.

As described above, a data processing system or a server system may have a structure in which a plurality of blades, e.g., compute blades and memory or storage blades, are discriminatively installed in a unit rack. Herein, one memory blade may include a plurality of memories having different characteristics to fulfill various user workloads. In other words, one memory blade may be a converged memory device in which a plurality of memories, such as DRAMs, SRAMs, PCRAMs, MRAMs, STT-RAMs, and/or flash memories (e.g., NAND-type flash memories), are converged. The converged memory device may be applied to various usage models because memories included in the converged memory device may have different characteristics.

Unlike a DRAM, a PCRAM and a flash memory that may be included in a memory blade may have limited endurance, and may be vulnerable in terms of a temperature and a power due to high energy consumption in a write operation. In short, the converged memory device may consume high power when transferring data in a high bandwidth, and a data error rate may be increased when the converged memory device develops a high temperature due to the high power usage. As a result, the converged memory device may be damaged by the high temperature and/or the high power.

Embodiments of the present disclosure, which will be described below, may improve the endurance of a certain memory, which requires or consumes relatively high energy, in a converged memory device including a plurality of memories, and may improve the performance of the certain memory by decreasing the number of times that the certain memory is used or operates. To this end, in embodiments of the present disclosure, some of the plurality of memories or some regions in the plurality of memories may be used as a cache region for the certain memory. In particular, overhead of data migration may be minimized by storing predetermined data, e.g., a page of hot data, for the certain memory in the cache region. Also, according to embodiments of the present disclosure, the energy consumption of each of the plurality of memories may be monitored and, if necessary, an energy throttling operation may be performed.

For example, according to embodiments of the present disclosure, a temperature and/or a power of each of the plurality of memories may be monitored and a throttling operation for throttling the temperature and/or power of each of the plurality of memories may be performed. According to embodiments of the present disclosure, the vulnerability of a memory to high temperature and power consumption may be improved by variably using some of the plurality of memories or some regions in the plurality of memories, which are designated as the cache region, as a write buffer or a temporary data buffer for the memory during the throttling operation performed for the memory.

A throttling operation for a first memory (e.g., a PCRAM, a flash memory, or the like) may reduce a temperature or average power consumption for the first memory by migrating data stored in the first memory, which consumes relatively high energy, into a preset cache region in a second memory (e.g., a DRAM, an SRAM, or the like), which consumes relatively low energy, and storing the migrated data in the cache region. Through the operation of migrating the data to the cache region, the number of times that a transaction is performed on the first memory, the number of times that the first memory is used, and the number of times that the first memory operates may be decreased. Furthermore, an operation frequency of the first memory may be decreased. In addition, a cycle of a command to operate the first memory may be longer. As a result of the throttling operation, the energy consumption of the first memory may be reduced or minimized. Therefore, a throttling operation for a memory in accordance with embodiments of the present disclosure may be understood as an operation of minimizing or reducing the energy consumption for the memory, which consumes relatively high energy.

With reference to FIGS. 6 to 19F, a memory system including a plurality of memory groups and capable of throttling memories of the plurality of memory groups will be described in more detail.

Figure 6:
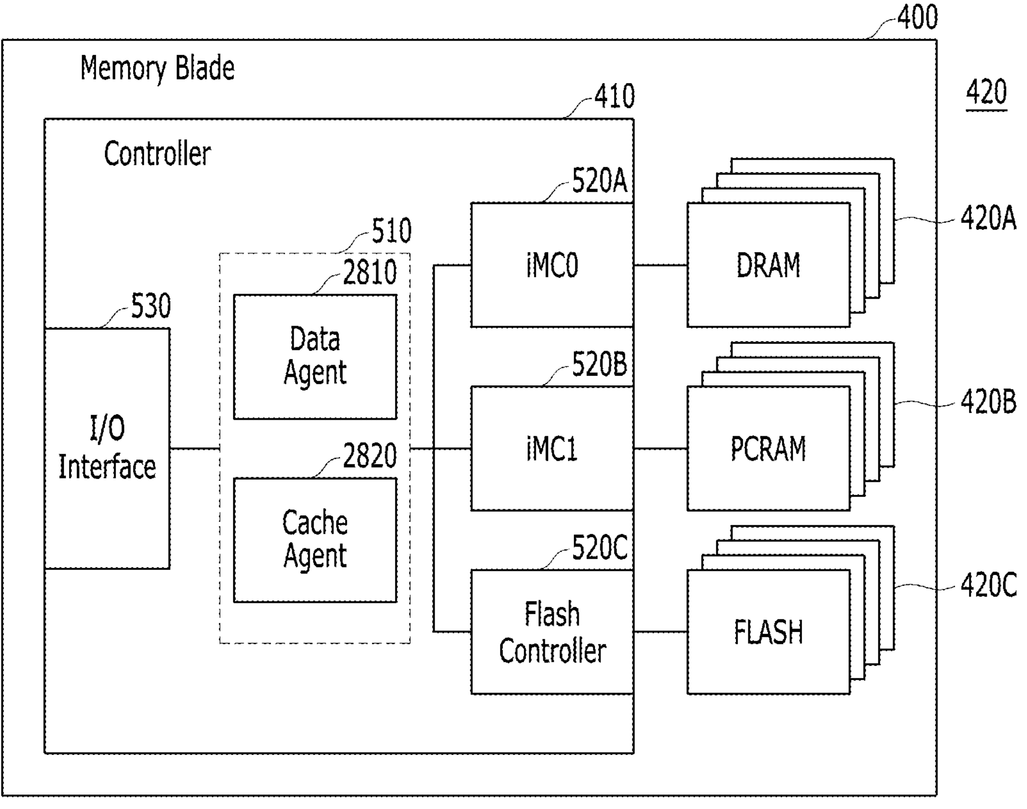
FIG. 6 is a block diagram illustrating a memory blade including a data controller in accordance with an embodiment of the present disclosure.

FIG. 6 is a block diagram illustrating a memory blade 400A including a controller 410 in accordance with an embodiment of the present disclosure.

Referring to FIG. 6, the memory blade 400A may include the controller 410 and memories 420. The memories 420 may include a first memory group 420A, a second memory group 420B, and a third memory group 420C that have different characteristics in, e.g., storage capacity and latency. The first memory group 420A may include DRAMs having first characteristics, the second memory group 420B may include PCRAMs having second characteristics, the second characteristics being different from the first characteristics, and the third memory group 420C may include flash memories having third characteristics, the third characteristics being different from the first characteristics and the second characteristics.

The controller 410 may include a data controller 510A, memory controllers MC 520A to 520C, and an input/output (I/O) interface 530. Since the memory blade 400A in FIG. 6 includes the same constituent elements as the constituent elements of the memory blade 400 illustrated above in FIG. 5B, detailed description on the same constituent elements in the memory blade 400A in FIG. 6 may be omitted herein, and a specific structure of the data controller 510A will be described below.

The data controller 510A may include a data agent 2810 and a cache agent 2820. The data agent 2810 may transfer/receive data for a write operation and/or a read operation between the controller 410 and the memories 420. The cache agent 2820 may use a predetermined region in the memories 420 as a cache region.

In various embodiments of the present disclosure, the cache agent 2820 may use a predetermined region in the first memory group 420A as a first cache region for the second memory group 420B. Also, the cache agent 2820 may use a predetermined region in the second memory group 420B as a second cache region for the third memory group 420C. Also, the cache agent 2820 may perform a cache control operation for managing least recently used data while using the cache region.

Figure 7A:
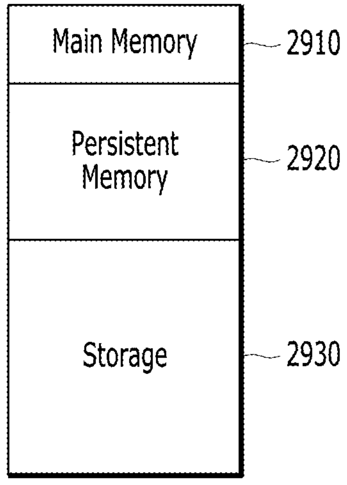

FIGS. 7A to 7C illustrate examples of memories of a memory blade in accordance with an embodiment of the present disclosure.

Referring to FIG. 7A, the memory blade, e.g., the memory blade 400A in FIG. 6, may use memories 420 to form a main memory 2910, a persistent memory 2920, and a storage 2930. In other embodiments, the memory blade 400A may use the memories 420 only as a main memory, or as a convergence of a main memory and a storage.

Referring to FIG. 7B, the main memory 2910 may include a first memory group, which includes k DRAMs, among the memories 420. The persistent memory 2920 may include a second memory group, which includes m PCRAMs, among the memories 420. The storage 2930 may include a third memory group, which includes n flash memories, among the memories 420. Each of K, m, and n is a positive integer.

In various embodiments of the present disclosure, a $k^{th}$ DRAM among the k DRAMs in the main memory 2910 may be selected and used as a first cache region 2940 for the PCRAMs in the persistent memory 2920, and an $m^{th}$ PCRAM among the m PCRAMs in the persistent memory 2920 may be selected and used as a second cache region 2950 for the flash memories in the storage 2930. In short, one physical memory among the memories in each of the main memory 2910 and the persistent memory 2920 may be used as a cache region. The above-described method of using the cache region may contribute improving the endurance and performance of PCRAMs and flash memories (e.g., NAND flash memories).

Referring to FIG. 7C, particular corresponding regions of the k DRAMs in the main memory 2910 may be selected and used as a first cache region 2945 for the PCRAMs in the persistent memory 2920, and particular corresponding regions of the m PCRAMs in the persistent memory 2920 may be selected and used as a second cache region 2955 for the flash memories in the storage 2930. In short, a logical memory formed of the particular corresponding regions of the memories in each of the main memory 2910 and the persistent memory 2920 may be used as a cache region.

Figure 8:
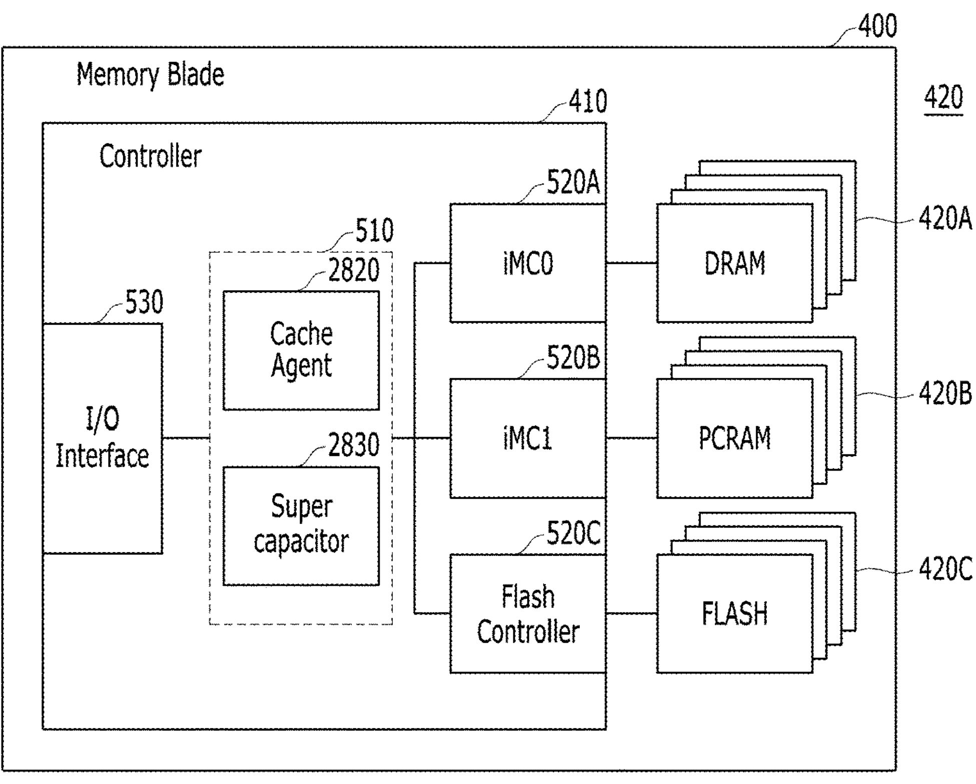
FIG. 8 is a block diagram illustrating a memory blade including a data controller in accordance with an embodiment of the present disclosure.

FIG. 8 is a block diagram illustrating a memory blade 400B including a data controller 510B in accordance with an embodiment of the present disclosure.

Referring to FIG. 8, the memory blade 400B may include the controller 410 and memories 420. The memories 420 may include a first memory group 420A, a second memory group 420B, and a third memory group 420C that have different characteristics in, e.g., storage capacity and latency. The first memory group 420A may include DRAMs having first characteristics, the second memory group 420B may include PCRAMs having second characteristics, the second characteristics being different from the first characteristics, and the third memory group 420C may include flash memories having third characteristics, the third characteristics being different from the first characteristics and the second characteristics. The controller 410 may include the data controller 510B, memory controllers MC 520A to 520C, and an input/output (I/O) interface 530. Since the memory blade 400B in FIG. 8 includes the same constituent elements as the constituent elements of the memory blade 400 illustrated in FIG. 5B, detailed description on the same constituent elements in the memory blade 400B in FIG. 8 may be omitted herein, and a specific structure of the data controller 510B will be described below.

The data controller 510B may include a cache agent 2820 and a supercapacitor 2830. The cache agent 2820 may use a predetermined region in the memories 420 as a cache region. Also, the cache agent 2820 may perform a cache control operation for managing data, e.g., least recently used data, while using the cache region.

In various embodiments of the present disclosure, as illustrated in FIGS. 6, 7B, and 7C, the cache agent 2820 may use a predetermined region in the first memory group 420A as a first cache region for the second memory group 420B. Also, the cache agent 2820 may use a predetermined region in the second memory group 420B as a second cache region for the third memory group 420C.

The supercapacitor 2830 may be employed to prevent data loss and recover data by performing a flush operation onto data stored in a cache region, e.g., in the DRAMs 420A, even when a power supply is cut off, such as a sudden power off (SPO). In various embodiments of the present disclosure, the supercapacitor 2830 makes it possible to flush the data stored in the cache region of the DRAMs 420A even when the power supply is cut off. The supercapacitor 2830 is used as a back-up power supply unit for sufficiently supplying a power source to memories of a particular group that include the cache region although the power supply is cut off.

Although it is not shown in FIG. 8, the data controller 510B includes a data agent, which corresponds to the data agent 2810 in FIG. 6. The data agent may transfer/receive data for a write operation and/or a read operation between the controller 410 and the memories 420.

Figure 9:
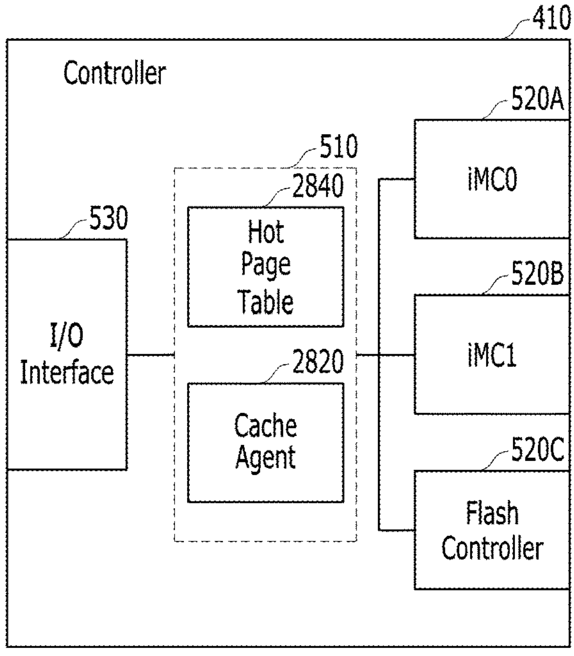
FIG. 9 is a block diagram illustrating a controller including a data controller in accordance with an embodiment of the present disclosure.

FIG. 9 is a block diagram illustrating a controller 410 including a data controller 510C in accordance with an embodiment of the present disclosure.

Referring to FIG. 9, the controller 410 may include the data controller 510C, memory controllers MC 520A to 520C, and an input/output (I/O) interface 530.

The data controller 510C may include a cache agent 2820 and a hot page table 2840. The cache agent 2820 may use, as a cache region, a predetermined region in memories (not shown), which may correspond to the memories 420 described above with reference to FIGS. 6 and 8. Also, the cache agent 2820 may perform a cache control operation for managing, e.g., least recently used data, while using the cache region.

In various embodiments of the present disclosure, as illustrated in FIGS. 6, 7B, and 7C, the cache agent 2820 may use a predetermined region in the first memory group 420A as a first cache region for the second memory group 420B. Also, the cache agent 2820 may use a predetermined region in the second memory group 420B as a second cache region for the third memory group 420C.

Although it is not shown in FIG. 9, the data controller 510C includes a data agent, which corresponds to the data agent 2810 in FIG. 6, and the data agent may transfer/receive data for a write operation and/or a read operation between the controller 410 and the memories 420.

Since a write operation tends to be performed by converging onto particular addresses of the memories 420, the cache agent 2820 may manage predetermined data, e.g., hot data, and migrate and store the hot data into the cache region. In other words, the cache agent 2820 may be able to manage data by a page unit (e.g., approximately 4K-bit data) using the hot page table 2840. Herein, although a case where the data migrated into the cache region are hot data is described as an example, the cache agent 2820 may be able to migrate and store data in a different, predetermined appropriate form into the cache region.

FIG. 10A illustrates an example of a hot page table in accordance with an embodiment of the present disclosure. The storing and management of the hot page table may be carried out by a cache agent, e.g., the cache agent 2820 described above.

Referring to FIG. 10A, a hot page table 3210 may include HA, PA, FREQ, and VALID fields. HA may represent a host address requested for a write operation. For example, HA may be an address of the compute blade 200 illustrated in FIG. 3 that is requested for the write operation. PA may be a physical address of a memory that is requested for the write operation.

FREQ may represent a write request frequency count for an address. For example, a value of the FREQ field may be incremented when a write request for the address occurs. The value of the FREQ field may be decreased at a predetermined time interval. When the value of the FREQ field is equal to or less than a predetermined count value, data of a corresponding page may be evicted from a cache region.

VALID may represent whether the data of the corresponding page are cached into the cache region or flushed from the cache region. For example, when a value of the VALID field is '1,' it may represent that the data of the corresponding page are cached into the cache region. On the other hand, when the value of the VALID field is '0,' it may represent that the data of the corresponding page are flushed from the cache region.

For example, referring to FIG. 10A, in a case of a memory whose PA is '0,' write requests have occurred 100 times for the memory and data according to the write requests have been cached into the cache region of the memory, the value of the VALID field is '1.' In a case of a memory whose PA is '2,' write requests have occurred 200 times for the memory, and data according to the write requests have been cached into the cache region of the memory, the value of the VALID field is '1.' On the other hand, in a case of a memory whose PA is '1,' write requests have occurred 50 times for the memory, and data according to the write requests have been evicted from the cache region of the memory, i.e., the data according to the write requests have not been cached into the cache region, the value of the VALID field is '0.'

FIG. 10B illustrates an example of storing a group 3220 of cache data in accordance with an embodiment of the present disclosure. The storing and management of the cache data group 3220 may be carried out by a cache agent, e.g., the cache agent 2820 described above.

Referring to FIG. 10B, the cache data may be grouped into a predetermined size corresponding to an address and stored by a group unit. For example, the cache data PA[0], PA[1], . . . , PA[11] may be stored on the basis of a page unit, which is a page including data, e.g., 4K-bit data. In other words, the cache data PA[0], PA[1], . . . , PA[11] may be aligned on the basis of the page unit. The page 3220 including the cache data PA[0], PA[1], . . . , PA[11] may be stored in the cache regions 2940 and 2950, as illustrated in FIG. 7B, or stored in the cache regions 2945 and 2955, as illustrated in FIG. 7C.

Figure 11:
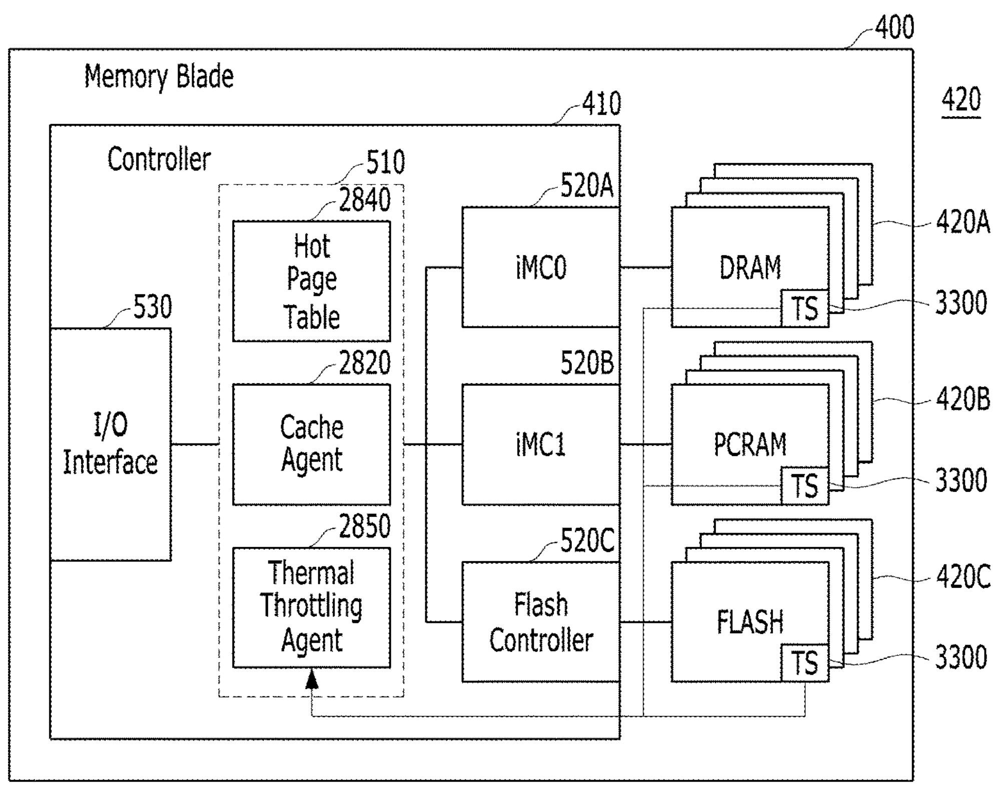
FIG. 11 is a block diagram illustrating a memory blade including a data controller in accordance with an embodiment of the present disclosure.

FIG. 11 is a block diagram illustrating a memory blade 400D including a data controller 510D in accordance with an embodiment of the present disclosure.

Referring to FIG. 11, the memory blade 400D may include a controller 410 and memories 420. The memories 420 may include a first memory group 420A, a second memory group 420B, and a third memory group 420C, which have different storage characteristics, e.g., different storage capacity and latency. The first memory group 420A may include DRAMs having first characteristics, the second memory group 420B may include PCRAMs having second characteristics, the second characteristics being different from the first characteristics, and the third memory group 420C may include flash memories having third characteristics, the third characteristics being different from the first characteristics and the second characteristics. Each of the first memory group 420A, the second memory group 420B, and the third memory group 420C is provided with a thermal sensor (TS) 3300. The thermal sensor 3300 may be able to measure a temperature of a memory corresponding thereto.

The controller 410 may include the data controller 510D, memory controllers MC 520A to 520C, and an input/output (I/O) interface 530. Since the memory blade 400D includes the same constituent elements as the constituent elements of the memory blade 400 illustrated above in FIG. 5B, detailed description on the same constituent elements described above may be omitted herein, and a specific structure of the data controller 510D will be described below.

The data controller 510D may include a cache agent 2820, a hot page table 2840, and a thermal throttling agent 2850. The cache agent 2820 may use a predetermined region in the memories 420 as a cache region.

In various embodiments of the present disclosure, the cache agent 2820 may use a predetermined region in the first memory group 420A as a first cache region for the second memory group 420B. Also, the cache agent 2820 may use a predetermined region in the second memory group 420B as a second cache region for the third memory group 420C. Also, the cache agent 2820 may perform a cache control operation for managing, e.g., least recently used data, while using the cache region.

The data controller 510D may include a data agent (not shown), which corresponds to the data agent 2810 in FIG. 6. The data agent may transfer/receive data for a write operation and/or a read operation between the controller 410 and the memories 420.

Since a write operation tends to be performed by converging onto particular addresses of the memories 420, the cache agent 2820 may manage predetermined data, e.g., hot data, and migrate and store the hot data into the cache region. In other words, the cache agent 2820 may be able to manage data by a page unit using the hot page table 2840. A page may include 4K-bit data.

The thermal throttling agent 2850 may monitor a temperature of each of the memories 420 by collecting temperature information of each of the memories 420 that is measured by the thermal sensors 3300 mounted on the first memory group 420A, the second memory group 420B, and the third memory group 420C. Also, when the thermal throttling agent 2850 decides to control a temperature of a particular memory based on the collected temperature information, the thermal throttling agent 2850 may perform a temperature throttling operation for the particular memory.

In various embodiments of the present disclosure, the thermal throttling agent 2850 may perform an operation of controlling the use of a cache region for a memory whose temperature is to be throttled. The thermal throttling agent 2850 interlocks with the cache agent 2820 to perform the operation of controlling the use of a cache region. For example, the thermal throttling agent 2850 may perform an operation of changing the use of a cache region for a memory whose temperature is to be throttled, such that the cache region is used as a write buffer or a temporary data buffer for the memory. Specific examples for the operation of controlling the use of a cache region, which is performed by the thermal throttling agent 2850, will be described later with reference to FIGS. 14A to 14E.

Also, the thermal throttling agent 2850 may perform an operation of throttling a data transaction characteristic for the memory whose temperature is to be throttled. For example, the thermal throttling agent 2850 may control the input/output interface 530 to decrease a data throughput, a transmission rate, or a bandwidth of the memory whose temperature is to be throttled.

Also, the thermal throttling agent 2850 may adjust an operating speed of a cooling fan (not shown), which is mounted on the memory whose temperature is to be throttled. For example, the thermal throttling agent 2850 may be able to decrease a temperature of a high-temperature memory by increasing an operating speed of a cooling fan mounted on the high-temperature memory.

When it is decided that a temperature of a particular memory should be throttled, the above-mentioned operations performed by the thermal throttling agent 2850 of the data controller 510D may be sequentially performed in an appropriate order. For example, the thermal throttling agent 2850 may perform a temperature throttling operation in the order of adjusting a fan speed→controlling the usage of a cache region→controlling data transaction. Energy consumption of a memory whose energy consumption is high due to a high temperature can be reduced by performing a temperature throttling operation on the memory.

Figure 12:
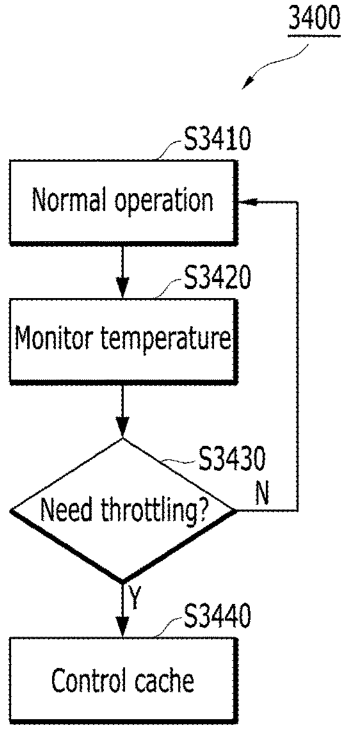
FIG. 12 is a flowchart briefly illustrating an operation of a memory blade in accordance with an embodiment of the present disclosure.

FIG. 12 is a flowchart illustrating an operation 3400 of a memory blade in accordance with an embodiment of the present disclosure. The operation 3400 may be controlled by the data controller 510D illustrated in FIG. 11.

Referring to FIG. 12, the data controller 510D may perform a normal operation in step S3410 and monitor a temperature of a memory in step S3420. Herein, the normal operation may correspond to a case where the data controller 510D manages hot-page data using a cache region while the data controller 510D performs a write operation and a read operation onto the first memory group 420A, the second memory group 420B, and the third memory group 420C. The normal operation has been described above with reference to FIGS. 6 to 10B.

In various embodiments of the present disclosure, the thermal throttling agent 2850 of the data controller 510D may be able to monitor a temperature of each of the memories 420 by collecting temperature information of each of the memories 420. For example, the temperatures of the memories 420 are measured by the thermal sensors 3300 mounted on the first memory group 420A, the second memory group 420B, and the third memory group 420C. The temperatures are measured multiple times at a predetermined frequency, corresponding to a predetermined period.

The thermal throttling agent 2850 may decide whether a temperature of a particular memory should be throttled or not based on the collected temperature information in step S3430. When the thermal throttling agent 2850 decides that the temperature of the particular memory should be throttled, the thermal throttling agent 2850 may perform a temperature throttling operation onto the particular memory.

In various embodiments of the present disclosure, the thermal throttling agent 2850 may perform an operation of controlling the use of a cache region for the particular memory whose temperature is to be throttled, by being interlocked with the cache agent 2820 in step S3440. For example, the thermal throttling agent 2850 may use a cache region as a write buffer or a temporary data buffer for the particular memory whose temperature is to be throttled. The thermal throttling agent 2850 is interlocked with the cache agent 2820 to perform the operation of controlling the use of a cache region.

In addition, the thermal throttling agent 2850 may perform an operation of throttling a data transaction characteristic for the particular memory whose temperature is to be throttled. For example, the thermal throttling agent 2850 may be able to control the input/output interface 530 to decrease a data throughput, a transmission rate, or a bandwidth of the particular memory whose temperature is to be throttled.

Also, the thermal throttling agent 2850 may adjust an operating speed of a cooling fan (not shown) that is mounted on the particular memory whose temperature is to be throttled. For example, the thermal throttling agent 2850 may be able to decrease a temperature of a high-temperature memory by increasing an operating speed of a cooling fan mounted on the high-temperature memory.

When it is decided that the temperature of the particular memory should be throttled, the above-mentioned operations performed by the thermal throttling agent 2850 of the data controller 510D may be sequentially performed in an appropriate order. For example, the thermal throttling agent 2850 may perform a temperature throttling operation in the order of adjusting a fan speed ➔ controlling the usage of a cache region ➔ controlling data transaction.

As described above, when the temperature of the particular memory consuming high energy should be throttled, the data controller 510D may perform an operation of decreasing the temperature of the particular memory by migrating and storing data for the particular memory, which has a relatively high energy consumption (e.g., a PCRAM, a flash memory, or the like), into a predetermined cache region of another memory, which has a relatively low energy consumption (e.g., a DRAM, an SRAM, or the like). Through the operation of migrating and storing data, the number of times that a transaction is performed on the particular memory, the number of times that the particular memory is used, the number of times that the particular memory operates, or a combination thereof, may be decreased. In addition, the operation frequency of the particular memory may be decreased. Furthermore, a cycle of an operation command for operating the particular memory may be increased. As a result, the energy consumption of the particular memory may be decreased or minimized.

Figure 13:
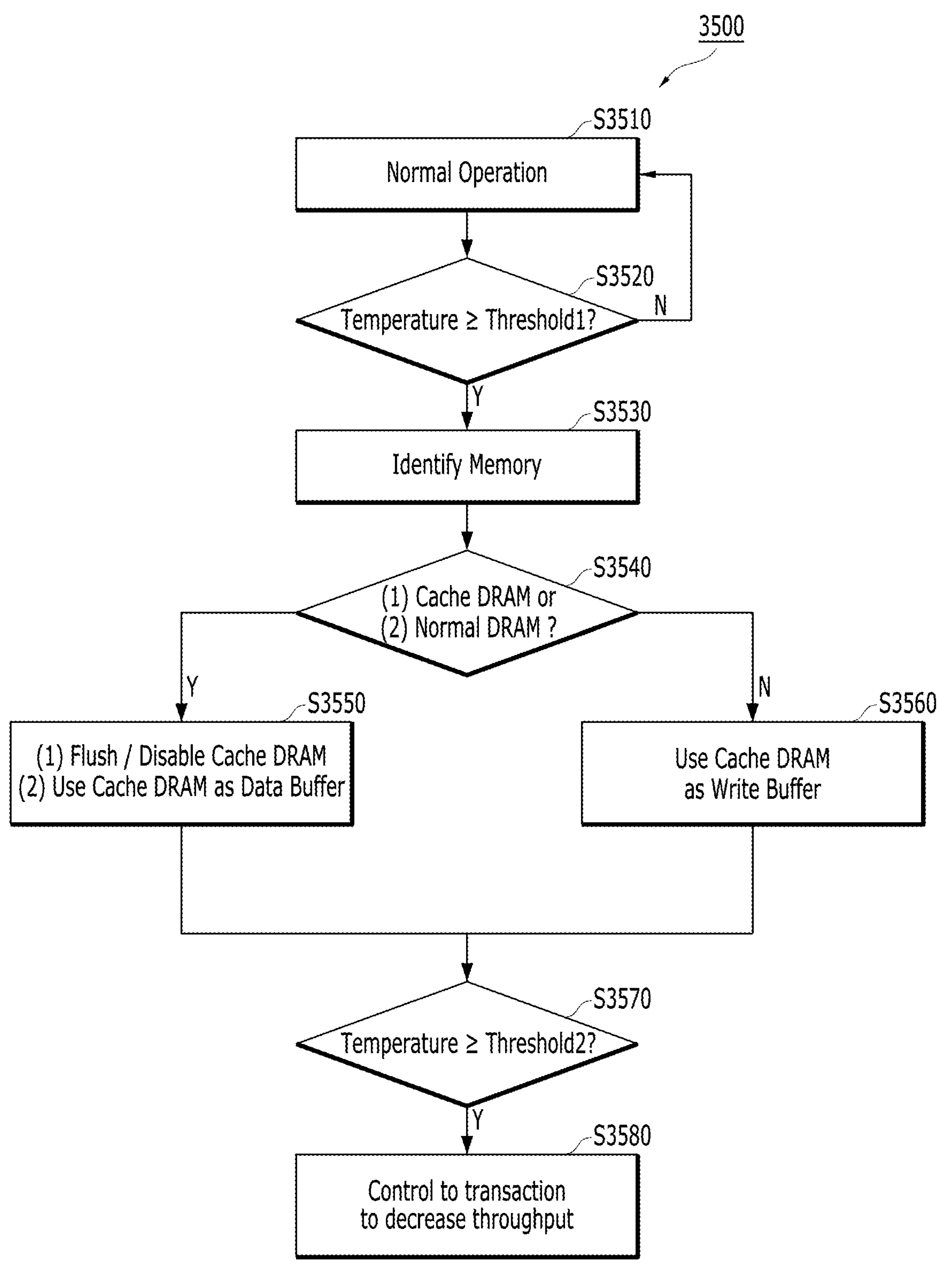
FIG. 13 is a flowchart illustrating an operation of a memory blade in detail in accordance with an embodiment of the present disclosure.

FIG. 13 is a flowchart illustrating an operation 3500 of a memory blade in detail in accordance with an embodiment of the present disclosure. The operation 3500 may be controlled by the data controller 510D illustrated in FIG. 11.

Referring to FIG. 13, the data controller 510D may perform a normal operation in step S3510. Herein, the normal operation may correspond to a case where the data controller 510D performs an operation of managing hot-page data using a cache region while performing a write operation and a read operation on the first memory group 420A, the second memory group 420B, and the third memory group 420C, as described above with reference to FIGS. 6 to 10B.

The thermal throttling agent 2850 of the data controller 510D may monitor a temperature of each of the memories 420 and determine whether the temperature of each of the memories 420 is equal to or higher than a first threshold value THRESHOLD1 in step S3520. In various embodiments of the present disclosure, the thermal throttling agent 2850 of the data controller 510D may be able to monitor the temperatures of the memories 420 by collecting temperature information of each of the memories 420 that is measured by the thermal sensors 3300 mounted on the first memory group 420A, the second memory group 420B, and the third memory group 420C.

When it is decided that a temperature of a particular memory is equal to or higher than the first threshold value THRESHOLD1, the temperature of the particular memory should be throttled because it means that the energy consumption of the particular memory is high. Therefore, when it is decided that the temperature of the particular memory is equal to or higher than the first threshold value THRESHOLD1, the thermal throttling agent 2850 may detect identifier (ID) information of the particular memory in step S3530, and perform a thermal throttling operation by controlling the use of a cache region for the particular memory in steps S3540, S3550, and S3560.

A memory whose temperature is determined to be equal to or higher than the first threshold value THRESHOLD1 may be a cache DRAM that is designated as a cache region in the first memory group 420A, a normal DRAM that is not designated as a cache region in the first memory group 420A, a cache PCRAM that is designated as a cache region in the second memory group 420B, a normal PCRAM that is not designated as a cache region in the second memory group 420B, or a memory in the third memory group 420C, i.e., a flash memory.

For the sake of convenience in description, embodiments of the present disclosure may be described by taking a case where a memory whose temperature is determined to be equal to or higher than the first threshold value THRESHOLD1 is a cache DRAM which is designated as a cache region in the first memory group 420A, a case where a memory whose temperature is determined to be equal to or higher than the first threshold value THRESHOLD1 is a normal DRAM which is not designated as a cache region in the first memory group 420A, and a case where a memory whose temperature is determined to be equal to or higher than the first threshold value THRESHOLD1 is a normal PCRAM which is not designated as a cache region in the second memory group 420B. Specific examples on the operation of the thermal throttling agent 2850 controlling the use of a cache region will be described by referring to FIGS. 14A to 14E.

When a particular memory whose temperature is determined to be equal to or higher than the first threshold value THRESHOLD1 is the cache DRAM in the first memory group 420A (case (1) of the step S3540 in FIG. 13), the thermal throttling agent 2850 may flush data stored in the cache DRAM by being interlocked with the cache agent 2820 and disable the use of the cache DRAM as a cache region. In various embodiments of the present disclosure, the data stored in the cache DRAM may be flushed into a cache region, e.g., 2950 of FIG. 7B or 2955 of FIG. 7B in the second memory group 420B.

When the particular memory is the normal DRAM in the first memory group 420A (a case (2) of the step S3540 in FIG. 13), the thermal throttling agent 2850 may use the cache DRAM as a data buffer for the normal DRAM by being interlocked with the cache agent 2820 (case (2) of the step S3550 in FIG. 13).

When the particular memory is the normal PCRAM in the second memory group 420B, the thermal throttling agent 2850 may use the cache DRAM in the first memory group 420A as a write buffer for the normal PCRAM by being interlocked with the cache agent 2820 in step S3560. When the cache region is used as the write buffer, data agent 2810 may write data to be written to the particular memory into the cache region first. Since the write operation to the particular memory is not performed temporarily, the temperature of the particular memory may be lowered.

Subsequently, the thermal throttling agent 2850 may determine whether the temperature of the particular memory whose cache usage has been controlled is equal to or higher than a second threshold value THRESHOLD2 in step S3570. When the temperature of the particular memory is equal to or higher than the second threshold value THRESHOLD2, the thermal throttling agent 2850 may perform an operation of throttling a data transaction characteristic for the particular memory in step S3580. For example, the thermal throttling agent 2850 may control the input/output interface 530 to decrease a data throughput, a transmission rate, or a bandwidth of the particular memory whose temperature is to be throttled.

In addition, although not illustrated and described herein, the thermal throttling agent 2850 may adjust an operating speed of a cooling fan (not shown) that is mounted on the particular memory whose temperature is to be throttled. For example, the thermal throttling agent 2850 may be able to decrease a temperature of a high-temperature memory by increasing an operating speed of a cooling fan mounted on the high-temperature memory that is cooling the high-temperature memory.

In various embodiments of the present disclosure, the thermal throttling agent 2850 may set reference values so that the first threshold value THRESHOLD1 is smaller than the second threshold value THRESHOLD2. This relationship is set in consideration of a case where a thermal throttling operation fails even though the thermal throttling agent 2850 controls the use of a cache region. For example, even when the cache region 2945 for a PCRAM illustrated in FIG. 7C is disabled in the operation of controlling the use of a cache region, the temperature of the DRAMs in the main memory 2910 may be increased as the access to the DRAMs is increased. In this case, the thermal throttling agent 2850 may perform a thermal throttling operation by controlling data transaction for the DRAMs in the main memory 2910 in step S3580.

FIGS. 14A to 14E illustrate an example of a throttling operation of a memory blade for throttling a temperature in accordance with an embodiment of the present disclosure. The operation 3500 described with reference to FIG. 13 may be performed by the cache agent 2820 and the thermal throttling agent 2850 of the data controller 510D illustrated in FIG. 11.

The thermal throttling agent 2850 of the data controller 510D may monitor the temperatures of the memories 420 and determine whether a temperature of a particular memory is equal to or higher than a threshold value THRESHOLD or not. When it is determined that the temperature of the particular memory is equal to or higher than the threshold value THRESHOLD, it may be a case where the energy consumption of the particular memory is so high that a thermal throttling operation is needed. The particular memory whose temperature is determined to be equal to or higher than the threshold value THRESHOLD may be a cache DRAM designated as a cache region in the first memory group 420A, a normal DRAM that is not designated as a cache region in the first memory group 420A, a PCRAM designated as a cache region in the second memory group 420B, a normal PCRAM that is not designated as a cache region in the second memory group 420B, or a memory in the third memory group 420C, i.e., a flash memory.

Figures 14A, 14B, 14C:
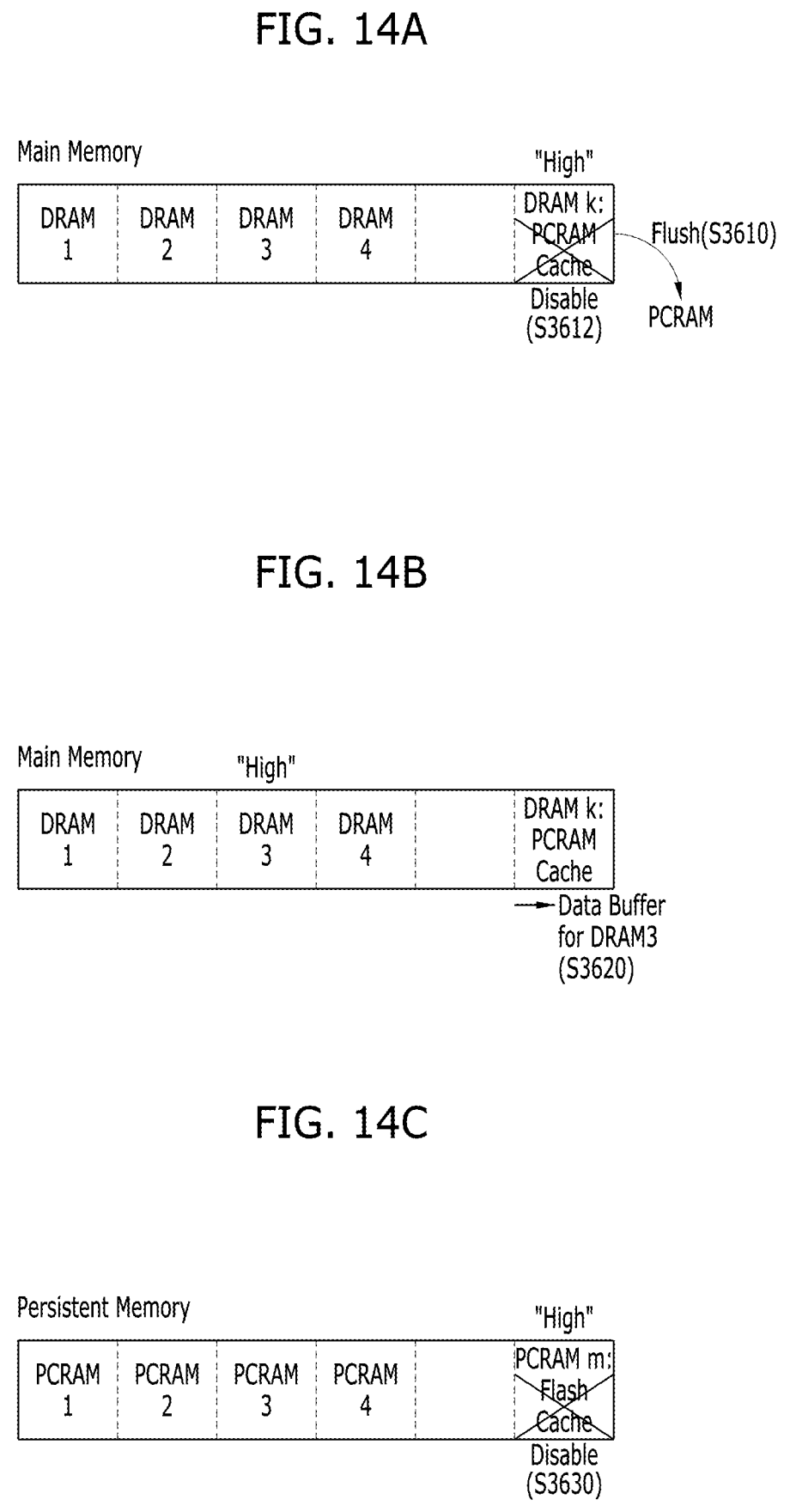

Referring to FIG. 14A, when a temperature of a cache DRAM, e.g., DRAM k, which is designated as a first cache region in the first memory group 420A, is equal to or higher than a threshold value THRESHOLD (e.g., DRAMk High), the data controller 510D may flush data stored in the DRAM k into a PCRAM designated as a second cache region in the second memory group 420B in step S3610 and disable the use of the DRAM k as the first cache region, in step S3612.

Referring to FIG. 14B, when a temperature of a normal DRAM, e.g., DRAM 3, which is not designated as a cache region in the first memory group 420A, is equal to or higher than a threshold value THRESHOLD (e.g., DRAM3 High), the data controller 510D may use the first cache region, e.g., DRAM k, as a data buffer for the DRAM 3, and store data stored in the DRAM 3 in the DRAM k, in step S3620.

Referring to FIG. 14C, when a temperature of a cache PCRAM, e.g., PCRAM m, designated as a second cache region in the second memory group 420B is equal to or higher than a threshold value THRESHOLD (e.g., PCRAMm High), the data controller 510D may disable the use of the PCRAM m as the second cache region, in step S3630.

Figures 14D, 14E:
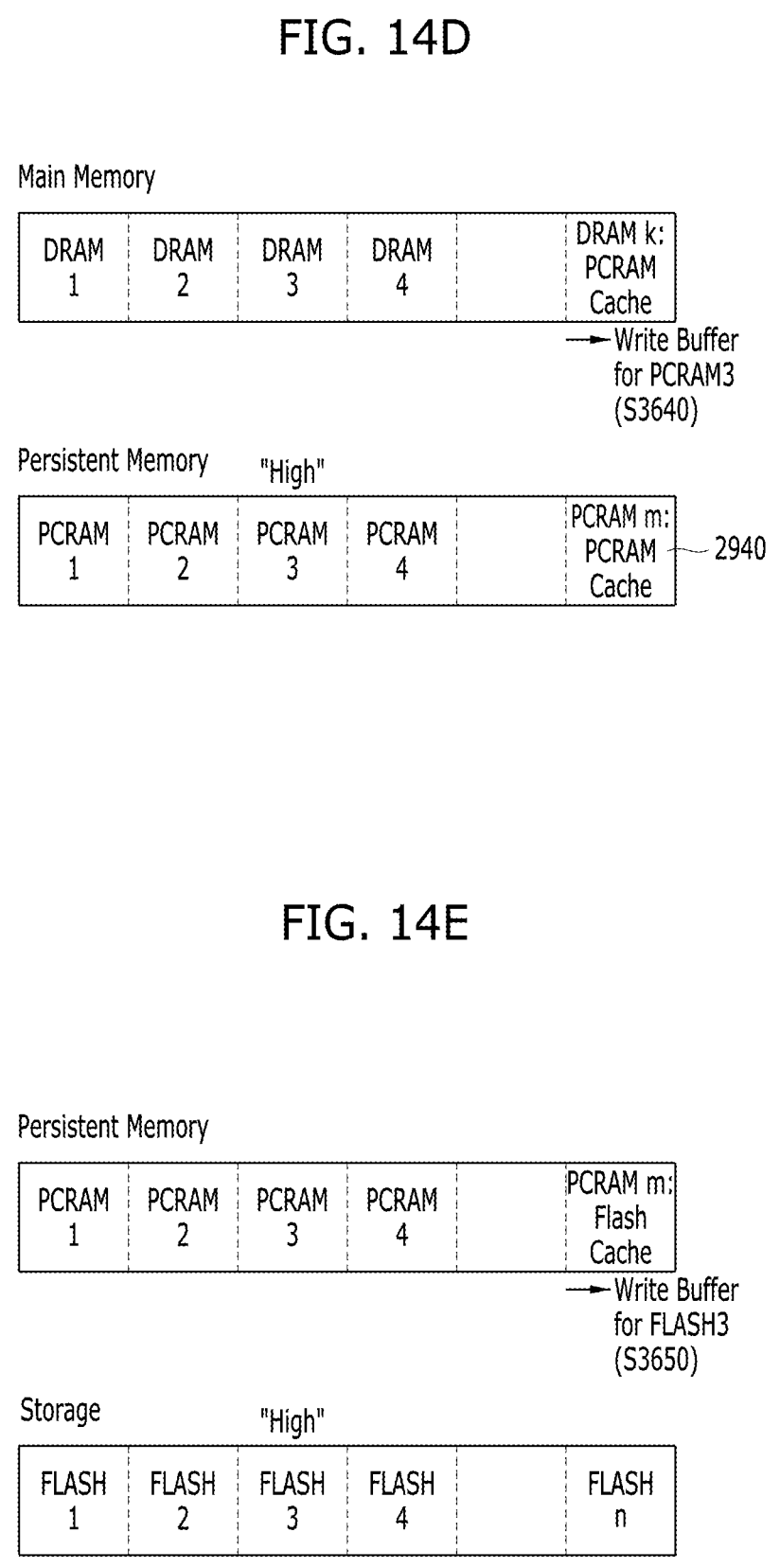

Referring to FIG. 14D, when a temperature of a normal PCRAM, e.g., PCRAM 3, which is not designated as a cache region in the second memory group 420B, is equal to or higher than a threshold value THRESHOLD (e.g., PCRAM3 High), the data controller 510D may store write data for the PCRAM 3 in the cache DRAM that is designated as the first cache region in the first memory group 420A, in step S3640. In short, the data controller 510D may use the cache DRAM designated as the first cache region as a write buffer for the PCRAM 3 of the high temperature in the second memory group 420B.

Referring to FIG. 14E, when a temperature of a flash memory, e.g., FLASH 3, in the third memory group 420C is equal to or higher than a threshold value THRESHOLD (e.g., FLASH3 High), the data controller 510D may store write data for the FLASH 3 into a cache PCRAM (PCRAM m) designated as the second cache region in the second memory group 420B, in step 1450. In short, the data controller 510D may use the cache PCRAM designated as the second cache region as a write buffer for the FLASH 3 of the high temperature in the third memory group 420C.

Figures 15, 16:
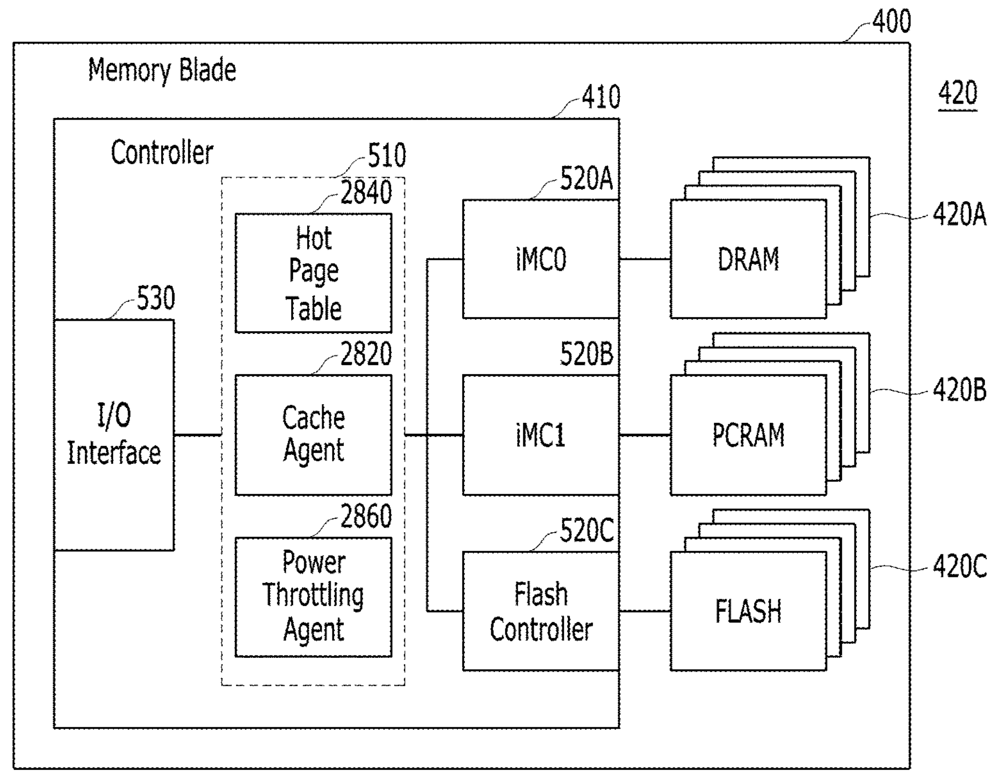
FIG. 15 illustrates an example of using a hot page table as a table for a write buffer during a temperature throttling operation of a memory blade in accordance with an embodiment of the present disclosure.
FIG. 16 is a block diagram illustrating a memory blade including a data controller in accordance with an embodiment of the present disclosure.

FIG. 15 illustrates an example 3700 of using a hot page table as a table for a write buffer during a temperature throttling operation of a memory blade in accordance with an embodiment of the present disclosure. The example 3700 may be controlled by the cache agent 2820 and the thermal throttling agent 2850 of the data controller 510D illustrated in FIG. 11.

Referring to FIG. 15, the hot page table, which corresponds to the hot page table 2840 in FIG. 11, may be used as a table for a write buffer during a thermal throttling operation, instead of being used as a buffer for managing hot-page data in a cache region as illustrated in FIG. 10A in a normal operation. For example, write data for a physical address (PA) 10 may be stored in the cache region, and write data for a physical address 11 may be stored in the cache region, and write data for a physical address 12 may be stored in the cache region, regardless of a write request frequency count for each of the physical addresses 10, 11, and 12, i.e., regardless of whether the write data is hot data or not. In FIG. 15, a write request frequency count for each physical address is '0.'

FIG. 16 is a block diagram illustrating a memory blade 400E including a data controller 510E in accordance with an embodiment of the present disclosure.

Referring to FIG. 16, the memory blade 400E may include a controller 410 and memories 420. The memories 420 may include a first memory group 420A, a second memory group 420B, and a third memory group 420C that have different characteristics, e.g., different storage capacity and latency. The first memory group 420A may include DRAMs having first characteristics, the second memory group 420B may include PCRAMs having second characteristics, the second characteristics being different from the first characteristics, and the third memory group 420C may include flash memories having third characteristics, the third characteristics being different from the first characteristics and the second characteristics.

The controller 410 may include the data controller 510E, memory controllers MC 520A to 520C, and an input/output (I/O) interface 530. Since the memory blade 400E includes the same constituent elements as the constituent elements of the memory blades 400 illustrated above in FIG. 5B, detailed description on the same constituent elements described above may be omitted herein, and a specific structure of the data controller 510E will be described below.

The data controller 510E may include a cache agent 2820, a hot page table 2840, and a power throttling agent 2860. The cache agent 2820 may use a predetermined region in the memories 420 as a cache region. Also, the cache agent 2820 may perform a cache control operation for managing, e.g., least recently used data, while using the cache region.

In various embodiments of the present disclosure, as illustrated in FIGS. 6, 7B, and 7C, the cache agent 2820 may use a predetermined region in the first memory group 420A as a first cache region for the second memory group 420B. Also, the cache agent 2820 may use a predetermined region in the second memory group 420B as a second cache region for the third memory group 420C.

Since a write operation tends to be performed by converging onto particular addresses of the memories 420, the cache agent 2820 may manage predetermined data, e.g., hot data, and migrate and store the hot data into the cache region. In other words, the cache agent 2820 may be able to manage data by a page unit (e.g., approximately 4K-bit data) using the hot page table 2840.

The power throttling agent 2860 may monitor the power for each of the memories 420 by collecting power information of each of memories included in the first memory group 420A, the second memory group 420B, and the third memory group 420C.

In various embodiments of the present disclosure, the power throttling agent 2860 may monitor the power for each of the memories 420 by collecting data transaction information (e.g., an amount of write data that is processed) of each of the memories included in the first memory group 420A and the second memory group 420B. Alternatively, the power throttling agent 2860 may monitor the power for each of the memories 420 by monitoring a peak current of each of the memories included in the first memory group 420A and the second memory group 420B. The peak current of each of the memories 420 may be measured by a Power Management Integrated Circuit (PMIC).

Also, when it is decided based on the collected power information that the power of a particular memory should be throttled, the power throttling agent 2860 may perform a power throttling operation for the particular memory.

In various embodiments of the present disclosure, the power throttling agent 2860 may perform an operation of controlling the use of a cache region for the particular memory whose power is to be throttled, by being interlocked with the cache agent 2820. For example, the power throttling agent 2860 may perform an operation of changing a cache region for the particular memory to be used as a write buffer for the particular memory by being interlocked with the cache agent 2820. Specific examples for the operation of controlling the use of a cache region, which is performed by the power throttling agent 2860, are similar to the operations that have been described above with reference to FIGS. 14A to 14E.

Also, the power throttling agent 2860 may perform an operation of controlling data transaction for the particular memory whose power is to be throttled. For example, the power throttling agent 2860 may be able to control the input/output interface 530 to decrease a data throughput, a transmission rate, or a bandwidth of the particular memory whose power is to be throttled.

When it is decided that the power of the particular memory should be throttled, the above-mentioned operations performed by the power throttling agent 2860 of the data controller 510E may be sequentially performed in an appropriate order or performed concurrently. For example, the power throttling agent 2860 may perform a power throttling operation in the order of controlling the cache region usage ➔ controlling data transaction. It is possible to reduce the energy consumption of a memory whose energy consumption is increased due to excessive data transaction, by performing the power throttling operation on the memory.

Although it is not shown in FIG. 16, the data controller 510E may include a data agent, which corresponds to the data agent 2810 in FIG. 6, and the data agent may transfer/receive data for a write operation and/or a read operation between the controller 410 and the memories 420.

Figure 17:
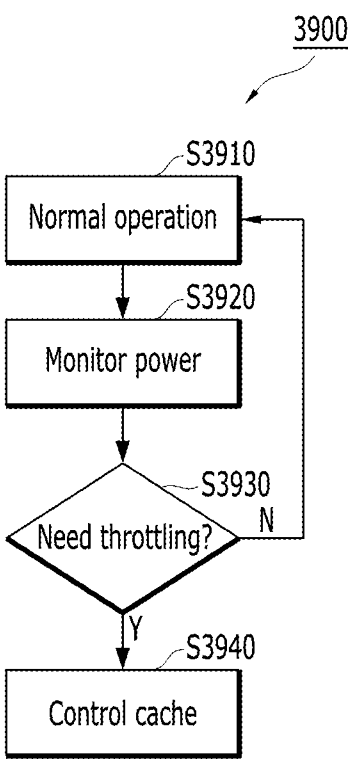
FIG. 17 is a flowchart briefly illustrating an operation of a memory blade in accordance with an embodiment of the present disclosure.

FIG. 17 is a flowchart briefly illustrating an operation 3900 of a memory blade in accordance with an embodiment of the present disclosure. The operation 3900 may be controlled by the data controller 510E illustrated in FIG. 16.

Referring to FIG. 17, the data controller 510E may perform a normal operation in step S3910 and monitor the power of a memory in step S3920. Herein, the normal operation may correspond to a case where the data controller 510E manages hot-page data in a cache region while the data controller 510E performs a write operation and a read operation onto the first memory group 420A, the second memory group 420B, and the third memory group 420C. The normal operation has been described above with reference to FIGS. 6 to 10B.

In various embodiments of the present disclosure, the power throttling agent 2860 of the data controller 510E may be able to monitor the power of each of the memories 420 by collecting power information of each of memories included in the first memory group 420A, the second memory group 420B, and the third memory group 420C at a predetermined frequency corresponding to a predetermined period.

In various embodiments of the present disclosure, the power throttling agent 2860 may monitor the power for the memories 420 by collecting data transaction information (e.g., an amount of write data that is processed) of each of the memories included in the first memory group 420A and the second memory group 420B. Also, the power throttling agent 2860 may monitor the power for the memories 420 by monitoring a peak current of each of the memories included in the first memory group 420A and the second memory group 420B. For example, the peak current of each of the memories 420 may be measured by a Power Management Integrated Circuit (PMIC). The power throttling agent 2860 may measure the peak current of each of the memories 420 or measure the peak currents of all the memories 420 by using the PMIC or a substitutable means therefor.

The power throttling agent 2860 may decide whether to perform a power throttling operation or not for a particular memory based on the collected power information in step S3930. When it is decided that a power throttling operation should be performed on the particular memory, the power throttling agent 2860 may perform the power throttling operation onto the particular memory.

In various embodiments of the present disclosure, the power throttling agent 2860 may perform an operation of controlling the use of a cache region for the particular memory whose power is to be throttled, by being interlocked with the cache agent 2820 in step S3940. For example, the power throttling agent 2860 may perform an operation of changing a cache region for the particular memory to be used as a write buffer for the particular memory, by being interlocked with the cache agent 2820.

In addition, the power throttling agent 2860 may perform an operation of controlling data transaction for the particular memory whose power is to be throttled. For example, the power throttling agent 2860 may be able to control the input/output interface 530 to decrease a data throughput, a transmission rate, or a bandwidth of the particular memory whose power is to be throttled.

When it is decided that the power of the particular memory should be throttled, the above-mentioned operations performed by the power throttling agent 2860 of the data controller 510E may be sequentially performed in an appropriate order or performed concurrently. For example, the power throttling agent 2860 may perform a power throttling operation in the order of controlling cache region usage ➔ controlling data transaction.

As described above, when it is decided that the power of the particular memory consuming high energy should be throttled, the data controller 510E may perform an operation of decreasing the average power of the particular memory by migrating and storing data for the particular memory that has a relatively high energy consumption (e.g., a PCRAM or a flash memory) into a predetermined cache region of a memory that has a relatively low energy consumption (e.g., a DRAM or an SRAM). Through the operation of migrating and storing data, the number of times that a transaction is performed on the particular memory, the number of times that the particular memory is used, or the number of times that the particular memory operates may be decreased, the operation frequency of the particular memory may be decreased, or a cycle of an operation command for operating the particular memory may be increased. As a result, the energy consumption of the particular memory may be decreased or minimized.

Figure 18:
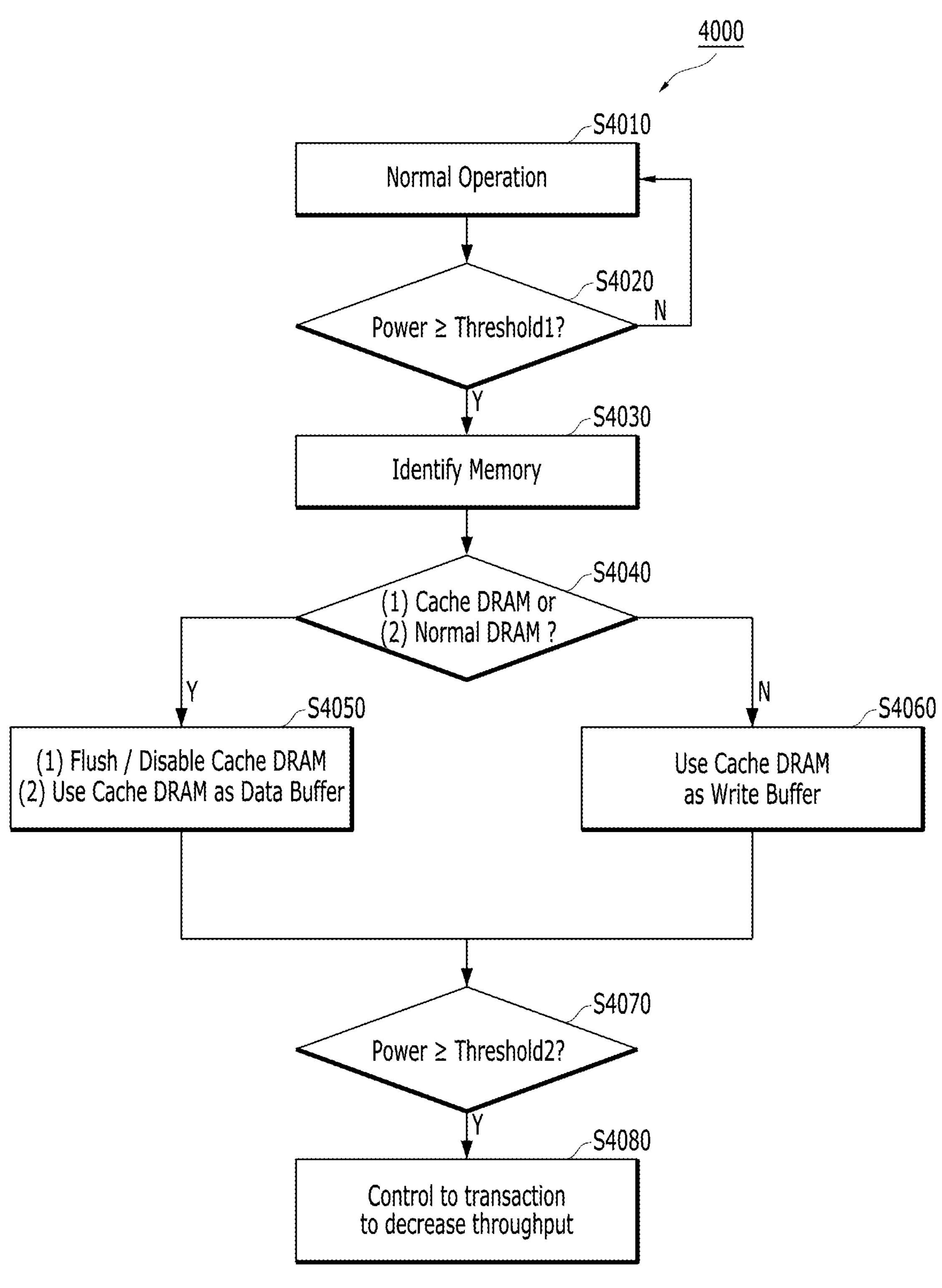
FIG. 18 is a flowchart illustrating an operation of a memory blade in detail in accordance with an embodiment of the present disclosure.

FIG. 18 is a flowchart illustrating an operation 4000 of a memory blade in detail in accordance with an embodiment of the present disclosure. The operation 4000 may be controlled by the data controller 510E illustrated in FIG. 16.

Referring to FIG. 18, the data controller 510E may perform a normal operation in step S4010. Herein, the normal operation may correspond to a case where the data controller 510E manages hot-page data in a cache region while the data controller 510E performs a write operation and a read operation onto the first memory group 420A, the second memory group 420B, and the third memory group 420C. The normal operation has been described above with reference to FIGS. 6 to 10B.

The power throttling agent 2860 of the data controller 510E may monitor the power of each of the memories 420 and determine whether the power of each of the memories 420 is equal to or higher than a first threshold value THRESHOLD1 in step S4020.

In various embodiments of the present disclosure, the power throttling agent 2860 of the data controller 510E may be able to monitor the power of each of the memories 420 by collecting power information of each of memories included in the first memory group 420A, the second memory group 420B, and the third memory group 420C at a predetermined frequency, which corresponds to a predetermined period.

In various embodiments of the present disclosure, the power throttling agent 2860 may monitor the power for each of the memories 420 by collecting data transaction information (e.g., an amount of write data that is processed) of each of the memories included in the first memory group 420A and the second memory group 420B. Alternatively, the power throttling agent 2860 may monitor the power for each of the memories 420 by monitoring a peak current of each of the memories included in the first memory group 420A and the second memory group 420B. The peak current of each of the memories 420 may be measured by a Power Management Integrated Circuit (PMIC).

The power throttling agent 2860 may measure the peak current of each of the memories 420 or measure the peak currents of all the memories 420 by using the PMIC or a substitutable means therefor.

When it is determined that the power for a particular memory is equal to or higher than the first threshold value THRESHOLD1, the energy consumption of the particular memory is so high that a power throttling operation for onto the particular memory should be performed. When it is determined that the power for the particular memory is equal to or higher than the first threshold value THRESHOLD1, the power throttling agent 2860 may detect identifier (ID) information of the particular memory in step S4030, and perform the power throttling operation by controlling the use of a cache region for the particular memory in steps S4040, S4050, and S4060.

The particular memory whose power is determined to be equal to or higher than the first threshold value THRESHOLD1 may be a cache DRAM designated as a cache region in the first memory group 420A, a normal DRAM that is not designated as a cache region in the first memory group 420A, a cache PCRAM designated as a cache region in the second memory group 420B, a normal PCRAM that is not designated as a cache region in the second memory group 420B, or a memory in the third memory group 420C, i.e., a flash memory.

For the sake of convenience in description, a case where the particular memory whose power is determined to be equal to or higher than the first threshold value THRESHOLD1 is a cache DRAM designated as a first cache region in the first memory group 420A, a case where the particular memory is a normal DRAM that is not designated as the first cache region in the first memory group 420A, and a case where the particular memory is a normal PCRAM that is not designated as a second cache region in the second memory group 420B are described herein to describe embodiments of the present disclosure. Specific examples of the operation performed by the thermal throttling agent 2850 for controlling the use of a cache region are similar to the operations that have been described above by referring to FIGS. 14A to 14E.

In the case where the particular memory whose power is determined to be equal to or higher than the first threshold value THRESHOLD1 is the cache DRAM designated as the first cache region in the first memory group 420A (case (1) of the step S4040 in FIG. 18), the power throttling agent 2860 may flush data stored in the cache DRAM by being interlocked with the cache agent 2820 and disable the use of the cache DRAM (case (1) of the step S4050 in FIG. 18) as the first cache region. In various embodiments of the present disclosure, the data stored in the cache DRAM may be flushed into a cache region, e.g., 2950 of FIG. 7B or 2955 of FIG. 7C in the second memory group 420B.

In the case where the particular memory is the normal DRAM in the first memory group 420A (case (2) of the step S4040 in FIG. 18), the power throttling agent 2860 may use the cache DRAM as a data buffer for the normal DRAM by being interlocked with the cache agent 2820 (case (2) of the step S4050 in FIG. 18).

In the case where the particular memory is the normal PCRAM in the second memory group 420B, the power throttling agent 2860 may use the cache DRAM as a write buffer for the normal PCRAM by being interlocked with the cache agent 2820 in step S4060.

Subsequently, the power throttling agent 2860 may determine whether the power of the particular memory whose cache usage has been controlled is equal to or higher than a second threshold value THRESHOLD2 in step S4070. When the power of the particular memory is equal to or higher than the second threshold value THRESHOLD2, the power throttling agent 2860 may perform an operation of controlling data transaction for the particular memory in step S4080. For example, the power throttling agent 2860 may be able to control the input/output interface 530 to decrease a data throughput, a transmission rate, or a bandwidth of the particular memory.

In various embodiments of the present disclosure, the power throttling agent 2860 may set reference values so that the first threshold value THRESHOLD1 is smaller than the second threshold value THRESHOLD2. This relationship is set in consideration of a case where a power throttling operation fails even though the power throttling agent 2860 controls the use of a cache region. For example, even when the cache region 2945 for a PCRAM illustrated in FIG. 7C is disabled in the operation of controlling the use of the cache region, the power of the DRAMs in the main memory 2910 may be increased as the access to the DRAMs is increased. In this case, the power throttling agent 2860 may perform a power throttling operation by controlling data transaction for the DRAMs in the main memory 2910 in step S4080.

Meanwhile, the embodiments of the present disclosure described above may be modified and used diversely. For example, the embodiments of the present disclosure described above illustrate the case where they are applied to a converged memory device including a first memory group having first characteristics, a second memory group having second characteristics, which are different from the first characteristics, and a third memory group memories having third characteristics, which are different from the first characteristics and the second characteristics.

Figure 19A:
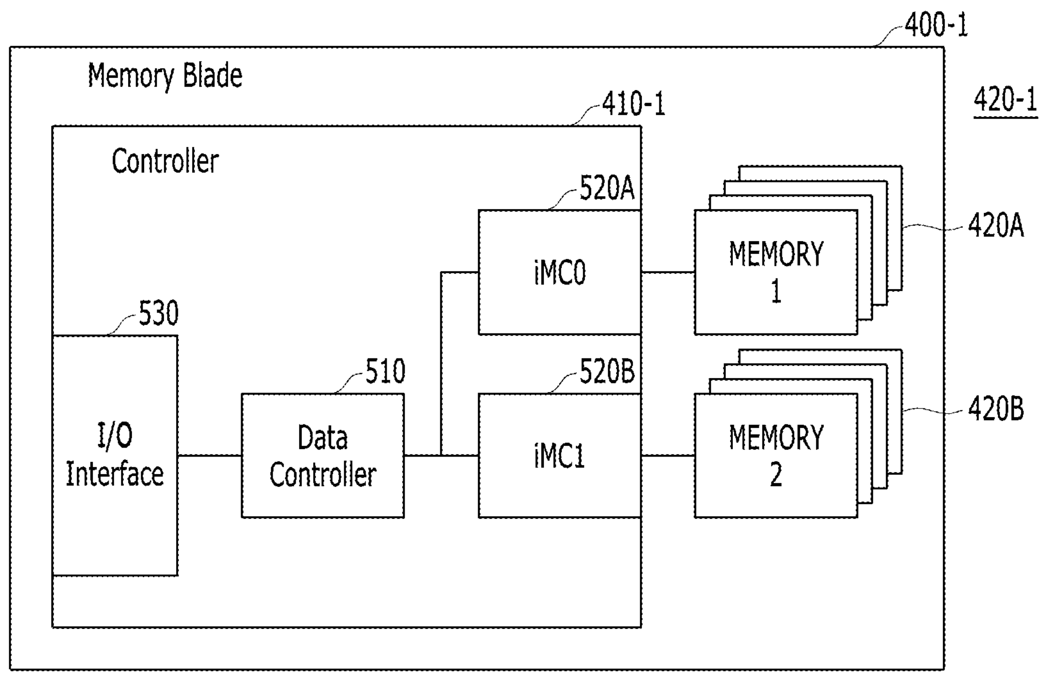
FIGS. 19A to 19F are block diagrams illustrating a memory blade in accordance with an embodiment of the present disclosure.

Modified embodiments of the present disclosure may be applied to a converged memory device as illustrated in FIGS. 19A to 19F. Referring to FIG. 19A, a converged memory device 400-1 may include a controller 410-1 and memories 420-1. The memories 420-1 may include a first memory group 420A having first characteristics, and a second memory group 420B having second characteristics, which are different from the first characteristics. The controller 410-1 may include a memory controller 520A for the first memory group 420A and a memory controller 520B for the second memory group 420B.

Figure 19B:
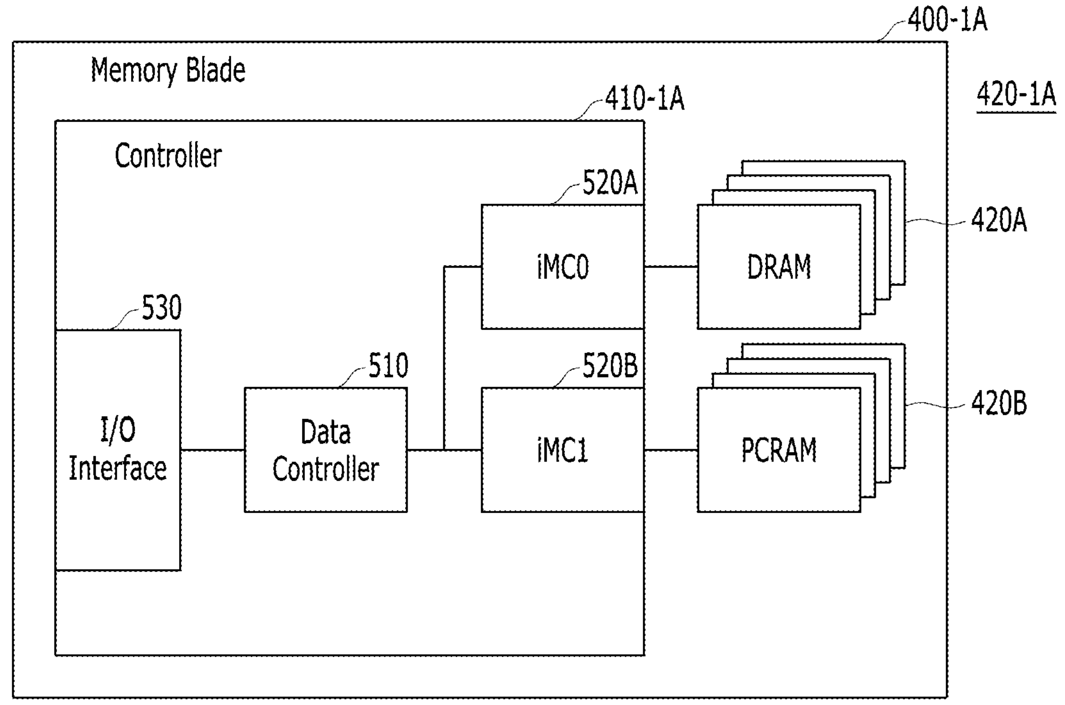

Referring to FIG. 19B, a converged memory device 400-1A may include a controller 410-1A and memories 420-1A. The memories 420-1A may include a first memory group 420A having first characteristics and a second memory group 420B having second characteristics, which are different from the first characteristics. The first memory group 420A may include DRAMs, and the second memory group 420B may include PCRAMs.

Figure 19C:
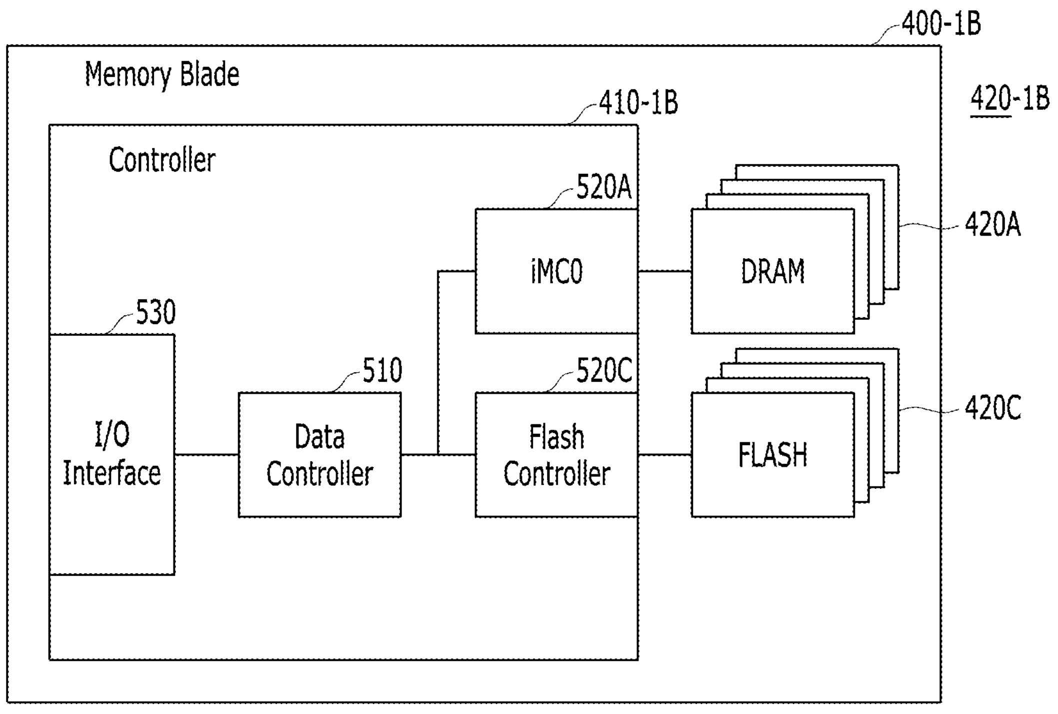

Referring to FIG. 19C, a converged memory device 400-1B may include a controller 410-1B and memories 420-1B. The memories 420-1B may include a first memory group 420A having first characteristics and a second memory group 420C having second characteristics, which are different from the first characteristics. The controller 410-1B may include a memory controller 520A for the first memory group 420A and a memory controller 520C for the second memory group 420C. The first memory group 420A may include DRAMs, and the second memory group 420C may include flash memories.

Figure 19D:
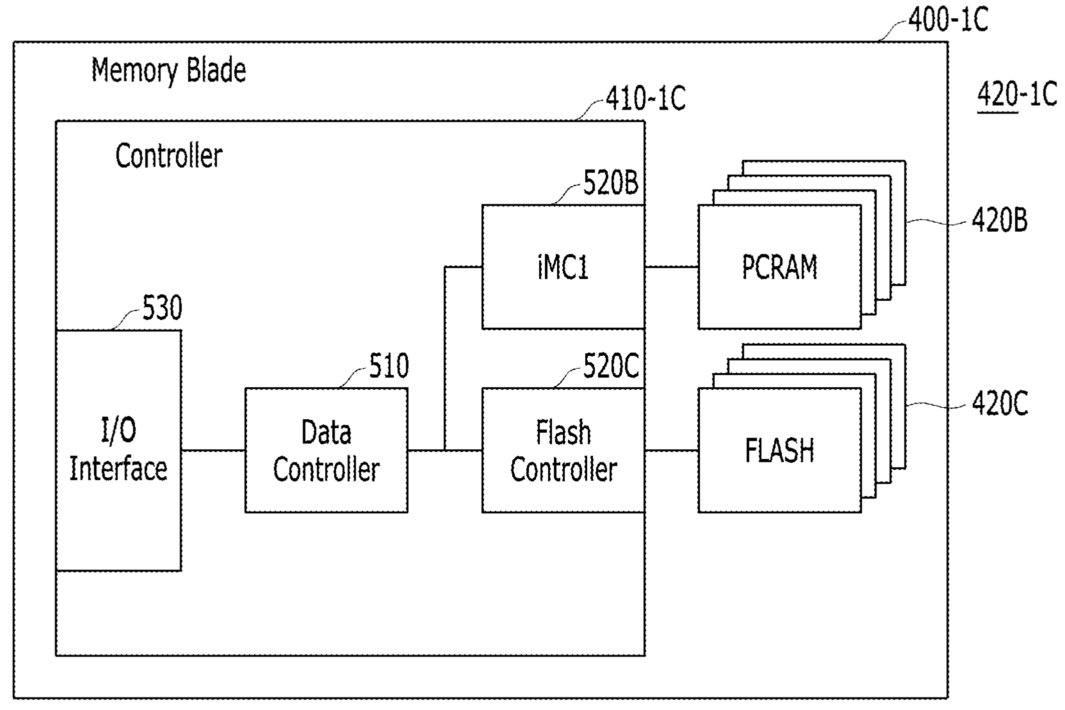
Figure 19E:
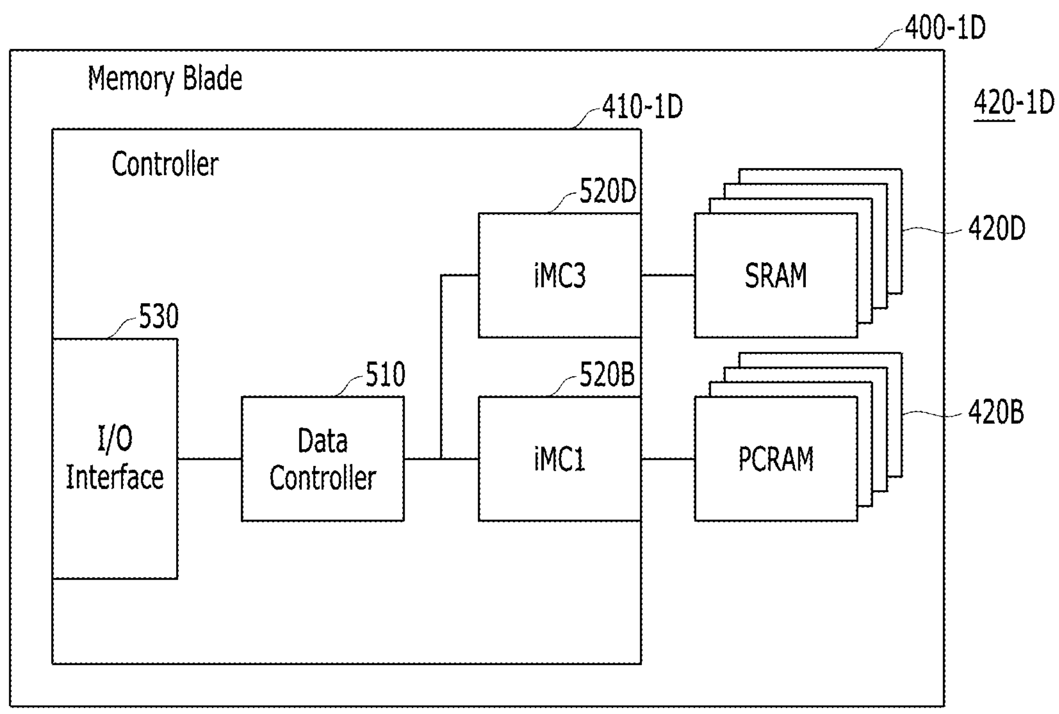

Referring to FIG. 19D, a converged memory device 400-1C may include a controller 410-1C and memories 420-1C. The memories 420-1C may include a first memory group 420B having first characteristics and a second memory group 420C having second characteristics, which are different from the first characteristics. The controller 410-1C may include a memory controller 520B for the first memory group 420B and a memory controller 520C for the second memory group 420C. The first memory group 420B may include PCRAMs, and the second memory group 420C may include flash memories Referring to FIG. 19E, a converged memory device 400-1D may include a controller 410-1D and memories 420-1D. The memories 420-1D may include a first memory group 420D having first characteristics and a second memory group 420B having second characteristics, which are different from the first characteristics. The controller 410-1D may include a memory controller 520D for the first memory group 420D and a memory controller 520B for the second memory group 420B. The first memory group 420D may include SRAMs, and the second memory group 420B may include PCRAMs.

Figure 19F:
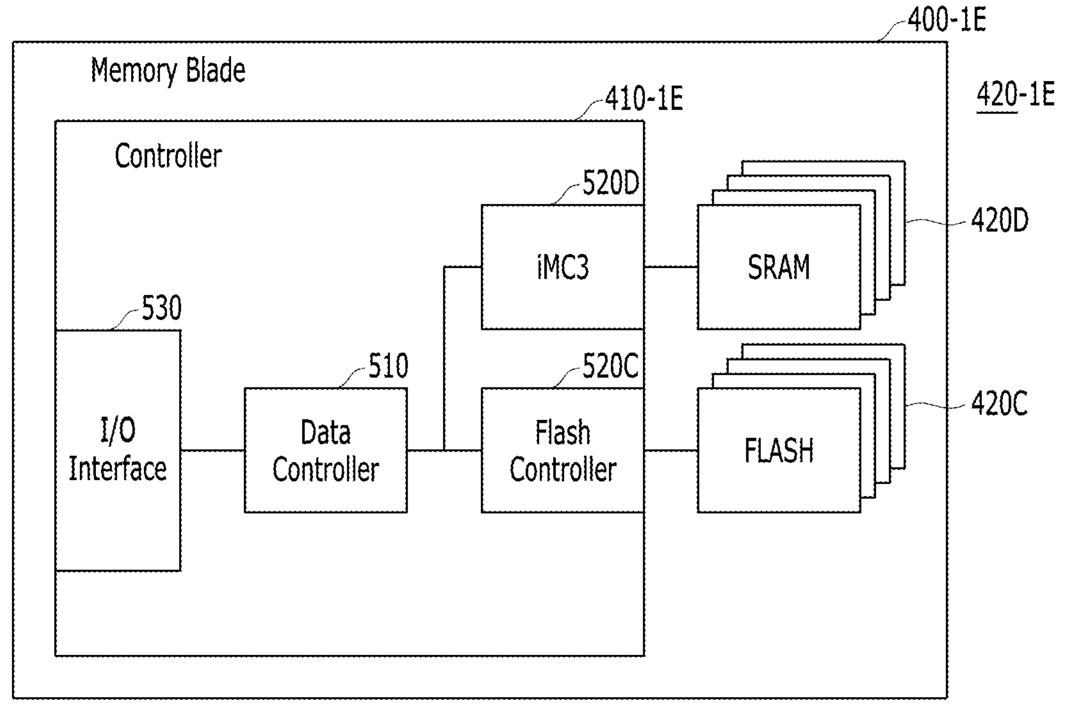

Referring to FIG. 19F, a converged memory device 400-1E may include a controller 410-1E and memories 420-1E. The memories 420-1E may include a first memory group 420D having first characteristics and a second memory group 420C having second characteristics, which are different from the first characteristics. The controller 410-1E may include a memory controller 520D for the first memory group 420D and a memory controller 520C for the second memory group 420C. The first memory group 420D may include SRAMs, and the second memory group 420C may include flash memories.

According to modified embodiments of the present disclosure, a controller may store predetermined data, e.g., hot data, for a second memory group in a predetermined cache region in a first memory group, and when an energy throttling operation is to be performed on particular memory in the second memory group, the controller may use the cache region in the first memory group as a buffer and store data for the particular memory in the cache region.

According to modified embodiments of the present disclosure, the energy throttling operation may include an operation of throttling at least one of temperature and power.

According to modified embodiments of the present disclosure, the controller may monitor a temperature of each of memories included in the first memory group and the second memory group using a thermal sensor included in each of the first memory group and the second memory group, and perform the energy throttling operation based on the temperature monitoring result.

According to modified embodiments of the present disclosure, when the temperature monitoring result reveals that a temperature of the cache region in the first memory group is equal to or higher than a threshold value, the controller may disable the use of the cache region.

According to modified embodiments of the present disclosure, when the temperature monitoring result reveals that a temperature of a normal memory in the first memory group is equal to or higher than the threshold value, the controller may use the cache region in the first memory group as a data buffer for the normal memory and store data stored in the normal memory in the cache region.

According to modified embodiments of the present disclosure, when the temperature monitoring result reveals that a temperature of a particular memory in the second memory group is equal to or higher than the threshold value, the controller may store write data for the particular memory in the second memory group in the cache region in the first memory group.

According to modified embodiments of the present disclosure, the controller may monitor the power of each of the memories included in the first memory group and the second memory group and perform the energy throttling operation based on the power monitoring result.

According to modified embodiments of the present disclosure, the controller may monitor the power of each of the memories included in the first memory group and the second memory group by monitoring at least one of data transaction and a peak current of each of the memories included in the first memory group and the second memory group.

According to modified embodiments of the present disclosure, when the power monitoring result reveals that the power of the cache region in the first memory group is equal to or higher than a threshold value, the controller may disable the use of the cache region.

According to modified embodiments of the present disclosure, when the power monitoring result reveals that the power of a normal memory in the first memory group is equal to or higher than the threshold value, the controller may use the cache region in the first memory group as a data buffer for the normal memory and store data stored in the normal memory in the cache region.

According to modified embodiments of the present disclosure, when the power monitoring result reveals that the power of a particular memory in the second memory group is equal to or higher than the threshold value, the controller may store write data for the particular memory in the cache region in the first memory group.

According to modified embodiments of the present disclosure, the cache region may include one physical memory that is selected from among memories in the first memory group.

According to modified embodiments of the present disclosure, the cache region may include a logical memory which is formed of particular corresponding regions of memories in the first memory group.

According to modified embodiments of the present disclosure, first characteristics and second characteristics of memories may include at least one of storage capacity and latency.

According to modified embodiments of the present disclosure, the first memory group and the second memory group may include DRAMs and PCRAMs, respectively.

According to modified embodiments of the present disclosure, the first memory group and the second memory group may include PCRAMs and flash memories, respectively.

According to modified embodiments of the present disclosure, when one memory requires an energy throttling operation, the controller may further perform an operation of controlling a data transaction in the memory.

According to embodiments of the present disclosure, the endurance and performance of a memory requiring or consuming a relatively high energy among a plurality of memories included in a memory blade of a data center or a data processing system may be improved by decreasing the number of times that the memory requiring or consuming the relatively high energy is used or operate. To this end, according to the embodiments of the present disclosure, some of memories or some corresponding regions of the memories, except the memory requiring or consuming the relatively high energy, may be used as a cache region for the memory. Also, overhead of data migration may be minimized by storing predetermined data (e.g., hot page) for the memory in the cache region. Also, according to embodiments of the present disclosure, the energy consumption of each of memories in a memory blade may be monitored and, if necessary, an energy throttling operation may be performed on each of the memories. For example, according to embodiments of the present disclosure, a temperature and/or power of each of the memories may be monitored and a throttling operation for throttling the temperature and/or power of each of the memories may be performed. According to the embodiments of the present disclosure, weak points in terms of temperature and power may be improved by variably using some of the memories or some corresponding regions of the memories, which are designated as a cache region, as a write buffer or a temporary data buffer during a throttling operation.

With reference to FIGS. 20 to 26, a memory system capable of preventing data corruption from memory attack will be described in more detail.

Figure 20:
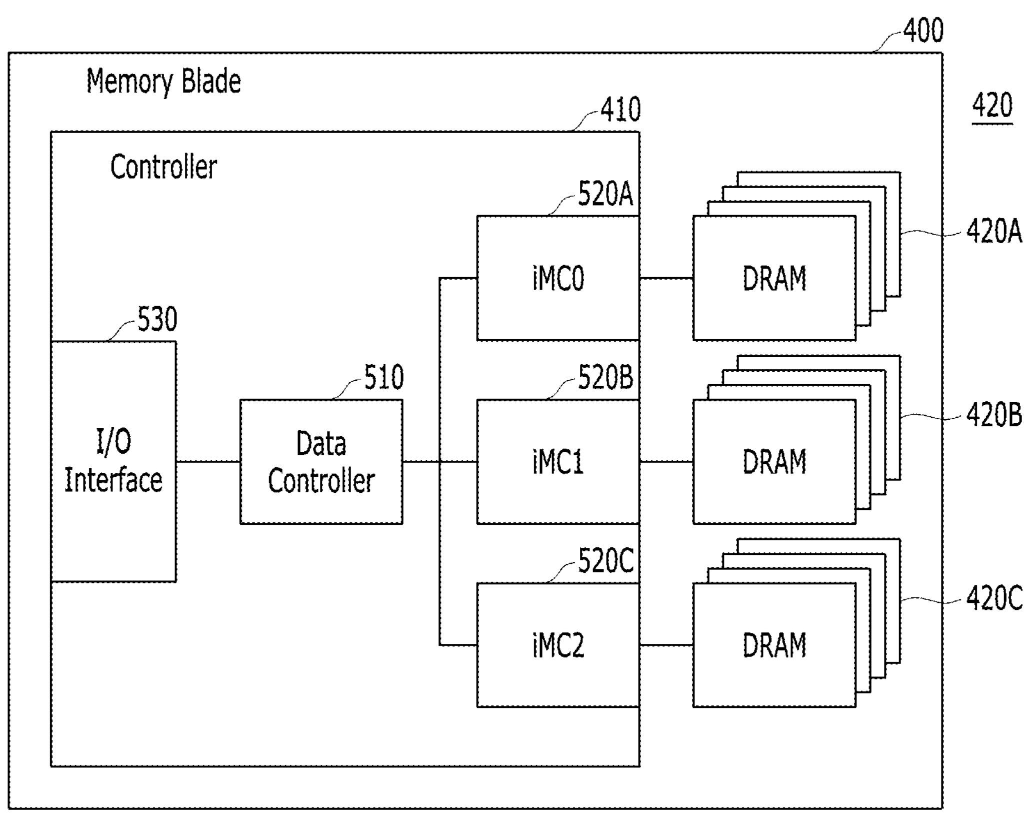
FIG. 20 is block diagrams illustrating memory blades in accordance with embodiments of the present disclosure.

FIG. 20 is block diagrams illustrating memory blades in accordance with embodiments of the present disclosure. The memory blade may correspond to the memory blades described with reference to FIG. 5A.

Referring to FIG. 20, the first memory group 420A, the second memory group 420B, and the third memory group 420C may include Dynamic Random Access Memories (DRAMs). Alternatively, the first memory group 420A, the second memory group 420B, and the third memory group 420C may include the same type of memories such as Static Random Access Memories (SRAMs) or flash memories. Also, the first memory group 420A, the second memory group 420B, and the third memory group 420C may include different types of memories.

Although an example where the controller 410 includes three memory controllers, i.e., the first memory controller (iMC0) 520A, the second memory controller (iMC1) 520B, and the third memory controller (iMC2) 520C, is described herein, when the first memory group 420A, the second memory group 420B, and the third memory group 420C include DRAMs as illustrated in FIG. 20, the controller 410 may include a single memory controller.

As described above, a data processing system or a server system may have a structure in which a plurality of blades, e.g., compute blades, memory or storage blades, are mounted in a unit rack so as to be distinguished from each other. At this time, one memory blade may correspond to a convergence memory device or pooled memory in which a plurality of memories of the same kind or different kinds are integrated depending on a characteristic requirement.

In such a memory blade, a 'memory attack' may occur when a storage region of a specific memory is continuously accessed, regardless of whether the continuous accesses are malicious accesses or not. For example, as a specific target row of a DRAM is repeatedly or continuously accessed, a memory attack such as 'row hammer' or 'rowhammer' may occur, in which a bit flip occurs in a victim row, which is adjacent to the accessed target row. When a memory attack occurs, data of the victim row, which is adjacent to the target row, may be distorted. As a result, the data distortion may increase a risk of data insecurity.

Embodiments of the present disclosure provide a method for protecting a specific memory, such as a DRAM, from a memory attack, such as row hammer, in a system including a convergence memory device. In accordance with various embodiments, when a memory attack occurs, a convergence memory device may postpone processing of an access request for accessing the target storage region, which is also called an 'attacked storage region,' thereby removing a risk of data distortion in a victim storage region that is adjacent to the target storage region. The present embodiments may be applied to a DRAM, but not limited thereto. For example, the present embodiments may also be applied to a phase change RAM (PCRAM) in which a memory attack may occur within a specific cycle (for example, a refresh cycle) as in a DRAM.

Figure 21:
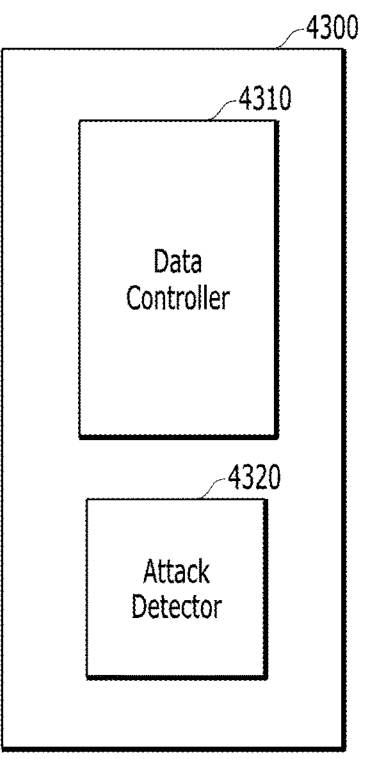
FIG. 21 illustrates a controller in accordance with an embodiment.

FIG. 21 illustrates a controller 4300 in accordance with an embodiment. For example, the controller 4300 may correspond to the controller 410 included in the memory blade 400 illustrated in any of FIGS. 5A and 5B.

Referring to FIG. 21, the controller 4300 may include a data controller 4310 and an attack detector 4320. When an access request for accessing a target storage region, which is included in at least one memory among a plurality of memories (for example, the memories 420 illustrated in any of FIGS. 5A and 20), is received, the attack detector 4320 may detect whether the access request has been received a preset number of times or more within a refresh cycle tREFI (for example, 7.8 μs).

When the access request has been received the preset number of times or more, the attack detector 4320 determines that the received access request corresponds to a memory attack, and the data controller 4310 may postpone processing the access request. On the other hand, when the access request has been received fewer than the preset number of times, the attack detector 4320 determines that the received access request does not correspond to the memory attack, and the data controller 4310 may process the access request without delay.

When the attack detector 4320 determines that the access request corresponds to the memory attack, the data controller 4310 may postpone processing of the access request for accessing the target storage region until the refresh cycle ends, and then process the access request after the refresh cycle ends. When the access request is processed after the refresh cycle ends, it may indicate that a refresh operation has been already performed on a victim storage region that is adjacent to the target storage region. Therefore, a risk of the memory attack can be removed from the victim storage region. In other words, as the processing of the access request for accessing the target storage region is delayed (or cached) during up to the refresh cycle, the next refresh time for the victim storage region can be guaranteed even after the access request for accessing the attacked target storage region has been received.

Figure 22:
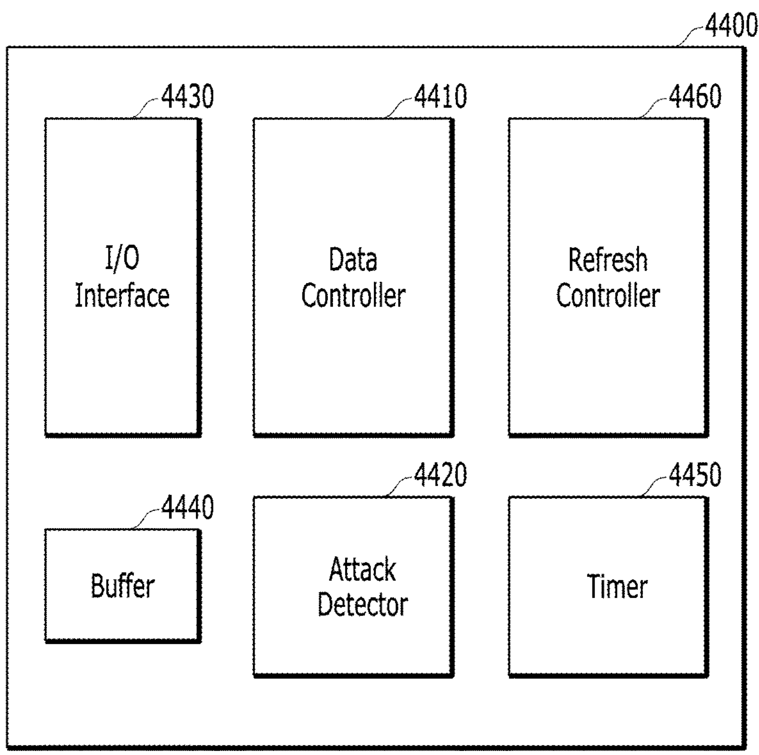
FIG. 22 illustrates a controller in accordance with an embodiment.

FIG. 22 illustrates a controller 4400 in accordance with an embodiment. For example, the controller 4400 may correspond to the controller 410 included in the memory blade 400 illustrated in any of FIGS. 5A and 20.

Referring to FIG. 22, the controller 4400 may include a data controller 4410, an attack detector 4420, an input/output (I/O) interface 4430, a buffer 4440, a timer 4450, and a refresh controller 4460.

The I/O interface 4430 may receive an access request from an external device. For example, the I/O interface 4430 may receive an access request for accessing at least one memory among a plurality of memories (for example, the memories 420 illustrated in any of FIGS. 5A and 20) from a host such as the compute blade 200 illustrated in FIG. 4.

When an access request for accessing a target storage region included in at least one memory among the plurality of memories (for example, the memories 420 illustrated in any of FIGS. 5A and 20) is received, the attack detector 4420 may detect whether the access request has been received a preset number of times or more within a refresh cycle tREFI (for example, 7.8 μs). In various embodiments, the attack detector 4420 may include a field programmable gate array (FPGA). The attack detector 4420 including the FPGA can be variably used to implement memories in various manners.

When the access request has been received the preset number of times or more, the data controller 4410 may postpone processing of the access request. On the other hand, when the access request has been received fewer than the preset number of times, the data controller 4410 may process the access request without delay.

The buffer 4440 may buffer (or cache) information associated with the target storage region corresponding to the access request that is to be processed by the data controller 4410. The timer 4450 may provide time information on whether the refresh cycle has elapsed and time information on the delayed access request, e.g., a time when the processing of the access request is postponed.

The refresh controller 4460 may receive a refresh command from the data controller 4410, and perform a refresh operation on a storage region of a corresponding memory in response to the refresh command. In various embodiments, the refresh controller 4460 may be included in the memory controllers 520A to 520C illustrated in any of FIGS. 5A and 20.

Specifically, when the attack detector 4420 determines that the access request has been received the preset number of times or more, the data controller 4410 may buffer the information associated with the target storage region corresponding to the access request into the buffer 4440. When the access request is a write request, the buffer 4440 may buffer the information associated with the target storage region, e.g., an address, a write command, and write data for the target storage region, and information on the delay of the access request. When the access request is a read request, the buffer 4440 may buffer the information associated with the target storage region, e.g., an address and a read command, and the information on the delay of the access request.

In response to the end of the refresh cycle, the data controller 4410 may generate a refresh command for at least one storage region that is adjacent to the target storage region or a refresh command for the target storage region.

The refresh controller 4460 may refresh the adjacent storage region or the target storage region in response to the refresh command.

After the refresh cycle ends, the data controller 4410 may read the information associated with the target storage region buffered in the buffer 4440, and process the delayed access request. For example, when the timer 4450 indicates the end of the refresh cycle, the data controller 4410 may flush the write data buffered in the buffer 4440 to the target storage region.

When the buffer 4440 is full of information and/or data even before the refresh cycle ends, the data controller 4410 may generate a refresh command for at least one storage region adjacent to the target storage region. The refresh controller 4460 may refresh the adjacent storage region in response to the refresh command.

When the attack detector 4420 determines that the received access request corresponds to a memory attack, the data controller 4410 may postpone processing of the received access request until the refresh cycle ends, and then process the received access request after the refresh cycle ends. When the received access request is processed after the refresh cycle ends, it may indicate that a refresh operation for the storage region adjacent to the target storage region has been already performed. Therefore, a risk of the memory attack can be removed.

Figure 23:
FIG. 23 illustrates a buffer in accordance with an embodiment.

FIG. 23 illustrates a buffer 4500 in accordance with an embodiment. For example, the buffer 4500 may correspond to the buffer 4440 illustrated in FIG. 22.

Referring to FIG. 8, the buffer 4500 may include a CMD region, an ADDR region, a VALID region, a DELAYED region, and a Time region. The CMD region is a region for storing a command corresponding to an access request. The CMD region may be used to store a write command W corresponding to a write request or a read command R corresponding to a read request for at least one memory among the memories 420 of any of FIGS. 5A and 20. The ADDR region is a region for storing an address (for example, 111, 222, 333, or 444) for accessing a target storage region of a memory corresponding to the access request. For example, when the memory corresponding to the access request is a DRAM, the ADDR region may be used to store an address for accessing a row region of the memory.

The VALID region is a region for storing information on whether data was flushed to the target storage region of the memory according to the access request. For example, "1" in the VALID region may indicate that information stored in the buffer 4500 is valid because data in the buffer 4500 was not flushed, and "0" in the VALID region may indicate that the information stored in the buffer 4500 is invalid because the data in the buffer 4500 was flushed. The DELAYED region is a region for storing information on whether the processing of the access request was delayed. The Time region is a region for storing information on a time when the processing of the access request is postponed.

For example, when a write request for an address "333" of a target storage region of a memory is received, the data controller 4410 of FIG. 22 may control the attack detector 4420 to determine that the address "333" corresponding to the received write request indicates an attacked target storage region. When it is determined that the address "333" indicates the attacked target storage region, the data controller 4410 may store the address "333" in the ADDR region and store a write command "W" for the target storage region in the CMD region. The data controller 4410 may delay processing of the write request, and store information indicating the delayed write request in the DELAYED region and store information on the delay time in the Time region. Although not illustrated in FIG. 23, the buffer 4500 may store write data corresponding to the delayed write request.

When the refresh cycle ends, the data controller 4410 may flush data for the delayed access request to the target storage region of the memory, and update the buffer 4500. For example, when the refresh cycle ends, the data controller 4410 may flush data corresponding to a write request for an address "444" to a storage region corresponding to the address "444," and update a corresponding VALID region of the buffer 4500 to "0." As such, a list of attacked target storage regions, stored in the buffer 4500, may be maintained during a refresh cycle, and adjacent victim storage regions that are adjacent to the attacked storage regions may be refreshed during the refresh cycle.

Figure 24:
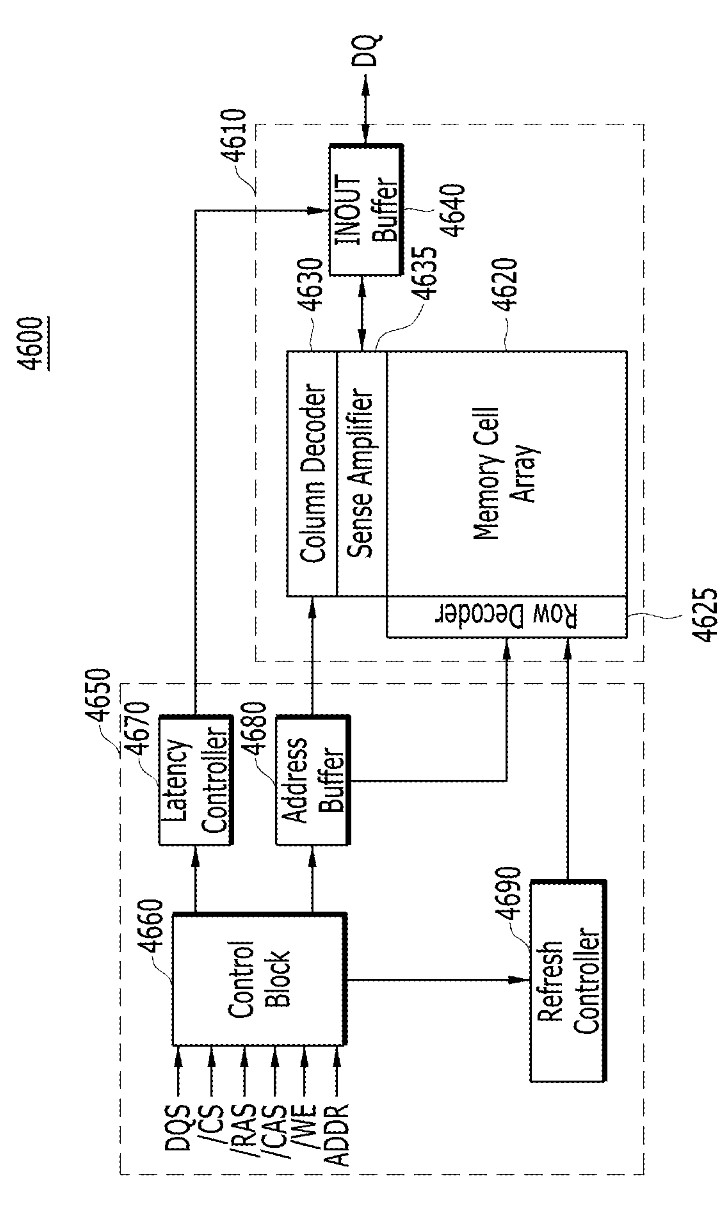
FIG. 24 illustrates a memory blade in accordance with an embodiment.

FIG. 24 illustrates a memory blade 4600 in accordance with an embodiment.

Referring to FIG. 24, the memory blade 4600 may include a memory 4610 and a controller 4650. FIG. 24 illustrates that the memory 4610 is a DRAM. However, an operation in accordance with the present embodiment can also be applied to a PCRAM. The PCRAM may be analogous to the DRAM, because a memory attack may also occur in the PCRAM, and a refresh operation can also be performed on the PCRAM.

The memory 4610 may include a memory cell array 4620, a row decoder 4625, a column decoder 4630, a sense amplifier 4635, and an INOUT buffer 4640.

The memory cell array 4620 may include a plurality of memory cells arranged at respective intersection regions between a plurality of word lines and a plurality of bit lines. The row decoder 4625 may provide a row address to access the memory cell array 4620, and may select one or more of the plurality of word lines included in the memory cell array 4620 using the row address. The column decoder 4630 may provide a column address to access the memory cell array 4620, and select one or more of the plurality of bit line pairs included in the memory cell array 4620 using the column address.

Each of the memory cells may be selected by a corresponding word line, and data of the selected memory cell may be transmitted to the sense amplifier 4635 through a corresponding bit line. The sense amplifier 4635 may sense data of memory cells corresponding to a row selected from the memory cell array 4620, amplify the sensed data through the corresponding bit lines, and output the amplified data to the INOUT buffer 4640. The sense amplifier 4635 may write data received from the INOUT buffer 4640 in memory cells corresponding to a selected row in the memory cell array 4620. The INOUT buffer 4640 may receive write data, in the form of a so-called DQ signal, from an external device through a data pad DQ, and output read data transmitted from the memory cell array 4620 to the external device through the data pad DQ. The INOUT buffer 4640 may be coupled to the external device, e.g., the memory controllers 520A to 520C illustrated in any of FIGS. 5A and 20, through the data pad DQ.

The controller 4650 may include a control block 4660, a latency controller 4670, an address buffer 4680, and a refresh controller 4690. The controller 4650, the control block 4660, and the refresh controller 4690 may correspond to the controller 4400, the data controller 4410, and the refresh controller 4460, respectively, which are illustrated in FIG. 22. In various embodiments, the latency controller 4670, the address buffer 4680, and the refresh controller 4690 may be included in the memory controllers 520A to 520C illustrated in any of FIGS. 5A and 20.

The control block 4660 may control the latency controller 4670, the address buffer 4680, and the refresh controller 4690. The control block 4660 may receive various signals ADDR, /WE, /CAS, /RAS, /CS, DQ, and DQS from a host, such as the compute blade 200 illustrated in FIG. 4. The signal ADDR may indicate an address signal, which includes a row address and a column address for accessing the memory cell array 4620. The signal/WE may indicate a signal for enabling a write operation on the memory cell array 4620. The control signal/CAS may indicate a column address strobe signal. The control signal/RAS may indicate a row address strobe signal. The control signal/CS may indicate a signal for selecting the memory 4610. The signal DQ (Data Queue) may indicate a data containing signal. The signal DQS may indicate a signal for strobing the signal DQ.

The control block 4660 may adjust, using the latency controller 4670, so-called AC parameters to perform an operation on the memory 4610 according to a timing defined in particular specifications, e.g., specifications that have been determined by the joint electron device engineering council (JEDEC). For example, the AC parameters may include a RAS-to-CAS delay time (tRCD) and a write recovery time (tWR). The latency controller 4670 may receive CAS latency from the control block 4660. The latency controller 4670 may transmit read latency to the INOUT buffer 4640, such that the INOUT buffer 4640 outputs data at an appropriate point of time. The INOUT buffer 4640 may transmit the data to the memory cell array 4620 through the sense amplifier 4635 while the read latency is enabled. That is, the latency controller 4670 may control the INOUT buffer 4640 to adjust the tRCD or tWR for the memory 4610. The latency controller 4670 may control the INOUT buffer 4640 to adjust a setup and hold time margin of the DQ or DQS signal.

The refresh controller 4690 may control a refresh operation on the memory 4610. The refresh controller 4690 may perform a refresh operation on a corresponding storage region in response to a refresh command provided from the control block 4660. In various embodiments, when a refresh cycle ends, the refresh controller 4690 may perform a refresh operation on a target storage region of the memory cell array 4620 that corresponds to a delayed access request, or a storage region that is adjacent to the target storage region, in response to the refresh command provided from the control block 4660. Furthermore, although a refresh cycle has not ended, the refresh controller 4690 may perform a refresh operation on the target storage region of the memory cell array 4620 in response to the refresh command provided from the control block 4660.

Figure 25:
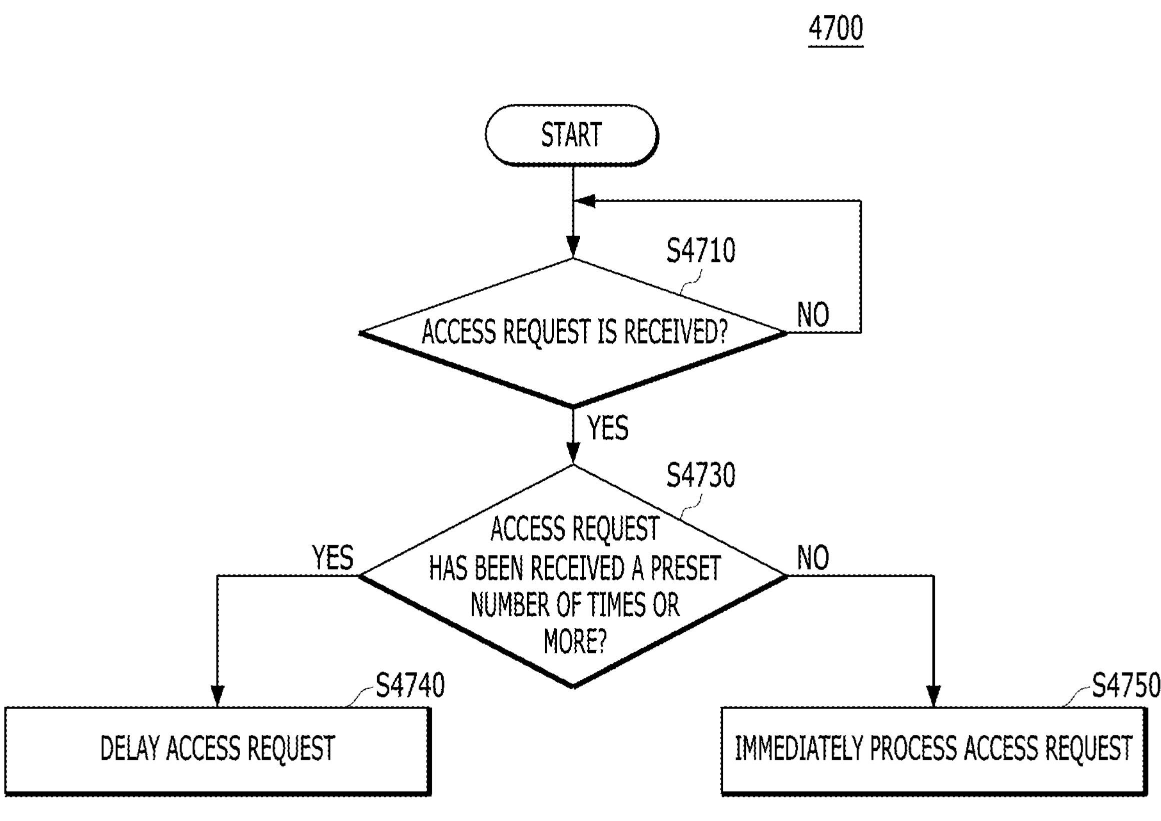
FIG. 25 illustrates an operation of processing an access request in accordance with an embodiment.

FIG. 25 illustrates an operation 4700 of processing an access request for a memory blade in accordance with an embodiment. The operation 4700 illustrated in FIG. 25 may be performed by the controller 4400 illustrated in FIG. 22.

Referring to FIG. 25, the controller 4400 may determine whether an access request for accessing a target storage region, which is included in at least one memory among a plurality of memories (for example, the memories 420 of any of FIGS. 5A and 20), is received through the I/O interface 4430, at step S4710.

When it is determined that the access request is received, the controller 4400 may control the attack detector 4420 to determine whether the access request has been received a preset number of times or more within a refresh cycle, at step S4730.

When it is determined that the access request has been received the preset number of times or more, the controller 4400 may delay the processing of the received access request at step S4740. On the other hand, when the access request has been received fewer than the preset number of times, the data controller 4310 may process the received access request without delay at step S4750.

Figure 26:
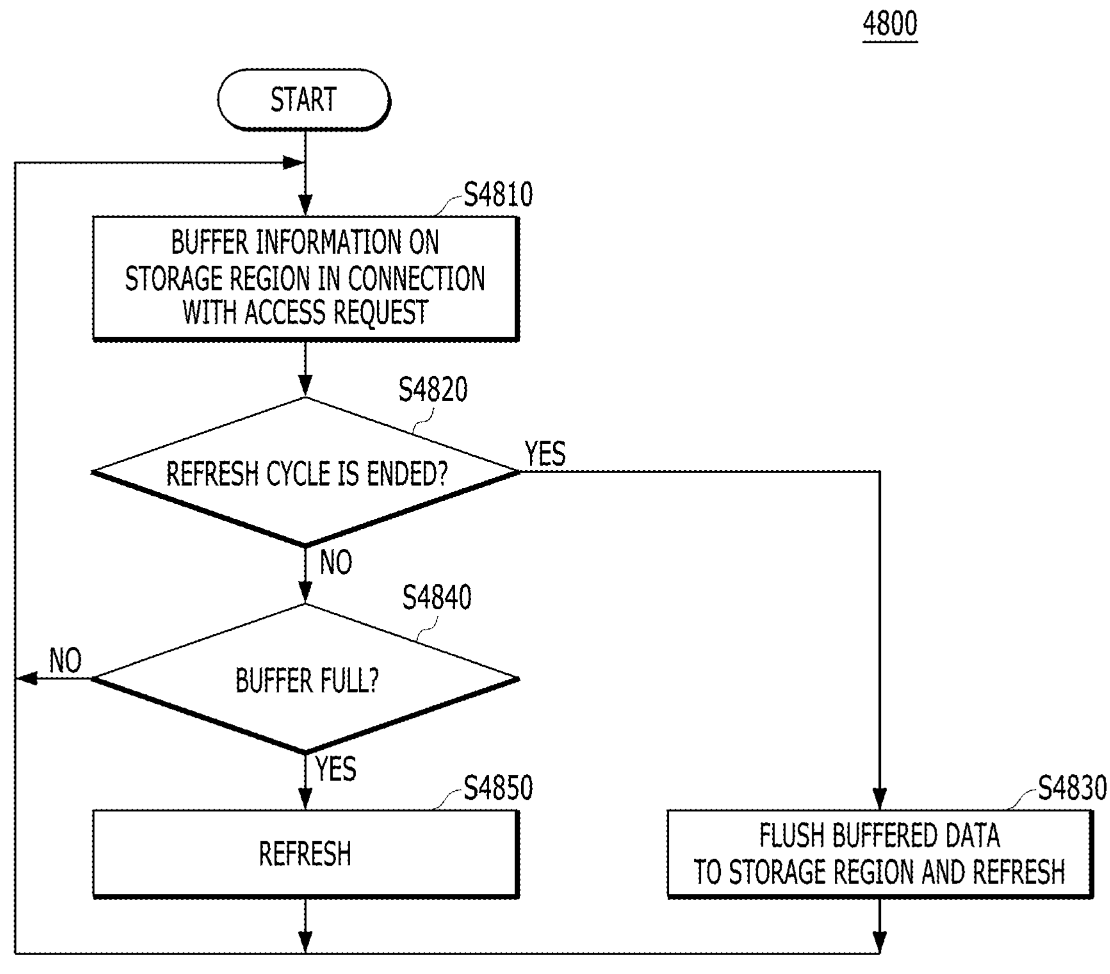
FIG. 26 illustrates a delay operation for an access request by a memory blade in accordance with an embodiment.

FIG. 26 illustrates a delay operation 4800 for an access request that is performed by a memory blade in accordance with an embodiment. The delay operation 4800 illustrated in FIG. 26 may be performed by the controller 4400 illustrated in FIG. 22, which is included in a memory blade. The delay operation 4800 may be performed when an access request for accessing a target storage region included in a memory among a plurality of memories in the memory blade has been received by the memory blade a preset number of times or more within a refresh cycle.

Referring to FIG. 26, the data controller 4410 of the controller 4400 may buffer information on the target storage region into the buffer 4440, at step S4810. For example, when the access request is a write request, the data controller 4410 may buffer an address, a write command, and write data for the target storage region into the buffer 4440, and may buffer information on whether processing of the access request is delayed or not into the buffer 4440. For another example, when the access request is a read request, the data controller 4410 may buffer an address and a read command for the target storage region into the buffer 4440, and may buffer information on whether processing of the access request is delayed or not into the buffer 4440.

When it is determined that the refresh cycle has ended (YES at step S4820), the data controller 4410 may flush the write data buffered in the buffer 4440 to the target storage region at step S4830. Furthermore, the data controller 4410 may generate a refresh command for the target storage region or a refresh command for another storage region that is adjacent to the target storage region. In response to the refresh command, the refresh controller 4460 may perform a refresh operation on the target storage region or the adjacent storage region. When such a refresh operation is performed, the data controller 4410 may remove the information on the target storage region from the buffer 4440.

Even if it is determined that the refresh cycle has not ended (NO at step S4820) or if it is determined that the buffer 4440 is full of information and/or data (YES at step S4840), the data controller 4410 may generate a refresh command for at least one storage region that is adjacent to the target storage region of the memory. In response to the refresh command, the refresh controller 4460 may perform a refresh operation on the adjacent storage region at step S4850.

As described above, the present embodiments can delay processing of an access request for accessing a target storage region when a memory attack, such as row hammer, occurs in a specific memory included in a convergence memory device, such as a memory blade, thereby removing a risk of data distortion in a victim storage region that is adjacent to the target storage region.

With reference to FIGS. 27 to 37, a memory system capable of improving performance of the memory system by utilizing memories in various temperature environment will be described in more detail.

Figure 27:
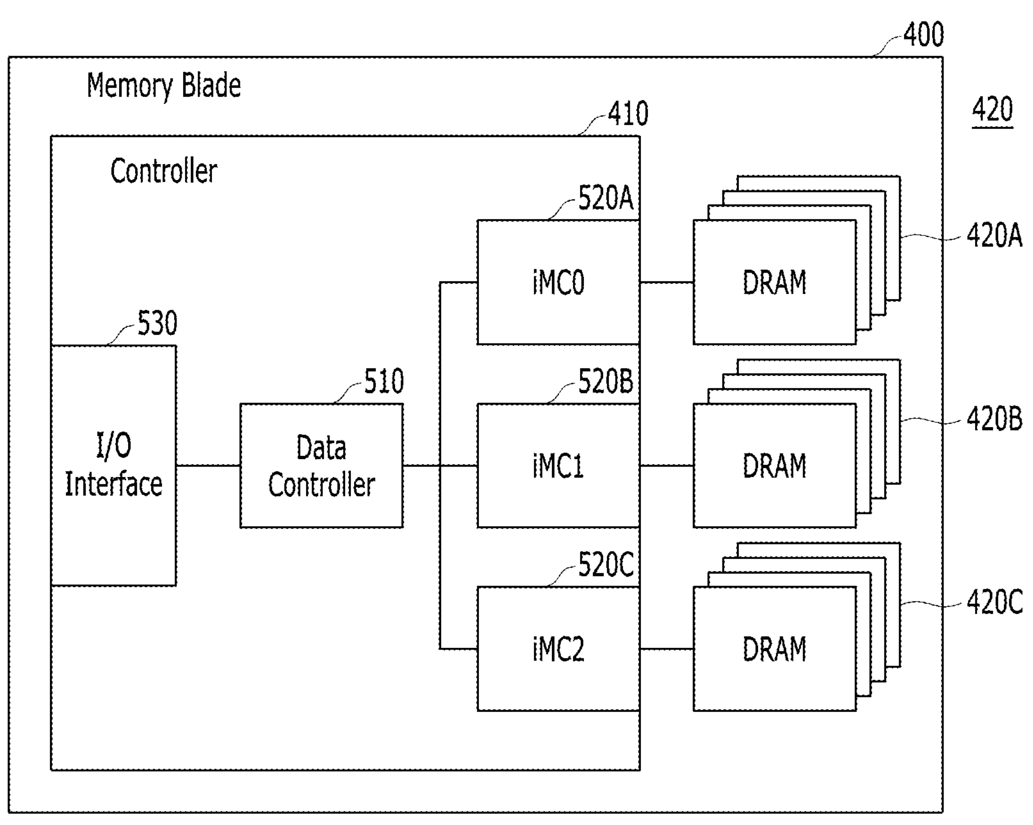
FIG. 27 is block diagrams illustrating memory blades in accordance with embodiments of the present disclosure.

FIG. 27 is block diagrams illustrating memory blade 2700 in accordance with embodiments of the present disclosure. The memory blade 2700 may correspond to the memory blade 400 described with reference to FIG. 5A.

Referring to FIG. 27, the first memory group 420A, the second memory group 420B, and the third memory group 420C may include Dynamic Random Access Memories (DRAMs). Alternatively, the first memory group 420A, the second memory group 420B, and the third memory group 420C may include the same type of memories such as Static Random Access Memories (SRAMs) or flash memories. Also, the first memory group 420A, the second memory group 420B, and the third memory group 420C may include different types of memories.

As described above, a data processing system or a server system may have a structure in which a plurality of blades, e.g., compute blades and memory or storage blades, are discriminatively installed in a unit rack. Herein, one or more memory blades may be a converged memory device or a pooled memory in which memories of the same kind or different kinds are converged. For example, a memory blade may include a plurality of DRAMs of the same type, as illustrated in FIG. 27. If the memories have the same type, the memories have the same characteristics. Therefore, the converged memory device may provide single performance or characteristic with respect to a request from the host, despite including a plurality of memories.

The following embodiments of the present disclosure provide a method by which a converged memory device including the same or different types of memories may provide various performances or characteristics. If it is possible to implement a converged memory device having various characteristics according to the usage environment, regardless of whether the same type or different types of memories are used in the converged memory device, a system including the converged memory device may provide various performances or characteristics by appropriately selecting and using the memories.

According to various embodiments of the present disclosure, the same type or kind of memories included in a converged memory device may have various performances or characteristics depending on various temperature environments. For example, when operating in a low temperature environment or a cryogenic environment, an operation rate of a volatile memory, such as a DRAM, may be accelerated, and as an on-chip leakage rapidly decreases, a refresh period of the volatile memory may be increased. The on-chip leakage represents an amount of leakage of stored information. The volatile memory in a low temperature environment may show similar characteristics to characteristics of a nonvolatile memory. For another example, when operating in a high temperature environment (e.g., a room temperature environment), the operation rate of the volatile memory may be slow, and power consumption of the volatile memory may increase as the on-chip leakage increases. Therefore, if memories such as DRAMs are used in various temperature environments, it will be possible to implement memories having various performances or characteristics. If memories operating in an appropriate environment are selected and used among the memories in the converged memory device, it is possible to provide performance that satisfies various application demands.

For example, when a memory operating in a low temperature environment is selected, not only a quick response to requests of relatively high priority, such as requests requiring urgent processing, but also low power consumption may be accomplished. However, generating the low temperature environment using a cooling system is costly, since the cooling system is costly. Therefore, considering the performance that may be provided by a system, only an appropriate number of memories may operate in a low temperature environment, and most of memories may operate in a normal temperature environment. The number of memories that operate in each of temperature environments may be determined appropriately according to how the system is designed.

Figure 28A:
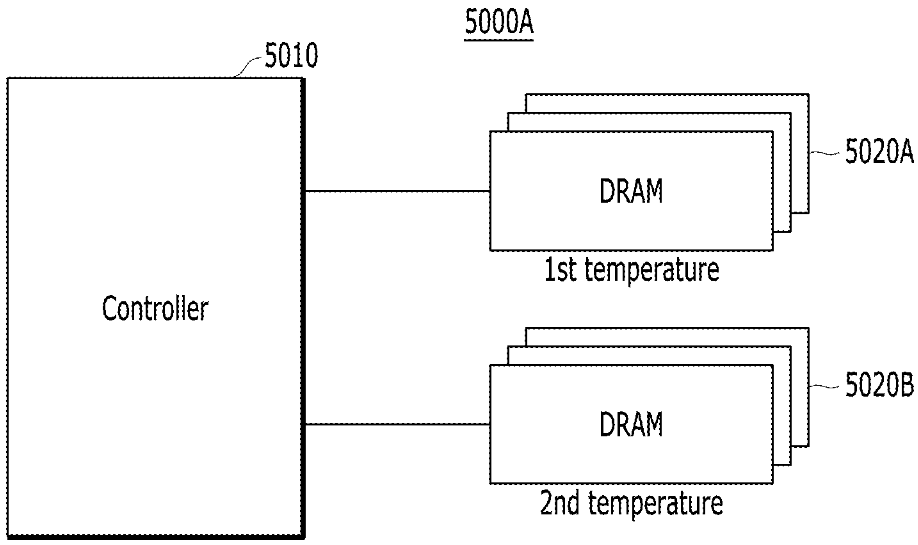
FIGS. 28A and 28B are block diagrams illustrating memory blades in accordance with embodiments of the present disclosure.
Figure 28B:
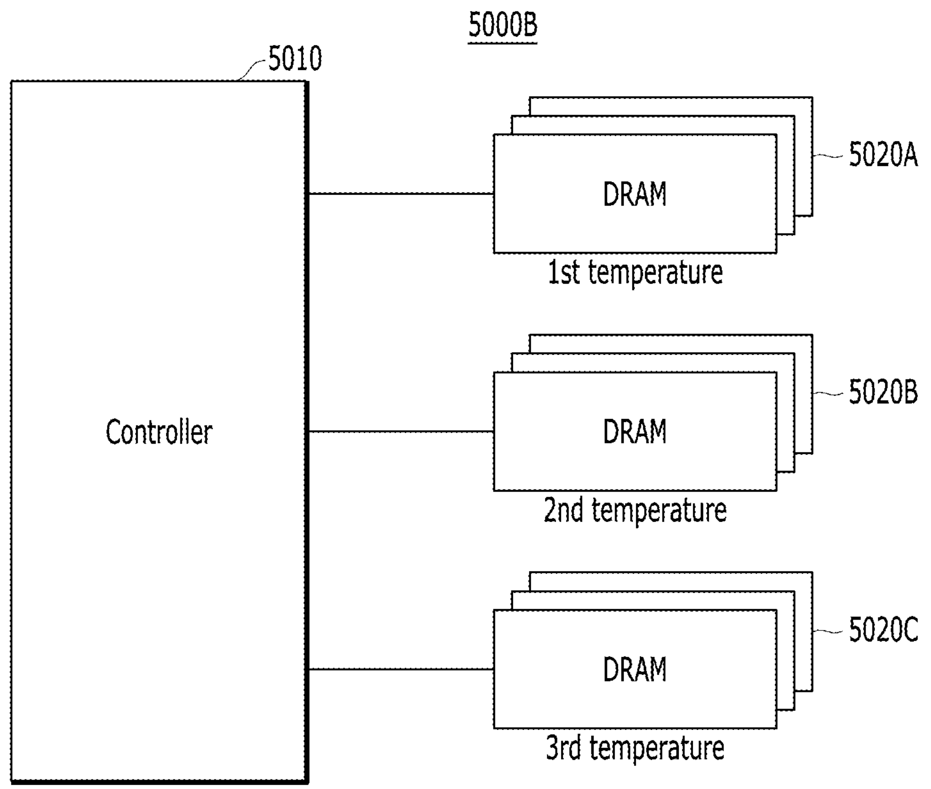

FIGS. 28A and 28B are block diagrams illustrating memory blades in accordance with embodiments of the present disclosure.

Referring to FIG. 28A, a converged memory device 5000A may include a controller 5010 and a plurality of memories 5020A and 5020B. Hereinafter, for the sake of convenience in description, it may be assumed that each of the memories 5020A and 5020B is a single memory. However, embodiments are not limited thereto. In another embodiment, each of the first, second, and third memories 5020A, 5020B, and 5020C may include a plurality of memories.

The first memory 5020A may be in an environment having a first temperature, and the second memory 5020B may be in an environment having a second temperature.

In various embodiments of the present disclosure, the first and second memories 5020A and 5020B may be the same kind of DRAM, and the second temperature may be lower than the first temperature.

In an embodiment of the present disclosure, the first temperature may be a room temperature and the second temperature may be a lower temperature than the room temperature. For example, the first temperature is approximately 25° C., and the second temperature is approximately −40° C.

In another embodiment of the present disclosure, the first temperature may include the room temperature and the second temperature may include an extremely low temperature or a cryogenic temperature. For example, the first temperature is approximately 25° C., and the second temperature is approximately −197° C. (or 77 Kelvin).

In still another embodiment of the present disclosure, the first temperature may be a lower temperature than the room temperature, and the second temperature may be extremely low or cryogenic temperature. For example, the first temperature is approximately −40° C., and the second temperature is approximately −197° C.

In various embodiments of the present disclosure, the first memory 5020A may have first characteristics in the environment having the first temperature, and the second memory 5020B may have second characteristics that are superior to the first characteristics in the environment having the second temperature. Each of the first characteristics and the second characteristics may include one or more of a data access rate, a refresh period, and an on-chip leakage.

The controller 5010 may selectively access the first memory 5020A or the second memory 5020B in response to a request. Herein, the request may be a request from one of the compute blades 200 shown in FIG. 3, or a request from a single host (not shown).

In various embodiments of the present disclosure, the request may be a request of a first priority or a request of a second priority, which is lower than the first priority. If the request is the request of the first priority, the controller 5010 may access the second memory 5020B. The controller 5010 may access the first memory 5020A if the request is the request of the second priority.

In various embodiments of the present disclosure, the controller 5010 may use the second memory 5020B as a cache for the first memory 5020A. If an address for the request is a cache hit, the controller 5010 may access the second memory 5020B. If the address for the request is a cache miss, the controller 5010 may access the first memory 5020A.

Referring to FIG. 28B, a converged memory device 5000B may include a controller 5010 and a plurality of memories 5020A, 5020B, and 5020C. Hereinafter, for the sake of convenience in description, it may be assumed that each of the first, second, and third memories 5020A, 5020B, and 5020C is a single memory. However, embodiments are not limited thereto. In another embodiment, each of the first, second, and third memories 5020A, 5020B, and 5020C may include a plurality of memories.

The first memory 5020A may be in an environment having a first temperature, the second memory 5020B may be in an environment having a second temperature, and the third memory 5020C may be in an environment having a third temperature.

In various embodiments of the present disclosure, the memories 5020A, 5020B, and 5020C may each be the same kind of DRAM. The second temperature may be lower than the first temperature, and the third temperature may be lower than the second temperature.

In an embodiment of the present disclosure, the first temperature may be a room temperature, and the second temperature may be a lower temperature than the room temperature, and the third temperature may be an extremely low temperature or a cryogenic temperature. For example, the first temperature is approximately 25° C., and the second temperature is approximately −40° C., and the third temperature is approximately −197° C. (or 77 Kelvin).

In various embodiments of the present disclosure, the first memory 5020A may have first characteristics in the environment having the first temperature, and the second memory 5020B may have second characteristics that are superior to the first characteristics in the environment having the second temperature, and the third memory 5020C may have third characteristics that are superior to the second characteristics in the environment having the third temperature. Each of the first characteristics, the second characteristics, and the third characteristics may include one or more of a data access rate, a refresh period, and an on-chip leakage.

The controller 5010 may selectively access one memory among the first memory 5020A, the second memory 5020B, and the third memory 5020C in response to a request. Herein, the request may be a request from one of the compute blades 200 shown in FIG. 3, or a request from a single host (not shown).

In various embodiments of the present disclosure, the request may be a request of a first priority, a request of a second priority, which is lower than the first priority, or a request of a third priority, which is lower than the second priority. If the request is the request of the first priority, the controller 5010 may access the third memory 5020C. If the request is the request of the second priority, the controller 5010 may access the second memory 5020B. The controller 5010 may access the first memory 5020A if the request is the request of the third priority.

In various embodiments of the present disclosure, the controller 5010 may use the second memory 5020B and the third memory 5020C as caches for the first memory 5020A. The third memory 5020C may be used as a main cache for the first memory 5020A, and the second memory 5020B may be used as a sub-cache for the first memory 5020A. When there is no free space for storing cache data in a storing space of the third memory 5020C, the second memory 5020B may be used as a sub-cache for the first memory 5020A. If an address for the request is a cache hit, the controller 5010 may access the second memory 5020B or the third memory 5020C. If the address for the request is a cache miss, the controller 5010 may access the first memory 5020A.

Figure 29A:
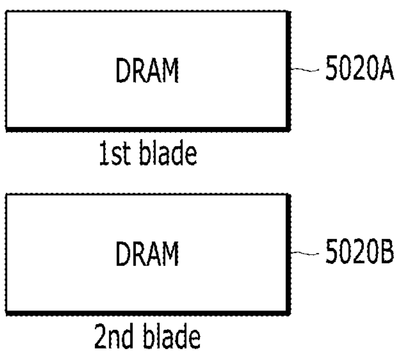
FIGS. 29A to 29C illustrate how memories are mounted in accordance with embodiments of the present disclosure.
Figure 29B:
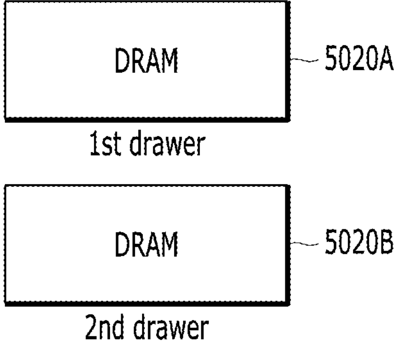
Figure 29C:
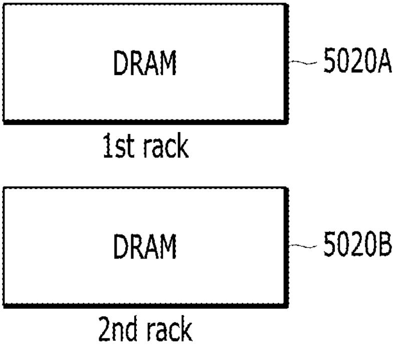

FIGS. 29A to 29C exemplarily illustrate how memories are mounted in accordance with an embodiment of the present disclosure.

Referring to FIG. 29A, the first memory 5020A and the second memory 5020B may be mounted on different blades. The first memory 5020A may be mounted on a first blade in a first temperature environment, and the second memory 5020B may be mounted on a second blade in a second temperature environment.

Referring to FIG. 29B, the first memory 5020A and the second memory 5020B may be mounted in different drawers. The first memory 5020A may be mounted in a first drawer in a first temperature environment, and the second memory 5020B may be mounted in a second drawer in a second temperature environment.

Referring to FIG. 29C, the first memory 5020A and the second memory 5020B may be mounted in different racks. The first memory 5020A may be mounted in a first rack in a first temperature environment, and the second memory 5020B may be mounted in a second rack in a second temperature environment.

FIGS. 29A to 29C show that the first memory 5020A and the second memory 5020B shown in FIG. 28A may be in various temperature environments. Similarly, the first memory 5020A, the second memory 5020B, and the third memory 5020C shown in FIG. 28B may be in various temperature environments, e.g., mounted in one of memory blades, trays, and racks in different thermal conditions. Thus, when the memories 5020A, 5020B, and 5020C are in various temperature environments, the memories 5020A, 5020B, and 5020C may have various performances or characteristics.

Since a memory having appropriate performance or characteristics for a request may be selected among a plurality of memories, a converged memory device or a pooled memory system may manage memory resources according to the needs of an application. For example, in a case of a request that requires the best system performance, a memory that represents the best performance may be selected among the plurality of memories in the converged memory device. In a case of a request for good system performance, a memory representing good performance may be selected among the plurality of memories in the converged memory device. In a case of a request for good system performance, a memory. In a case of a request for normal system performance, a memory representing normal performance among the plurality of memories in the converged memory device may be selected. Also, a memory that supports a high speed may be used as a cache for a memory that supports a normal operation rate.

Figure 30:
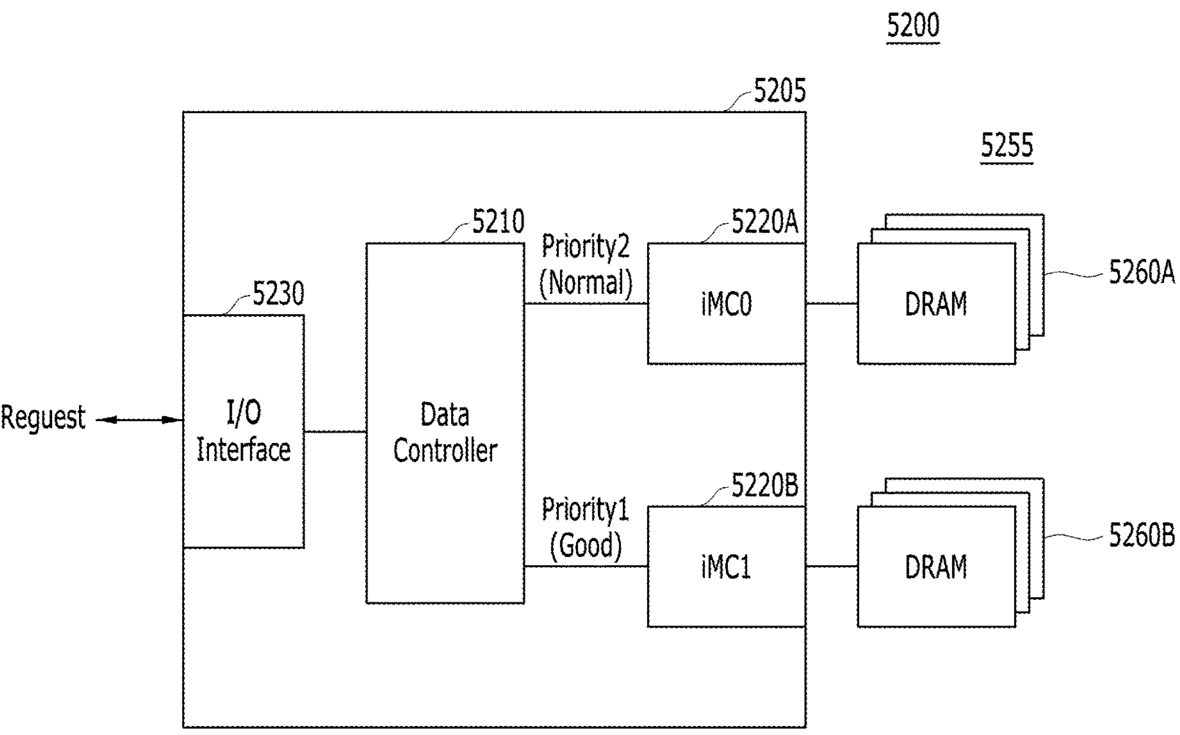
FIG. 30 is a block diagram illustrating a memory device that includes a controller in accordance with an embodiment of the present disclosure.

FIG. 30 is a block diagram illustrating a memory device 5200 including a controller in accordance with an embodiment of the present disclosure.

Referring to FIG. 5230, the memory device 5200 may include a controller 5205 and a plurality of memories 5255. The plurality of memories 5255 include first memories 5260A and second memories 5260B. Hereinafter, for the sake of convenience in description, it may be assumed that each of the memories 5260A and 5260B is a single memory.

A first memory 5260A may be in an environment having a first temperature, and a second memory 5260B may be in an environment having a second temperature.

In various embodiments of the present disclosure, the first and second memories 5260A and 5260B may be the same kind of DRAM. The second temperature may be lower than the first temperature.

In an embodiment of the present disclosure, the first temperature may be a room temperature, and the second temperature may be a lower temperature than the room temperature. For example, the first temperature is approximately 25° C., and the second temperature is approximately −40° C.

In another embodiment of the present disclosure, the first temperature may be the room temperature, and the second temperature may be an extremely low temperature or a cryogenic temperature. For example, the first temperature is approximately 25° C., and the second temperature is approximately −197° C.

In still another embodiment of the present disclosure, the first temperature may be a lower temperature than the room temperature, and the second temperature may be an extremely low temperature or a cryogenic temperature. For example, the first temperature is approximately −40° C., and the second temperature is approximately −197° C.

In various embodiments of the present disclosure, the first memory 5020A may have first characteristics in the environment having the first temperature, and the second memory 5020B may have second characteristics that are superior to the first characteristics in the environment having the second temperature. Each of the first characteristics and the second characteristics may include one or more of a data access rate, a refresh period, and an on-chip leakage.

The controller 5205 may selectively access the first memory 5260A or the second memory 5260B in response to a request. Herein, the request may be a request from one of the compute blades 200 shown in FIG. 3, or a request from a single host (not shown). Hereafter, an example in which the request may be received from the host is described. The request may include priority information. For example, the priority information may represent priorities for requests, e.g., normal, good, or best. For another example, various types of memories may be used for one blade, and may be sorted out based on an operation rate, such as a fast, typical, or slow operation rate, or may be sorted out based on status characteristics, such as storage capability, e.g., a best, good, or normal storage capability. In this case, a request or a signal received from the host may correspond to each memory.

The controller 5205 may include a data controller 35010, a first memory controller (iMC0) 5220A, a second memory controller (iMC1) 5220B, and an input/output (I/O) interface 5230.

The data controller 5210 may receive a request, and access the first memory 5260A through the first memory controller (iMC0) 5220A or the second memory 5260B through the second memory controller (iMC1) 5220B in response to the request. The request may be a request of a first priority or a request of a second priority, the second priority being lower than the first priority. If the request is the first priority request (e.g., good), the data controller 5210 may access the second memory 5020B through the second memory controller (iMC1) 5220B. If the request is the second priority request (e.g., normal) having a lower priority than the first priority request, the data controller 5210 may access the first memory 5020A through the first memory controller (iMC0) 5220A.

The first memory controller (iMC0) 5220A may be a memory interface for interfacing with the first memory 5260A. The second memory controller (iMC1) 5220B may be a second memory interface for interfacing with the second memory 5260B. The input/output interface 5230 is for interfacing with the host, and the input/output interface 5230 may transfer a request from the host to the data controller 5210 and may transfer data received from the data controller 5210 to the host.

Figure 31:
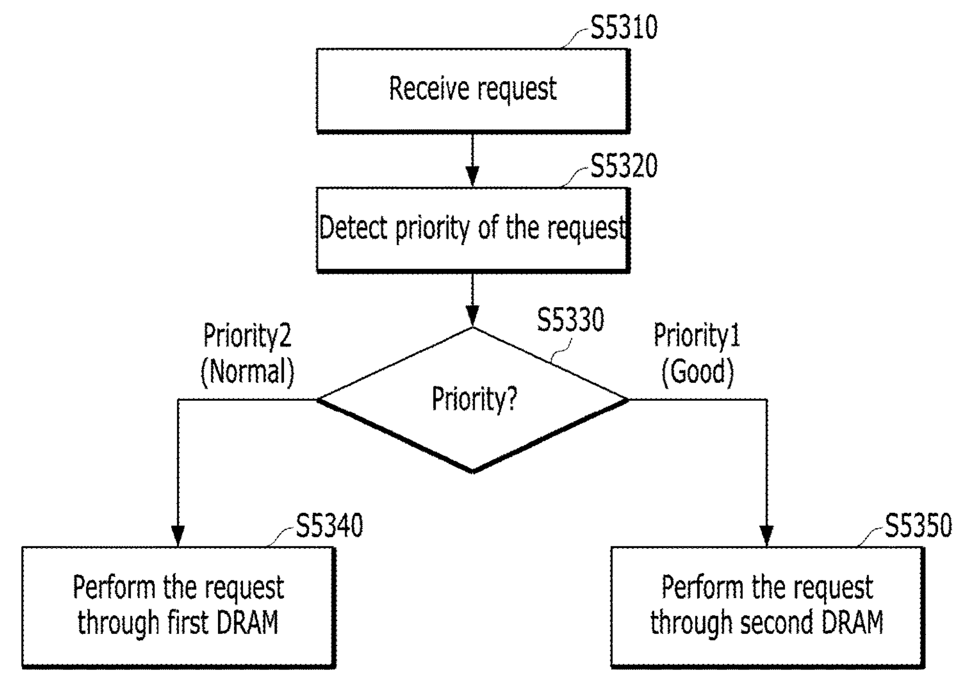
FIG. 31 is a flowchart illustrating an operation of a memory device that includes a controller in accordance with an embodiment of the present disclosure.

FIG. 31 is a flowchart illustrating an operation of a memory device including a controller in accordance with an embodiment of the present disclosure. For example, FIG. 31 illustrates an operation performed in the memory device 5200 including the controller 5205, the first memory 5260A, and the second memory 5260B, which are shown in FIG. 30.

Referring to FIG. 31, the controller 5205 may receive a request from the host in step S5310, and detect a priority of the received request in steps S5320 and S5330. The controller 5205 may access the first memory 5260A through the first memory controller (iMC0) 5220A or access the second memory 5260B through the second memory controller (iMC1) 5220B in response to the detected priority of the received request. The request may be a request of a first priority or a request of a second priority, the second priority being lower than the first priority. If the request is the first priority request, the data controller 5210 may access the second memory 5020B through the second memory controller (iMC1) 5220B in step S5350. If the request is the second priority request, the data controller 5210 may access the first memory 5020A through the first memory controller (iMC0) 5220A in step S5340.

Figure 32:
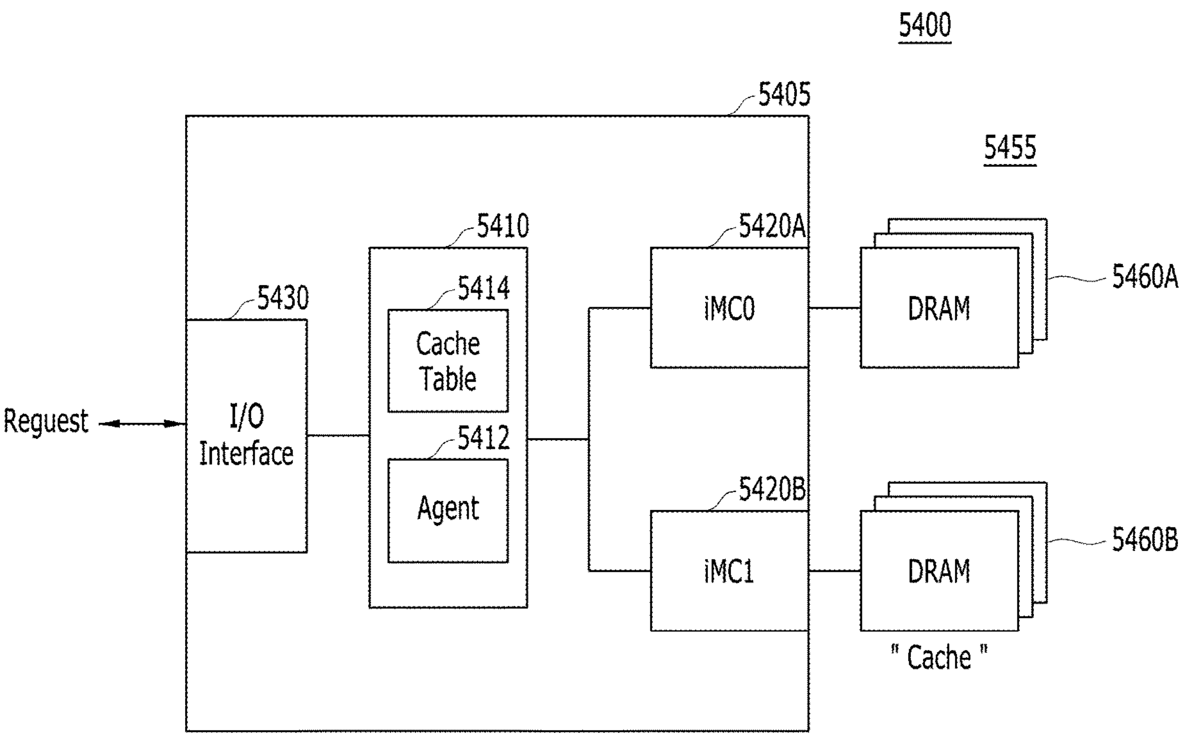
FIG. 32 is a block diagram illustrating a memory device that includes a controller in accordance with an embodiment of the present disclosure.

FIG. 32 is a block diagram illustrating a memory device 5400 including a controller in accordance with an embodiment of the present disclosure. The memory blade 5400 may correspond to the memory blade 400 described with reference to FIG. 5A.

Referring to FIG. 32, the memory device 5400 may include a controller 5405 and a plurality of memories 5455. The plurality of memories 5455 include first memories 5460A and second memories 5460B. Hereinafter, for the sake of convenience in description, it may be assumed that each of the first and second memories 5460A and 5460B is a single memory.

A first memory 5460A may be in an environment having a first temperature, and a second memory 5460B may be in an environment having a second temperature.

In various embodiments of the present disclosure, the first and second memories 5460A and 5460B may be the same kind of DRAM. The second temperature may be lower than the first temperature.

In an embodiment of the present disclosure, the first temperature may be a room temperature, and the second temperature may be a lower temperature than the room temperature. For example, the first temperature is approximately 25° C., and the second temperature is approximately −40° C.

In another embodiment of the present disclosure, the first temperature may be the room temperature, and the second temperature may be an extremely low temperature or a cryogenic temperature. For example, the first temperature is approximately 25° C., and the second temperature is approximately −197° C.

In still another embodiment of the present disclosure, the first temperature may be a lower temperature than the room temperature, and the second temperature may be an extremely low temperature or a cryogenic temperature. For example, the first temperature is approximately −40° C., and the second temperature is approximately −197° C.

In various embodiments of the present disclosure, the first memory 5460A may have first characteristics in the environment having the first temperature, and the second memory 5460B may have second characteristics that are superior to the first characteristics in the environment having the second temperature. Each of the first characteristics and the second characteristics may include one or more of a data access rate, a refresh period, and an on-chip leakage.

The controller 5405 may selectively access the first memory 5460A or the second memory 5460B in response to a request. Herein, the request may be a request from one of the compute blades 200 shown in FIG. 3, or a request from a single host (not shown). Hereafter, an example in which the request is received from the host may be described.

The controller 5405 may include a data controller 5410, a first memory controller (iMC0) 5420A, a second memory controller (iMC1) 5420B, and an input/output (I/O) interface 5430. The controller 5405 may use the second memory 5460B as a cache for the first memory 5460A.

The data controller 5410 may include an agent 5412 and a cache table 5414. The cache table 5414 may store address information for the second memory 5460B, which stores cache data for the first memory 5460A. For example, the cache table 5414 may store physical address information for the second memory 5460B.

The agent 5412 may perform an access operation to the first memory 5460A or the second memory 5460B in response to a request received through the input/output interface 328. The agent 5412 may select one of the first memory 5460A and the second memory 5460B, and may perform an access operation to the selected memory according to whether an address for the request is detected in the cache table 5414. If the address for the request is detected in the cache table 5414, the agent 5412 may access the second memory 5460B through the second memory controller (iMC1) 5420B. On the other hand, if the address for the request is not detected in the cache table 5414, the agent 5412 may access the first memory 5460A through the first memory controller (iMC0) 5420A. In various embodiments, if address information included in the request corresponds to a logical address, the agent 5412 may perform an address conversion operation that converts the logical address into a physical address, which can be used for accessing the first memory 5460A or the second memory 5460B.

The first memory controller (iMC0) 5420A may be a memory interface for interfacing with the first memory 5260A. The second memory controller (iMC1) 5220B may be a second memory interface for interfacing with the second memory 5460B. The input/output interface 5430 is for interfacing with the host. The input/output interface 5430 may transfer a request from the host to the data controller 5410 and transfer data received from the data controller 5410 to the host.

Figure 33:
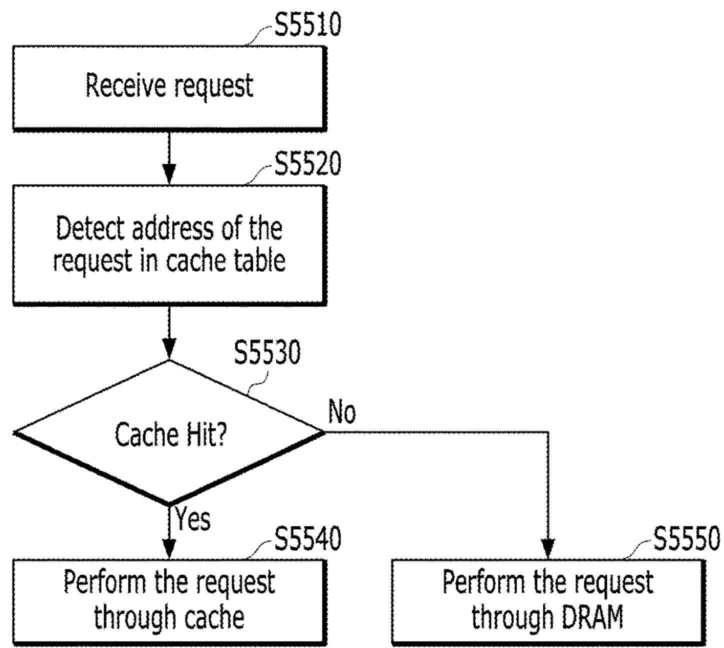
FIG. 33 is a flowchart illustrating an operation of a memory device that includes a controller in accordance with an embodiment of the present disclosure.

FIG. 33 is a flowchart illustrating an operation of a memory device that includes a controller in accordance with an embodiment of the present disclosure. For example, FIG. 33 illustrates an operation performed in the memory device 5400 including the controller 5405, the first memory 5460A, and the second memory 5460B, which are shown in FIG. 32.

Referring to FIG. 33, the controller 5405 may receive a request from the host in step S5510. The controller 5405 may confirm whether an address of the received request is detected from the cache table 5414 in step S5520.

If the address for the received request is detected from the cache table 5414 in step S5530 (Y), i.e., the received request corresponds to a cache hit, the controller 5405 may perform an operation corresponding to the request on the second memory 5460B, which is a cache for the first memory 5460A, in step S5540.

On the other hand, if the address for the request is not detected in the cache table 5414, i.e., the received request corresponds to a cache miss, the controller 5405 may perform the operation corresponding to the request on the first memory 5460A in step S5550.

Figure 34:
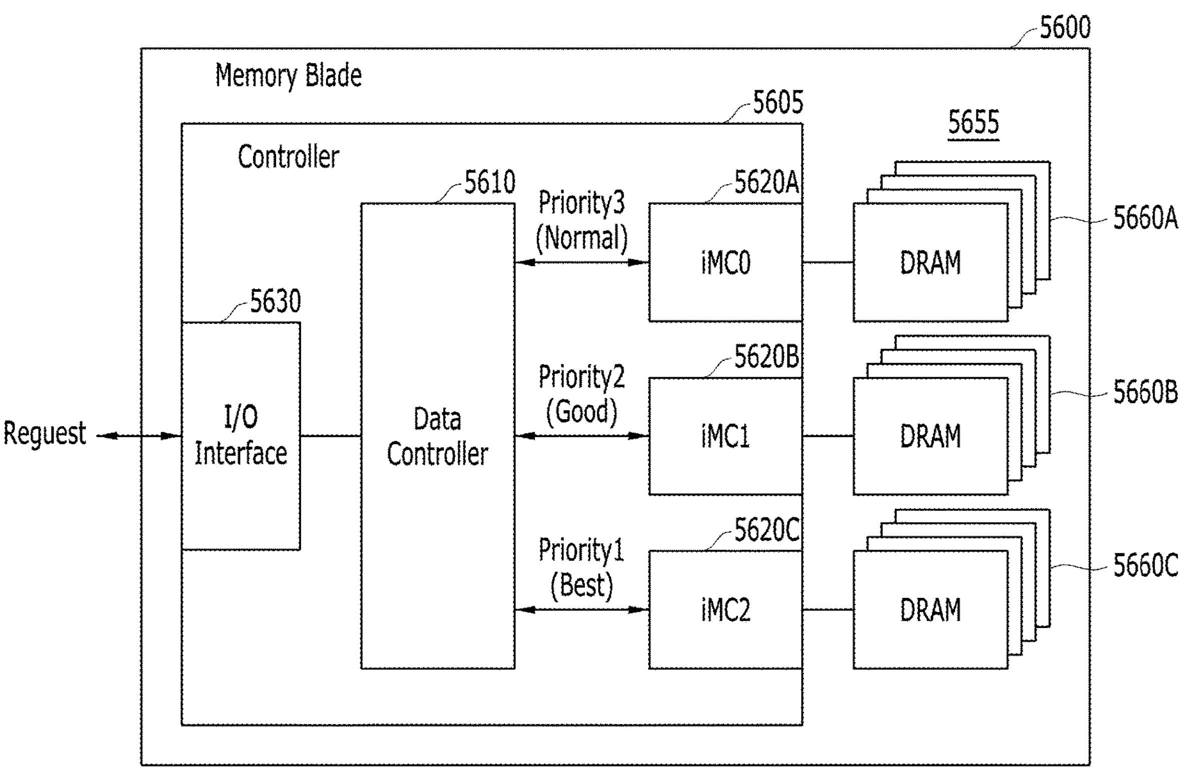
FIG. 34 is a block diagram illustrating a memory device that includes a controller in accordance with an embodiment of the present disclosure.

FIG. 34 is a block diagram illustrating a memory device 5600 including a controller in accordance with an embodiment of the present disclosure.

Referring to FIG. 34, the memory device 5600 may include a controller 5605 and a plurality of memories 5655. The plurality of memories 5655 include first memories 5660A, second memories 5660B, and third memories 5660C. Hereinafter, for the sake of convenience in description, it may be assumed that each of the first, second, and third memories 5660A, 5660B, and 5660C is a single memory.

A first memory 5660A may be in an environment having a first temperature, and a second memory 5660B may be in an environment having a second temperature, and a third memory 5660C may be in an environment having a third temperature.

In various embodiments of the present disclosure, the first, second, and third memories 5660A, 5660B, and 5660C may be the same kind of DRAM. The second temperature may be lower than the first temperature, and the third temperature may be lower than the second temperature.

In an embodiment of the present disclosure, the first temperature may be a room temperature, and the second temperature may be a lower temperature than the room temperature, and the third temperature may include an extremely low temperature or a cryogenic temperature. For example, the first temperature is approximately 25° C., and the second temperature is approximately −40° C., and the third temperature is approximately −197° C.

In various embodiments of the present disclosure, the first memory 5660A may have first characteristics in the environment having the first temperature, the second memory 5660B may have second characteristics that are superior to the first characteristics in the environment having the second temperature, and the third memory 5660C may have third characteristics that are superior to the second characteristics in the environment having the third temperature. Each of the first characteristics, the second characteristics, and the third characteristics may include one or more of a data access rate, a refresh period, and an on-chip leakage.

The controller 5605 may selectively access one of the first memory 5660A, the second memory 5660B, and the third memory 5660C in response to a request. Herein, the request may be a request from one of the compute blades 200 shown in FIG. 3, or a request from a single host (not shown). Hereafter, an example in which the request is received from the host may be described. The request may include priority information. For example, the priority information may represent a priority for the request, e.g., normal, good, or best.

The controller 5605 may include a data controller 5610, a first memory controller (iMC0) 5620A, a second memory controller (iMC1) 5620B, a third memory controller (iMC2) 5620C, and an input/output (I/O) interface 5630.

The data controller 5610 may receive a request and access the first memory 5660A through the first memory controller (iMC0) 5620A, the second memory 5660B through the second memory controller (iMC1) 5620B, or the third memory 5660C through the third memory controller (iMC2) 5620C in response to the request. The request may be a request of a first priority, a request of a second priority that is lower than the first priority, or a request of a third priority that is lower than the second priority. If the request is the first priority request (e.g., best), the data controller 5610 may access the third memory 5660C through the third memory controller (iMC2) 5620C. If the request is the second priority request (e.g., good), the data controller 5610 may access the second memory 5660B through the second memory controller (iMC1) 5620B. If the request is the third priority request (e.g., normal), the data controller 5610 may access the first memory 5620A through the first memory controller (iMC0) 5620A.

The first memory controller (iMC0) 5620A may be a memory interface for interfacing with the first memory 5660A. The second memory controller (iMC1) 5620B may be a memory interface for interfacing with the second memory 5660B. The third memory controller (iMC2) 5620C may be a memory interface for interfacing with the third memory 5660C. The input/output interface 285630 is for interfacing with the host, and the input/output interface 285630 may transfer a request from the host to the data controller 5610 and may transfer data received from the data controller 5610 to the host.

Figure 35:
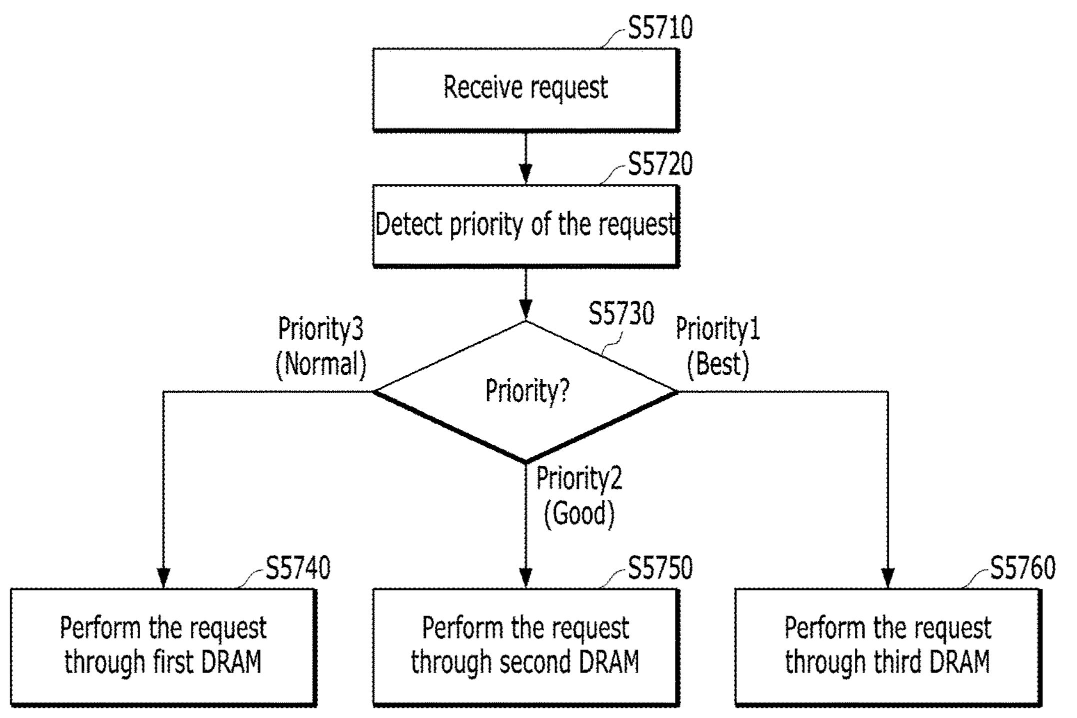
FIG. 35 is a flowchart illustrating an operation of a memory device that includes a controller in accordance with an embodiment of the present disclosure.

FIG. 35 is a flowchart illustrating an operation of a memory device that includes a controller in accordance with an embodiment of the present disclosure. For example, FIG. 35 illustrates an operation performed in the memory device 5600 including the controller 5605, the first memory 5660A, the second memory 5660B, and the third memory 5660C, which are shown in FIG. 34.

Referring to FIG. 35, the controller 5605 may receive a request from the host in step S5710. The controller 5605 may detect a priority of the received request in steps S5720 and S5730. The controller 5605 may access the first memory 5660A through the first memory controller (iMC0) 5620A, access the second memory 5660B through the second memory controller (iMC1) 5620B, or access the third memory 5660C through the third memory controller (iMC2) 5620C in response to the detected priority of the received request.

The request may be a request of a first priority, a request of a second priority, which is lower than the first priority, or a request of a third priority, which is lower than the second priority. If the request is the first priority request (e.g., best), the data controller 5610 may access the third memory 5620C through the third memory controller (iMC2) 5620C in step S5760. If the request is the second priority request (e.g., good), the data controller 5610 may access the second memory 5620B through the second memory controller (iMC1) 5620B in step S5750. If the request is the third priority request (e.g., normal), the data controller 5610 may access the first memory 5620A through the first memory controller (iMC0) 5620A in step S5740.

Figure 36A:
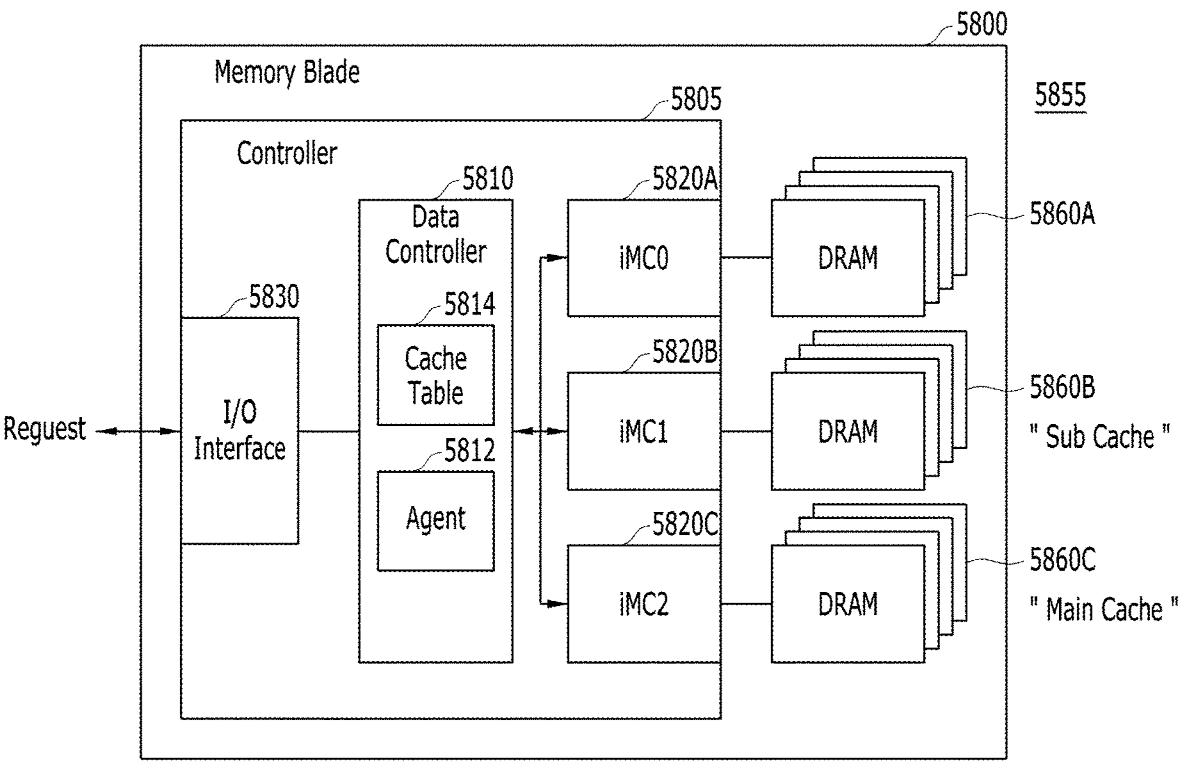
FIG. 36A is a block diagram illustrating a memory device that includes a controller in accordance with an embodiment of the present disclosure.

FIG. 36A is a block diagram illustrating a memory device including a controller in accordance with an embodiment of the present disclosure. The memory blade 5800 may correspond to the memory blade 400 described with reference to FIG. 5A.

Referring to FIG. 36A, the memory device 5800 may include a controller 5805 and a plurality of memories 5855. The plurality of memories 5855 include first memories 5860A, second memories 5860B, and third memories 5860C. Hereinafter, for the sake of convenience in description, it may be assumed that each of the first, second, and third memories 5860A, 5860B, and 5860C is a single memory.

A first memory 5860A may be in an environment having a first temperature, a second memory 5860B may be in an environment having a second temperature, and a third memory 5860C may be in an environment having a third temperature.

In various embodiments of the present disclosure, the first, second, and third memories 5860A, 5860B, and 5860C may be the same kind of DRAMs. The second temperature may be lower than the first temperature, and the third temperature may be lower than the second temperature.

In an embodiment of the present disclosure, the first temperature may be a room temperature, the second temperature may be a lower temperature than the room temperature, and the third temperature may be an extremely low temperature or a cryogenic temperature. For example, the first temperature is approximately 25° C., the second temperature is approximately −40° C., and the third temperature is approximately −197° C.

In various embodiments of the present disclosure, the first memory 5860A may have first characteristics in the environment having the first temperature, the second memory 5860B may have second characteristics that are superior to the first characteristics in the environment having the second temperature, and the third memory 5860C may have third characteristics that are superior to the second characteristics in the environment having the third temperature. Each of the first characteristics, the second characteristics, and the third characteristics may include one or more of a data access rate, a refresh period, and an on-chip leakage.

The controller 5805 may selectively access one of the first memory 5860A, the second memory 5860B, and the third memory 5860C in response to a request. Herein, the request may be a request from one of the compute blades 200 shown in FIG. 3, or a request from a single host (not shown). Hereafter, an example in which the request is received from the host may be described. The request may include priority information. For example, the priority information may represent priorities for requests, e.g., normal, good, or best.

The controller 5805 may include a data controller 5810, a first memory controller (iMC0) 5820A, a second memory controller (iMC1) 5820B, a third memory controller (iMC2) 5820C, and an input/output (I/O) interface 5830. The controller 5805 may use the second memory 5860B and the third memory 5860C as caches for the first memory 5860A. The third memory 5860C may be used as a main cache for the first memory 5860A, and the second memory 5860B may be used as a sub-cache for the first memory 5860A. When there is no free space for storing cache data in a storage space of the third memory 5860C, the second memory 5860B may be used as a sub-cache for the first memory 5860A.

The data controller 5810 may include an agent 5812 and a cache table 5814. The cache table 5814 may store address information for the second memory 5860B and/or the third memory 5860C that store cache data for the first memory 5860A. For example, the cache table 5814 may store physical address information for the second memory 5860B and/or the third memory 5860C.

The agent 5812 may selectively access one of the first memory 5860A, the second memory 5860B, and the third memory 5860C in response to a request received through the input/output interface 5830. The agent 5812 may select one of the first memory 5860A, the second memory 5860B, and the third memory 5860C, and perform an access operation on the selected memory according to whether an address for the request is detected in the cache table 5814.

If the address for the request is detected in the cache table 5814, the agent 5812 may access the third memory 5860C through the third memory controller (iMC2) 5820C or access the second memory 5860B through the second memory controller (iMC1) 5820B. On the other hand, if the address for the request is not detected in the cache table 5814, the agent 5812 may access the first memory 5860A through the first memory controller (iMC0) 5820A. In various embodiments of the present disclosure, if address information included in the request corresponds to a logical address, the agent 5812 may perform an address conversion operation to convert the logical address into a physical address for the first memory 5860A, the second memory 5860B, or the third memory 5860C.

The first memory controller (iMC0) 5820A may be a memory interface for interfacing with the first memory 5860A. The second memory controller (iMC1) 5820B may be a memory interface for interfacing with the second memory 5860B. The third memory controller (iMC2) 5820C may be a memory interface for interfacing with the third memory 5860C. The input/output interface 5830 is for interfacing with the host, and the input/output interface 5830 may transfer a request from the host to the data controller 5810 and transfer data received from the data controller 5810 to the host.

FIGS. 36B to 36E is a block diagram illustrating an operation of a memory device including a controller in accordance with an embodiment of the present disclosure. The operation described in FIGS. 36B to 36E may be performed by the agent 5812 and the cache table 5814 in the memory device 5800, which are illustrated in FIG. 36A.

This operation may correspond to an embodiment in which one of the memories, e.g., the third DRAM 5860C, is used as a main cache for another memory, e.g., the first DRAM 5860A, and the other memory, e.g., the second DRAM 5860B, is selectively used as a sub-cache for the other memory, e.g., the first DRAM 5860A. When the third DRAM 5860C is used in a cryogenic environment, the on-chip leakage of the third DRAM 5860C may be rapidly reduced, which greatly increases a refresh period. Therefore, the third DRAM 5860C may have characteristics similar to characteristics of a non-volatile memory or a Static Random Access Memory (SRAM), and due to the improved characteristics, the third DRAM 5860C can be used as a cache for another DRAM.

Figure 36B:
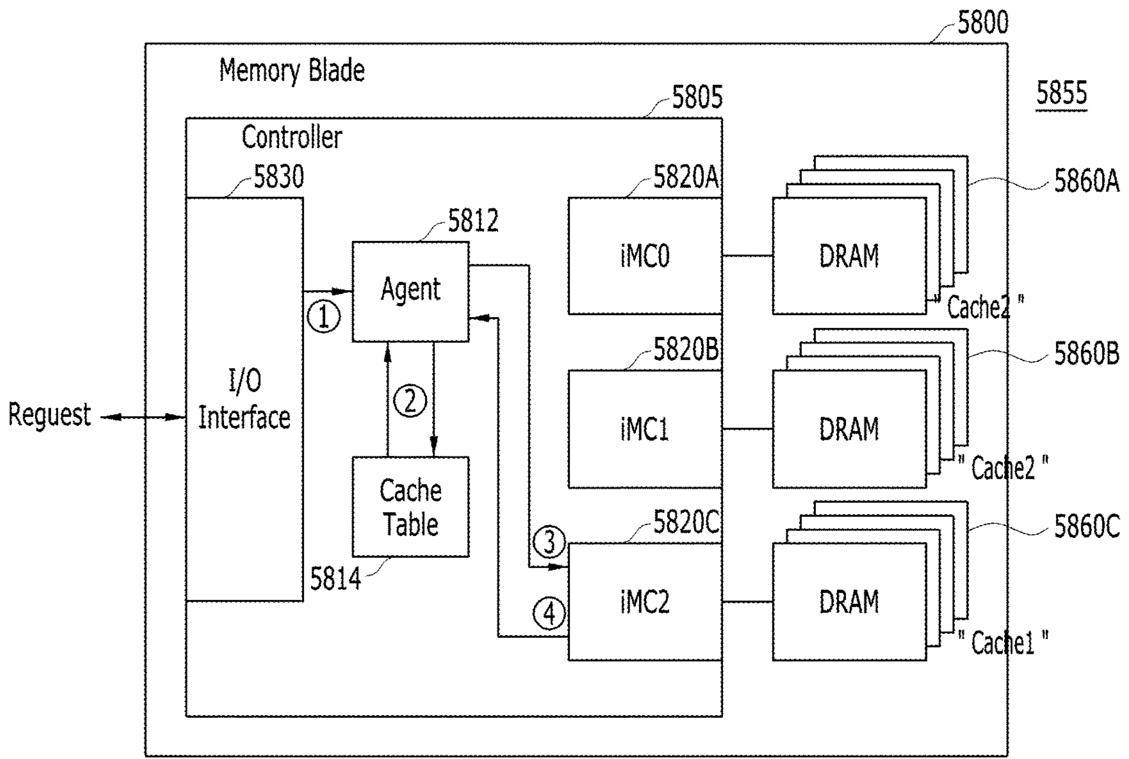
FIGS. 36B to 36E is a block diagram illustrating an operation of a memory device that includes a controller in accordance with an embodiment of the present disclosure.

Referring to FIG. 36B, the agent 5812 may receive a request from the host (①) and may check out whether an address for the received request is detected in the cache table 5814 or not (②).

When the address for the request is detected in the cache table 5814 as an address of the third DRAM 5860C (②), that is, when the address for the request corresponds to a cache hit for the third DRAM 5860C, the agent 5812 may access the third DRAM 5860C through the third memory controller (iMC2) 5820C (③), and receive the access result (④). The access result may be transferred to the host through the input/output interface 5830. For example, a read/write operation based on the address for the request may be performed on the third DRAM 5860C.

Figure 36C:
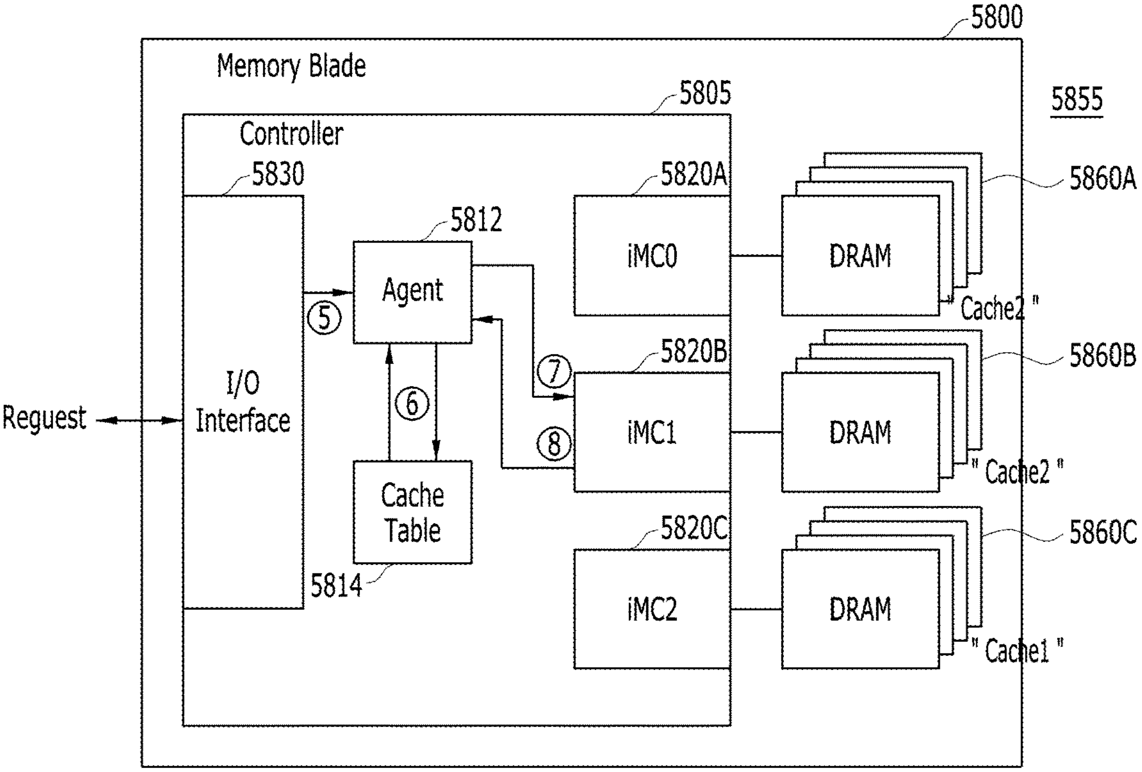

Referring to FIG. 36C, the agent 5812 may receive a request from the host (⑤) and may check out whether an address for the received request is detected in the cache table 5814 or not (⑥).

When the address for the request is detected in the cache table 5814 as an address of the second DRAM 5860B (⑥), that is, when the address for the request corresponds to a cache hit for the second DRAM 5860B, the agent 5812 may access the second DRAM 5860B through the second memory controller (iMC1) 5820B (⑦), and receive the access result (⑧). The access result may be transferred to the host through the input/output interface 5830.

Figure 36D:
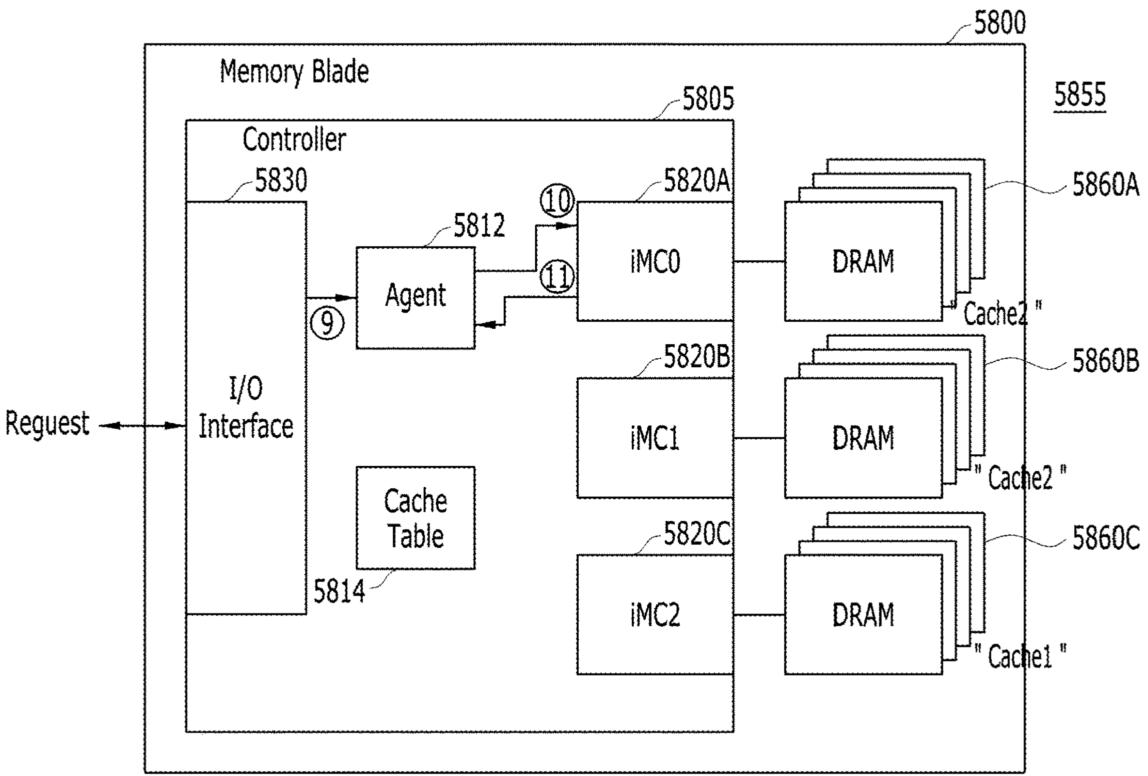

Referring to FIG. 36D, the agent 5812 may receive a request from the host (⑨) and may check out whether an address for the received request is detected in the cache table 5814 or not.

when the address for the request is not detected in the cache table 5814, that is, when the address for the request corresponds to a cache miss, the agent 5812 may access the first DRAM 5860A through the first memory controller (iMC0) 5820A (⑩), and receive the access result (⑪). The access result may be transferred to the host through the input/output interface 5830.

Figure 36E:
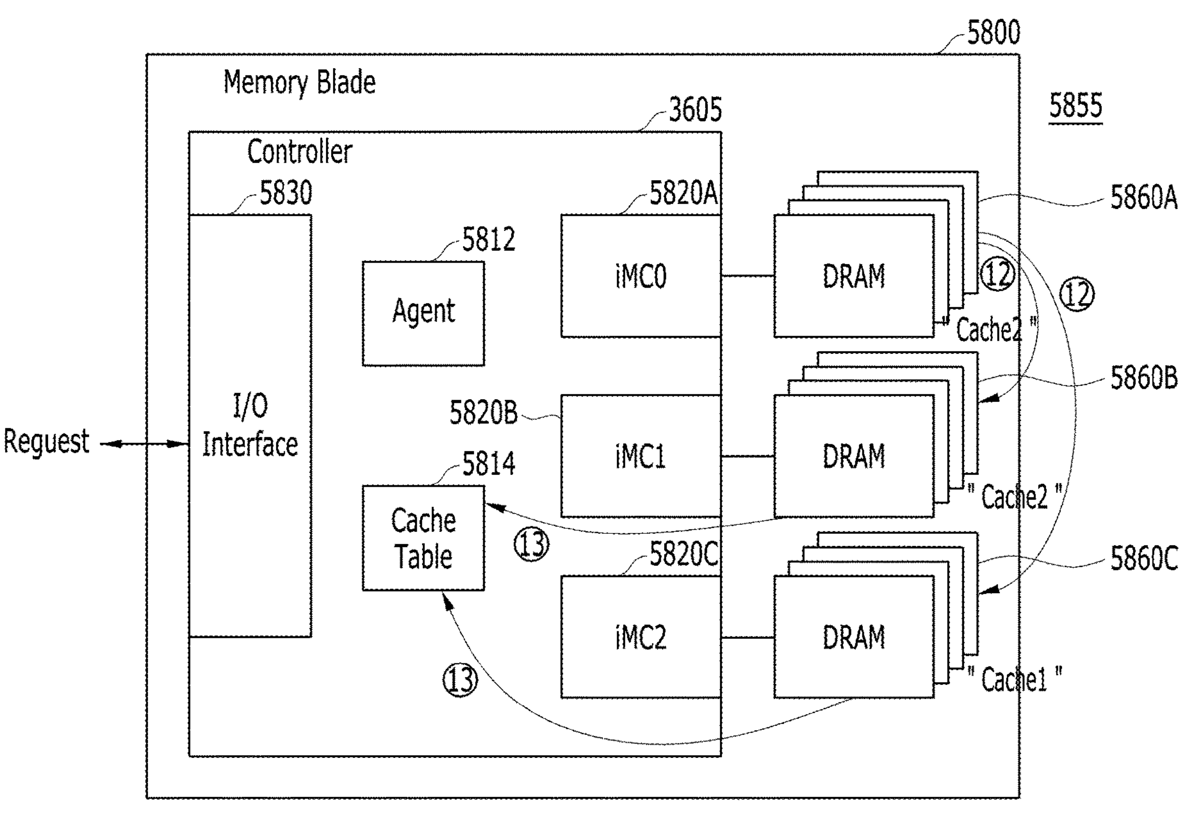

Referring to FIG. 36E, after processing the request through the first DRAM 5860A, the agent 5812 may perform a cache copy operation (⑫) and a cache table update operation (⑬). The agent 5812 may preferentially perform a cache copy operation from the first DRAM 5860A into the third DRAM 5860C, which is the main cache, and perform an update operation into the cache table 5814 according to the operation result. If there is no space in the storage space of the third DRAM 5860C, the agent 5812 may perform a cache copy operation from the first DRAM 5860A to the second DRAM 5860B, which is the sub-cache, and perform an update operation onto the cache table 5814 based on the operation result.

Figure 37:
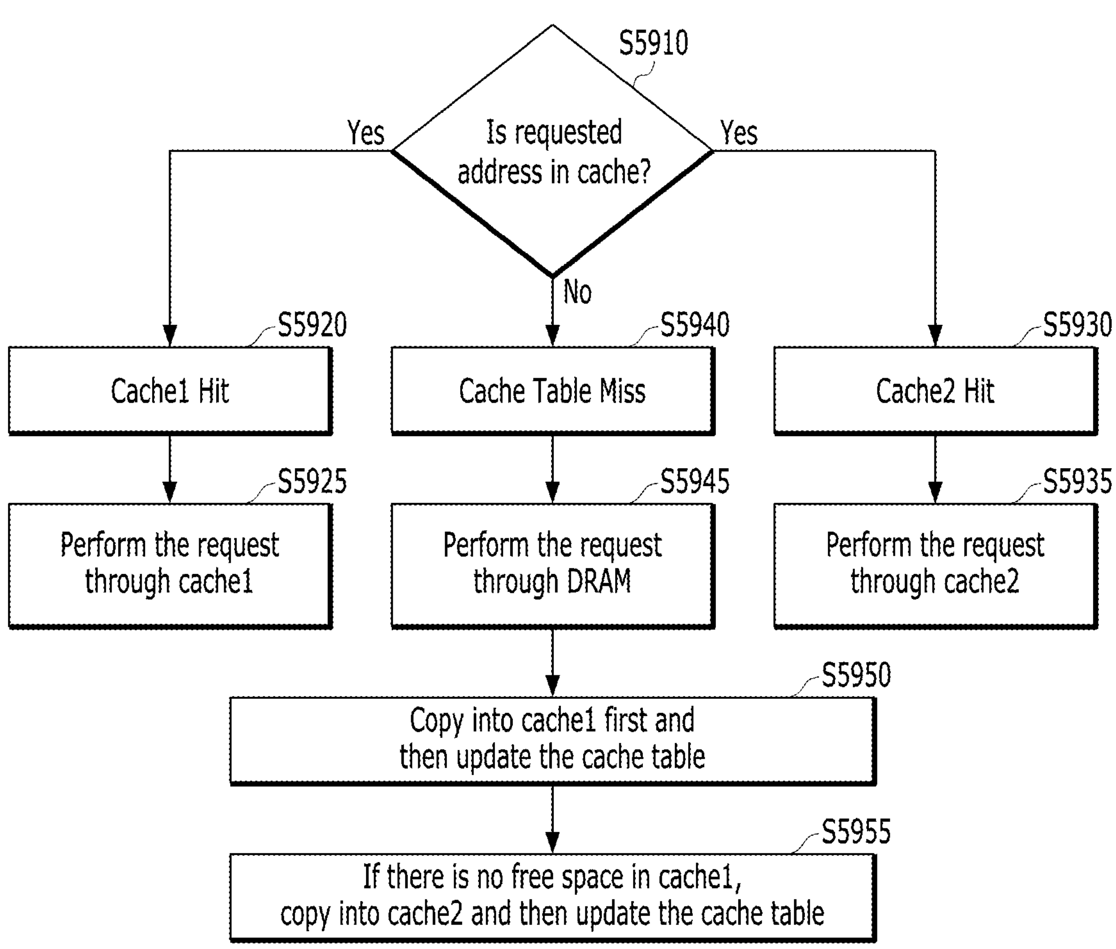
FIG. 37 is a flowchart illustrating an operation of a memory device that includes a controller in accordance with an embodiment of the present disclosure.

FIG. 37 is a flowchart illustrating an operation of a memory device including a controller in accordance with an embodiment of the present disclosure. For example, FIG. 37 illustrates an operation of the memory device 5800 that includes the controller 5805, the first memory 5860A, the second memory 5860B, and the third memory 5860C shown in FIGS. 36A to 36E.

Referring to FIG. 37, the controller 5805 may receive a request from the host, and determine whether an address for the received request is in the cache table 5814 or not in step S5910.

When the address for the received request is detected in the cache table 5814 in step S5910 (YES), the controller 5805 may determine that the address for the received request corresponds to a cache hit in steps S5920 and S5930.

When the address for the received request is a cache hit for the third memory 5860C as a first cache Cache1 in step S5920, the controller 5805 may process the request through the third memory 5860C, which is the first cache Cache1 for the first memory 5860A, in step S5925.

When the address for the received request is a cache hit for the second memory 5860B as a second cache Cache2 in step S5930, the controller 5805 may process the request through the second memory 5860B, which is the second cache Cache2 for the first memory 5860A, in step S5935.

When the address for the received request is not detected in the cache table 5814 in step S5910 (NO), the controller 5805 may determine that the address for the received request is a cache miss in step S5940. In a case of the cache miss, the controller 5805 may process the request through the first memory 5860A in step 3745.

After processing the request through the first DRAM 5860A, the controller 5805 may perform a cache copy operation and a cache table update operation. The controller 5805 may preferentially perform a cache copy operation from the first DRAM 5860A into the third DRAM 5860C, which is the first cache Cache1, and perform an update operation on the cache table 5814 according to the operation result in step S5950. If there is no space in the storage space of the third DRAM 5860C, which is the first cache Cache1, the controller 5805 may perform a cache copy operation from the first DRAM 5860A into the second DRAM 5860B, which is the second cache Cache2, and perform an update operation on the cache table 5814 based on the operation result in step S5955.

The embodiments of the present disclosure provide methods by which a converged memory device including a plurality of memories may exhibit various performances or characteristics. According to the embodiments of the present application, it is possible to provide various performances or characteristics to the converged memory device by using a volatile memory, e.g., a DRAM, for a request that requires fast data processing, or using the volatile memory as a cache for other ordinary volatile memories, in consideration that the volatile memory has characteristics that are similar to characteristics of a non-volatile memory when the volatile memory operates in a low temperature environment or a cryogenic environment.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:

a first memory having a first temperature;

a second memory having a second temperature that is lower than the first temperature, the second memory being physically separate from the first memory; and a controller including a first interface for interfacing with the first memory and a second interface for interfacing with the second memory, wherein the controller is configured to cache at least part of data stored in the first memory into the second memory through the first interface and the second interface in response to determining that the first temperature is equal to or higher than a threshold value, wherein the data is protected by leveraging a difference between first characteristics of the first memory in an environment having the first temperature and second characteristics of the second memory in an environment having the second temperature, the second characteristics being superior to the first characteristics, wherein each of the first characteristics and the second characteristics including a refresh period, the refresh period of the second memory is longer than the refresh period of the first memory due to the second temperature.

2. The memory system of claim 1, wherein the first temperature is a room temperature, and the second temperature is a cryogenic temperature.

3. The memory system of claim 1, wherein the first memory performs a refresh operation in a first refresh cycle, and wherein the second memory performs the refresh operation in a second refresh cycle that is longer than the first refresh cycle.

4. The memory system of claim 1, wherein the controller throttles the first memory by buffering data in the second memory in response to a write request for the first memory when a temperature of a memory included in the first memory is higher than the threshold value.

5. The memory system of claim 1, wherein the controller throttles the first memory by migrating data of the first memory into the second memory when a temperature of a memory included in the first memory is higher than the threshold value.

6. The memory system of claim 1, wherein the first memory is configured to change the refresh period based on the first temperature.

7. The memory system of claim 1, wherein the second memory is configured to change the refresh period based on the second temperature.

* * * * *